US012641953B2

(12) United States Patent
Nishimura et al.

(10) Patent No.: US 12,641,953 B2
(45) Date of Patent: May 26, 2026

(54) ELECTRONIC DEVICE AND MANUFACTURING METHOD FOR ELECTRONIC DEVICE

(71) Applicant: DAI NIPPON PRINTING CO., LTD., Tokyo (JP)

(72) Inventors: Naoki Nishimura, Tokyo (JP); Hiroshi Yano, Tokyo (JP); Yusuke Nakamura, Tokyo (JP); Isao Miyatani, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 318 days.

(21) Appl. No.: 18/332,942

(22) Filed: Jun. 12, 2023

(65) Prior Publication Data

US 2024/0016000 A1 Jan. 11, 2024

(30) Foreign Application Priority Data

Jun. 28, 2022 (JP) ................................ 2022-103988

(51) Int. Cl.

*H10K 59/12* (2023.01)
*H10K 59/127* (2023.01)
*H10K 59/19* (2023.01)
*H10K 59/80* (2023.01)
*H10K 102/00* (2023.01)

(52) U.S. Cl.

CPC ..... *H10K 59/1201* (2023.02); *H10K 59/1275* (2023.02); *H10K 59/19* (2023.02); *H10K 59/805* (2023.02); *H10K 2102/302* (2023.02)

(58) Field of Classification Search

CPC ........... H10K 59/1201; H10K 59/1275; H10K 59/19; H10K 59/805; H10K 2102/302

See application file for complete search history.

(56) References Cited

U.S. PATENT DOCUMENTS

2020/0043994 A1 2/2020 Chen et al.
2022/0020952 A1 1/2022 Ikenaga et al.
2022/0029125 A1 1/2022 Liu et al.

(Continued)

FOREIGN PATENT DOCUMENTS

CN 110783485 A 2/2020
CN 114464750 A 5/2022

(Continued)

OTHER PUBLICATIONS

Japanese Office Action for Japanese Application No. 2022-103988 dated Apr. 17, 2026.

*Primary Examiner* — Anne M Hines

(74) *Attorney, Agent, or Firm* — BURR PATENT LAW, PLLC

(57) ABSTRACT

An electronic device includes a substrate, a plurality of first electrodes located on the substrate, a plurality of organic layers located on the first electrodes, and a second electrode that is located on the organic layers and that spreads so as to overlap the plurality of the first electrodes in planar view. The second electrode located in the second display area has a plurality of apertures formed in such positions as not to overlap the first electrodes in planar view and is divided into a plurality of unit regions on the basis of the plurality of first electrodes. The plurality of unit regions includes aperture regions including the apertures and non-aperture regions not including the apertures.

14 Claims, 40 Drawing Sheets

(56) References Cited

U.S. PATENT DOCUMENTS

| | | | | |
|---|---|---|---|---|
| 2022/0115457 | A1* | 4/2022 | Liu | H10K 59/353 |
| 2022/0149123 | A1* | 5/2022 | Liang | H10K 59/126 |
| 2022/0209124 | A1 | 6/2022 | Nakamura et al. | |

FOREIGN PATENT DOCUMENTS

| | | | |
|---|---|---|---|
| CN | 216563200 | U | 5/2022 |
| EP | 3 640 715 | A1 | 4/2020 |
| JP | 2020-521999 | A | 7/2020 |
| JP | 2021-192363 | A | 12/2021 |
| WO | 2017/072678 | A1 | 5/2017 |
| WO | 2019/150327 | A1 | 8/2019 |

* cited by examiner

| | COMPARATIVE EXAMPLE | FIRST EXAMPLE | SECOND EXAMPLE | THIRD EXAMPLE |
|---|---|---|---|---|
| PROPORTION OF NON-APERTURE REGIONS | 0% | 50% | 25% | 12. 5% |
| MAXIMUM PEAK INTENSITY | 5. 2% | 3. 8% | 4. 5% | 4. 8% |
| dB AVERAGE TOTAL VALUE | 145dB | 80dB | 76dB | 82dB |

FIG.62

| | FOURTH EXAMPLE | FIFTH EXAMPLE | SIXTH EXAMPLE | SEVENTH EXAMPLE | REFERENCE EXAMPLE |
|---|---|---|---|---|---|
| PROPORTION OF NON-APERTURE REGIONS | 16. 9% | 25. 4% | 50. 9% | 75. 4% | 100% |
| MAXIMUM PEAK INTENSITY | 4. 7% | 4. 4% | 3. 8% | 3. 3% | 3. 1% |
| dB AVERAGE TOTAL VALUE | 123dB | 133dB | 148dB | 132dB | 144dB |

FIG.68

ELECTRONIC DEVICE AND MANUFACTURING METHOD FOR ELECTRONIC DEVICE

CROSS REFERENCE TO RELATED APPLICATIONS

This application is based upon and claims the benefit of priority from Japanese Patent Application No. 2022-103988, filed Jun. 28, 2022; the entire contents of all of which are incorporated herein by reference.

BACKGROUND OF THE INVENTION

1. Field of the Invention

The present disclosure relates to an electronic device and a manufacturing method for the electronic device.

2. Description of the Related Art

High-definition display devices have been required as devices such as smartphones and tablet PCs. Such display devices are required to have a pixel density of, for example, 400 ppi or higher. There is also a demand for display devices that are compatible with ultra-high definition (UHD). In some cases, such display devices have a pixel density of, for example, 800 ppi or higher.

Organic EL display devices have attracted attention as examples of electronic devices because of their high responsivity, low power consumption, and/or high contrast. As a method for forming pixels of an organic EL display device, there has been known a deposition method. In the deposition method, a deposition mask having formed therein through holes arrayed in a desired pattern is used to form pixels and electrodes in desired patterns. For example, first, a substrate with first electrodes formed in a pattern corresponding to that of the pixels is prepared. Then, an organic material is made to adhere onto the first electrodes through the use of the deposition mask to form luminescent layers. After that, an electrically conducting material is made to adhere onto the luminescent layers to form a second electrode.

Japanese Unexamined Patent Application Publication (Translation of PCT Application) No. 2020-521999 is an example of related art.

SUMMARY OF THE INVENTION

The electronic device may have formed therein regions on the substrate in which the second electrode is not present. In the regions in which the second electrode is not present, light is easily transmitted through the electronic device. Meanwhile, in a case where the regions in which the second electrode is not present are periodically placed, diffraction of light may occur and the intensity of diffracted light may increase.

An electronic device according an embodiment of the present disclosure is an electronic device including a first display area and a second display area located in a position different from that of the first display area in planar view. The electronic device includes a substrate, a plurality of first electrodes located on the substrate, a plurality of organic layers located on the first electrodes, and a second electrode that is located on the organic layers and that spreads so as to overlap the plurality of the first electrodes in planar view. The second electrode located in the second display area has a plurality of apertures formed in such positions as not to overlap the first electrodes in planar view and is divided into a plurality of unit regions on the basis of the plurality of first electrodes. The plurality of unit regions includes aperture regions including the apertures and non-aperture regions not including the apertures.

A manufacturing method for an electronic device according to an embodiment of the present disclosure is a manufacturing method for an electronic device including a first display area and a second display area located in a position different from that of the first display area in planar view. The manufacturing method includes a preparing step of preparing a layered product including a substrate, a plurality of first electrodes located on the substrate, and a plurality of organic layers located on the first electrodes, a second electrode forming step of forming a second electrode on the organic layers so that the second electrode overlaps the plurality of first electrodes in planar view, and an aperture forming step of forming a plurality of apertures in such positions in the second electrode located in the second display area that the plurality of apertures do not overlap the first electrodes in planar view. The second electrode located in the second display area is divided into a plurality of unit regions on the basis of the plurality of first electrodes. The plurality of unit regions includes aperture regions including the apertures and non-aperture regions not including the apertures.

The present disclosure makes it possible to reduce the intensity of diffracted light that is produced when light passes through the electronic device.

BRIEF DESCRIPTION OF THE DRAWINGS

FIG. 62 is a diagram showing results of evaluation of diffraction in the comparative example and the first to third examples;

FIG. 68 is a diagram results of evaluation of diffraction in the fourth to seventh examples and the reference example;

DESCRIPTION OF THE PREFERRED EMBODIMENTS

Figure 1:
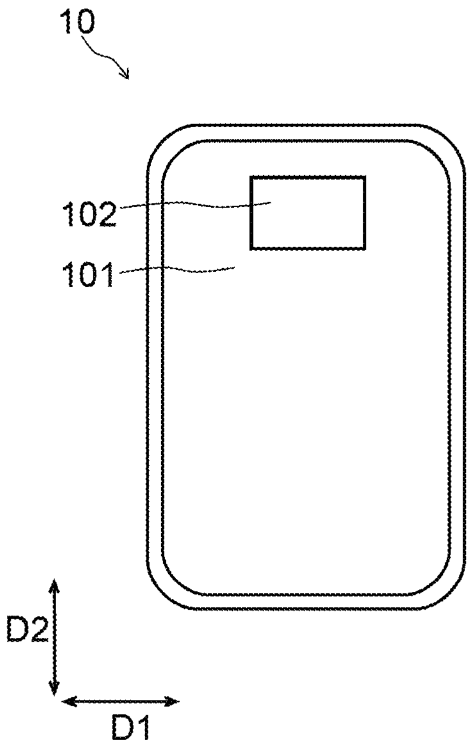
FIG. 1 is a plan view showing an example of an electronic device according to an embodiment of the present disclosure.

In the present specification and the present drawings, unless otherwise specifically described, terms, such as "substrate" "base material", "plate", "sheet", and "film", that mean a matter forming the basis of a certain component are not distinguished from one another solely on the basis of the difference in designation.

In the present specification and the present drawings, unless otherwise specifically described, shapes and geometric conditions, terms, such as "parallel" and "orthogonal", that specify the extents of the shapes and the geometric conditions, and values, such as lengths and angles, that specify the extents of the shapes and the geometric conditions are not bound by the strict sense but are construed with the inclusion of a range of extents to which similar functions may be expected.

In the present specification and the present drawings, unless otherwise specifically described, cases where a certain component such as a certain member or a certain region is "on" or "under", "on the upper side" or "on the lower side", or "above" or "below" another component such as another member or another region encompass cases where a certain component is in direct contact with another component. Furthermore, the cases also encompass cases where a different component is included between a certain component and another component, i.e. cases where a certain component is in indirect contact with another component. Unless otherwise specifically described, the words and phrases such as "on", "on the upper side", "above", "under", "on the lower side", and "below" may be turned upside down in meaning.

In the present specification and the present drawings, unless otherwise specifically described, identical components or components having similar functions may be assigned identical or similar signs, and a repeated description of such components may be omitted. For convenience of explanation, dimensional ratios in the drawings may be different from actual ratios, or some components may be omitted from the drawings.

In the present specification and the present drawings, unless otherwise specifically described, an embodiment of the present specification may be combined with another embodiment unless a contradiction arises. Other embodiments may be combined with each other unless a contradiction arises.

In the present specification and the present drawings, unless otherwise specifically described, in a case where multiple steps are disclosed regarding a method such as a manufacturing method, another step that is not disclosed may be executed between steps that are disclosed. The steps that are disclosed may be executed in any order unless a contradiction arises.

In the present specification and the present drawings, unless otherwise specifically described, a range expressed by the preposition "to" includes a numerical value placed before "to" and a numerical value placed after "to".

A first aspect of the present disclosure is directed to an electronic device including a first display area and a second display area located in a position different from that of the first display area in planar view, the electronic device including:

- a substrate;
- a plurality of first electrodes located on the substrate;
- a plurality of organic layers located on the first electrodes; and
- a second electrode that is located on the organic layers and that spreads so as to overlap the plurality of the first electrodes in planar view, wherein

- the second electrode located in the second display area has a plurality of apertures formed in such positions as not to overlap the first electrodes in planar view and is divided into a plurality of unit regions on the basis of the plurality of first electrodes, and
- the plurality of unit regions includes aperture regions including the apertures and non-aperture regions not including the apertures.

A second aspect of the present disclosure may be directed to the electronic device according to the first aspect, wherein each of the unit regions may be demarcated by a quadrangle that is obtained by connecting center points of four adjacent ones of the first electrodes.

A third aspect of the present disclosure may be directed to the electronic device according to the first aspect, wherein a proportion of the number of non-aperture regions to the number of unit regions may be higher than or equal to 5% and lower than or equal to 95%.

A fourth aspect of the present disclosure may be directed to the electronic device according to the third aspect, wherein the proportion of the number of non-aperture regions to the number of unit regions may be higher than or equal to 10% and lower than or equal to 80%.

A fifth aspect of the present disclosure may be directed to the electronic device according to the first aspect, wherein

- the plurality of first electrodes may include a plurality of first color electrodes, a plurality of second color electrodes, and a plurality of third color electrodes,
- the plurality of organic layers may include a plurality of first color organic layers located on the first color electrodes, a plurality of second color organic layers located on the second color electrodes, and a plurality of third color organic layers located on the third color electrodes,
- the first color electrodes and the second color electrodes may be alternately arranged along a first direction and alternately arranged along a second direction orthogonal to the first direction, and
- the third color electrodes may be arranged along the first direction so as to be located between the first color electrodes and the second color electrodes in the first direction and may be arranged along the second direction so as to be located between the first color electrodes and the second color electrodes in the second direction.

A sixth aspect of the present disclosure may be directed to the electronic device according to the fifth aspect, wherein each of the unit regions may be demarcated by a quadrangle that is obtained by connecting center points of four adjacent ones of the first electrodes, the four adjacent first electrodes consisting of one of the first color electrodes, one of the second color electrodes, and two of the third color electrodes.

A seventh aspect of the present disclosure may be directed to the electronic device according to the fifth aspect, wherein the second display area may be divided into a plurality of basic patterns each including one of the first color electrodes, one of the second color electrodes, and one of the third color electrodes, the plurality of basic patterns may include any two or more of a first basic pattern including two of the apertures, second basic patterns each including one of the apertures, and a third basic pattern not including the apertures, and in the second display area, the two or more basic patterns may be regularly arranged along the first direction and the second direction.

An eighth aspect of the present disclosure may be directed to the electronic device according to the seventh aspect, wherein the plurality of basic patterns may include the first basic pattern and the second basic patterns, and in the second display area, the first basic pattern and the second basic patterns may be regularly arranged along the first direction and the second direction.

A ninth aspect of the present disclosure may be directed to the electronic device according to the seventh aspect, wherein the plurality of basic patterns may include the first basic pattern, the second basic patterns, and the third basic pattern, and in the second display area, the first basic pattern, the second basic patterns, and the third basic pattern may be regularly arranged along the first direction and the second direction.

A tenth aspect of the present disclosure may be directed to the electronic device according to the fifth aspect, wherein the second display area may be divided into a plurality of basic patterns each including one of the first color electrodes or one of the second color electrodes and one of the third color electrodes, the plurality of basic patterns may include second basic patterns each including one of the apertures, and in the second display area, the second basic patterns may be arranged along the first direction and the second direction.

An eleventh aspect of the present disclosure may be directed to the electronic device according to the first aspect, wherein the organic layers may include organic layer apertures overlapping the apertures in planar view.

A twelfth aspect of the present disclosure may be directed to the electronic device according to the first aspect, further including an insulating layer located between the substrate and the organic layers in a direction normal to the substate, wherein the insulating layer may include insulating layer first apertures overlapping the first electrodes in planar view.

A thirteenth aspect of the present disclosure may be directed to the electronic device according to the twelfth aspect, wherein the insulating layer may include insulating layer second apertures overlapping the apertures in planar view.

A fourteenth aspect of the present disclosure is directed to a manufacturing method for an electronic device including a first display area and a second display area located in a position different from that of the first display area in planar view, the manufacturing method including:

a preparing step of preparing a layered product including a substrate, a plurality of first electrodes located on the substrate, and a plurality of organic layers located on the first electrodes;

a second electrode forming step of forming a second electrode on the organic layers so that the second electrode overlaps the plurality of first electrodes in planar view; and an aperture forming step of forming a plurality of apertures in such positions in the second electrode located in the second display area that the plurality of apertures do not overlap the first electrodes in planar view, wherein the second electrode located in the second display area is divided into a plurality of unit regions on the basis of the plurality of first electrodes, and the plurality of unit regions includes aperture regions including the apertures and non-aperture regions not including the apertures.

A fifteenth aspect of the present disclosure may be directed to the manufacturing method for the electronic device according to the fourteenth aspect, wherein the aperture forming step may include a removing step of forming the apertures by removing part of the second electrode.

A sixteenth aspect of the present disclosure may be directed to the manufacturing method for the electronic device according to the fifteenth aspect, wherein the removing step may include an irradiating step of irradiating the second electrode with a laser and thereby forming the apertures.

A seventeenth aspect of the present disclosure may be directed to the manufacturing method for the electronic device according to the fourteenth aspect, further including an inhibiting layer forming step of, before the second electrode forming step, forming inhibiting layers that inhibit the second electrode from being formed in positions on the substrate in which the apertures are to be formed.

An embodiment of the present disclosure is described in detail below with reference to the drawings. It should be noted that the embodiment to be described below is one example among embodiments of the present disclosure, and the present disclosure should not be construed only within the limits of these embodiments.

An electronic device 10 according to an embodiment of the present disclosure and a manufacturing method for the electronic device 10 are described with reference to FIGS. 1 to 22.

First, a configuration of the electronic device 10 is described.

FIG. 1 is a plan view showing an example of the electronic device 10. FIG. 1 is a view of an electronic device 10 according to an embodiment of the present disclosure as seen along a direction normal to a substrate 15 of the electronic device 10. In the following description, a view seen along a direction normal to a surface of an underling member such as a substrate is also referred to as "planar view". The electronic device 10 may have outer edges including sides extending in a first direction D1 and sides extending in a second direction D2. The second direction D2 may be a direction orthogonal to the first direction D1.

The electronic device 10 includes a first display area 101 and a second display area 102. The second display area 102 is located in a position different from that of the first display area 101 in planar view. The second display area 102 may have a smaller area than the first display area 101. As shown in FIG. 1, the second display area 102 may be surrounded by the first display area 101. Although not illustrated, parts of the outer edges of the second display area 102 may be located in the same straight line as parts of the outer edges of the first display area 101.

Figure 2:
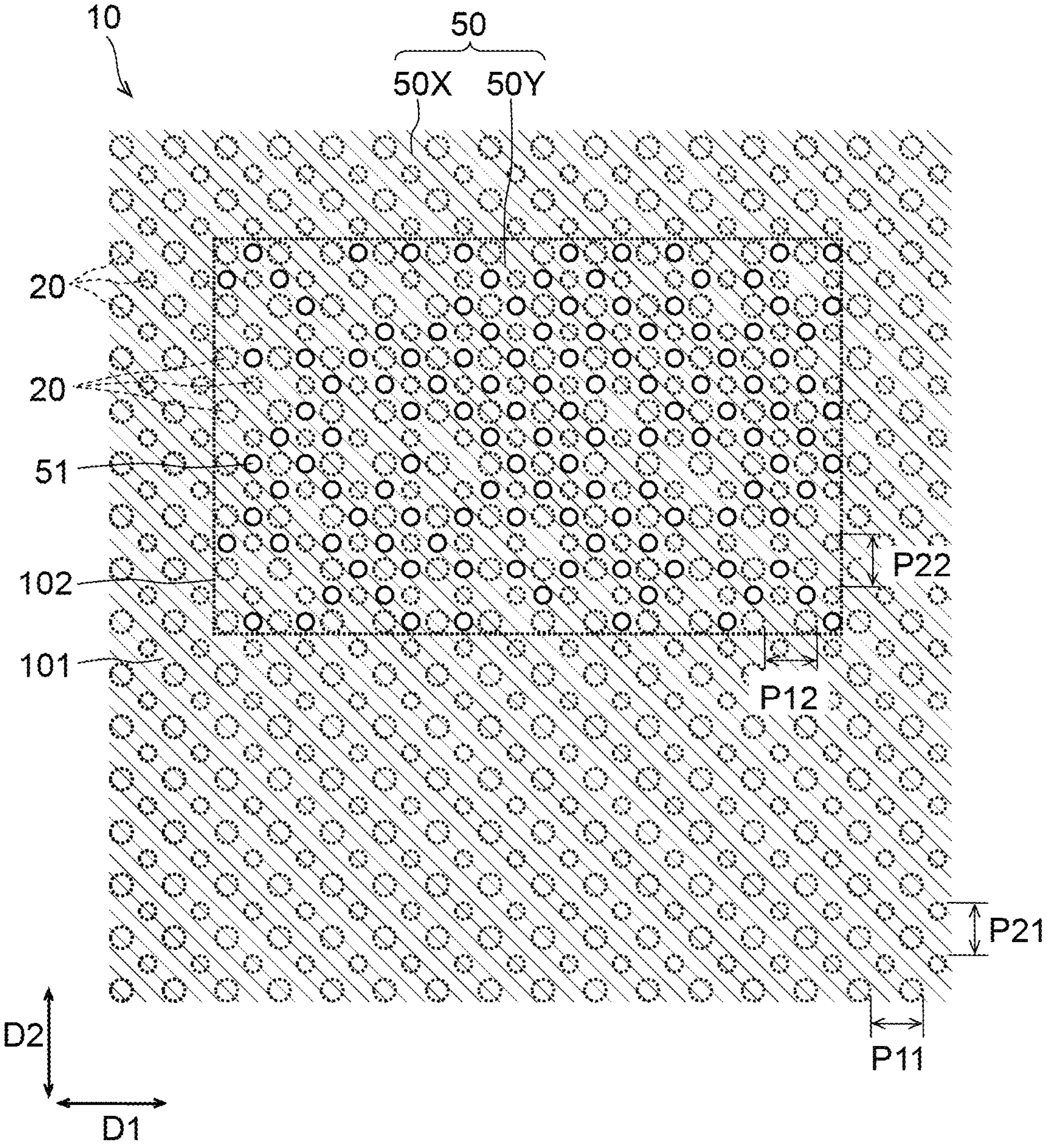
FIG. 2 is an enlarged plan view of a first display area and a second display area of FIG. 1.

FIG. 2 is an enlarged plan view showing the second display area 102 of FIG. 1 and an area around the second display area 102. In the first display area 101 and the second display area 102, a plurality of elements 20 may be arranged along two different directions. For example, the plurality of elements 20 located in the first display area 101 may be arranged at eleventh pitches P11 along the first direction D1 and arranged at twenty-first pitches P21 along the second direction D2. For example, the plurality of elements 20 located in the second display area 102 may be arranged at twelfth pitches P12 along the first direction D1 and arranged at twenty-second pitches P22 along the second direction D2. The twelfth pitches P12 may be equal to the eleventh pitches P11. The twenty-second pitches P22 may be equal to the twenty-first pitches P21.

The elements 20 are for example pixels. In a case where the elements 20 are pixels, pictures are displayed in the first display area 101 and the second display area 102.

The elements 20 include a second electrode 50. Part of the second electrode 50 located in the first display area 101 is also referred to as "second electrode 50X". Part of the second electrode 50 located in the second display area 102 is also referred to as "second electrode 50Y".

The second electrode 50X has a first occupancy rate. The first occupancy rate is calculated by dividing the total area of the part of the second electrode 50 located in the first display area 101 by the area of the first display area 101. The second electrode 50Y has a second occupancy rate. The second occupancy rate is calculated by dividing the total area of the part of the second electrode 50 located in the second display area 102 by the area of the second display area 102. The second occupancy rate may be lower than the first occupancy rate. For example, as will be described later, the second electrode 50Y may have a plurality of apertures 51 formed therein.

The ratio of the second occupancy rate to the first occupancy rate may for example be higher than or equal to 0.05, higher than or equal to 0.1, or higher than or equal to 0.2. The ratio of the second occupancy rate to the first occupancy rate may for example be lower than or equal to 0.5, lower than or equal to 0.8, or lower than or equal to 0.95. The ratio of the second occupancy rate to the first occupancy rate may fall within a range defined by a first group consisting of 0.05, 0.1, and 0.2 and/or a second group consisting of 0.5, 0.8, and 0.95. The ratio of the second occupancy rate to the first occupancy rate may fall within a range defined by a combination of any one of the values included in the aforementioned first group and any one of the values included in the aforementioned second group. The ratio of the second occupancy rate to the first occupancy rate may fall within a range defined by a combination of any two of the values included in the aforementioned first group. The ratio of the second occupancy rate to the first occupancy rate may fall within a range defined by a combination of any two of the values included in the aforementioned second group. The ratio of the second occupancy to the first occupancy may for example be higher than or equal to 0.05 and lower than or equal to 0.95, higher than or equal to 0.05 and lower than or equal to 0.8, higher than or equal to 0.05 and lower than or equal to 0.5, higher than or equal to 0.05 and lower than or equal to 0.2, higher than or equal to 0.05 and lower than or equal to 0.1, higher than or equal to 0.1 and lower than or equal to 0.95, higher than or equal to 0.1 and lower than or equal to 0.8, higher than or equal to 0.1 and lower than or equal to 0.5, higher than or equal to 0.1 and lower than or equal to 0.2, higher than or equal to 0.2 and lower than or equal to 0.95, higher than or equal to 0.2 and lower than or equal to 0.8, higher than or equal to 0.2 and lower than or equal to 0.5, higher than or equal to 0.5 and lower than or equal to 0.95, higher than or equal to 0.5 and lower than or equal to 0.8, or higher than or equal to 0.8 and lower than or equal to 0.95.

In a case where the second occupancy rate is lower than the first occupancy rate, the second display area 102 has a higher transmittance than the first display area 101. In this case, in the second display area 102, light having arrived at the electronic device 10 easily arrives at an optical component or other components placed behind the substrate 15. The optical component is a component that achieves some sort of function by detecting light. The optical component is for example a sensor such as a camera, a fingerprint sensor, or a face authentication sensor.

In the present embodiment, elements 20 that can function as pixels are placed in the second display area 102 as well as the first display area 101. For this reason, the second display area 102 can detect light and display a picture.

The second electrode 50X may spread substantially all over the first display area 101. For example, the first occupancy rate may be higher than or equal to 90%, higher than or equal to 95%, higher than or equal to 98%, higher than or equal to 99%, higher than or equal to 99.5%, or higher than or equal to 99.9%, or 100%.

Figure 3:
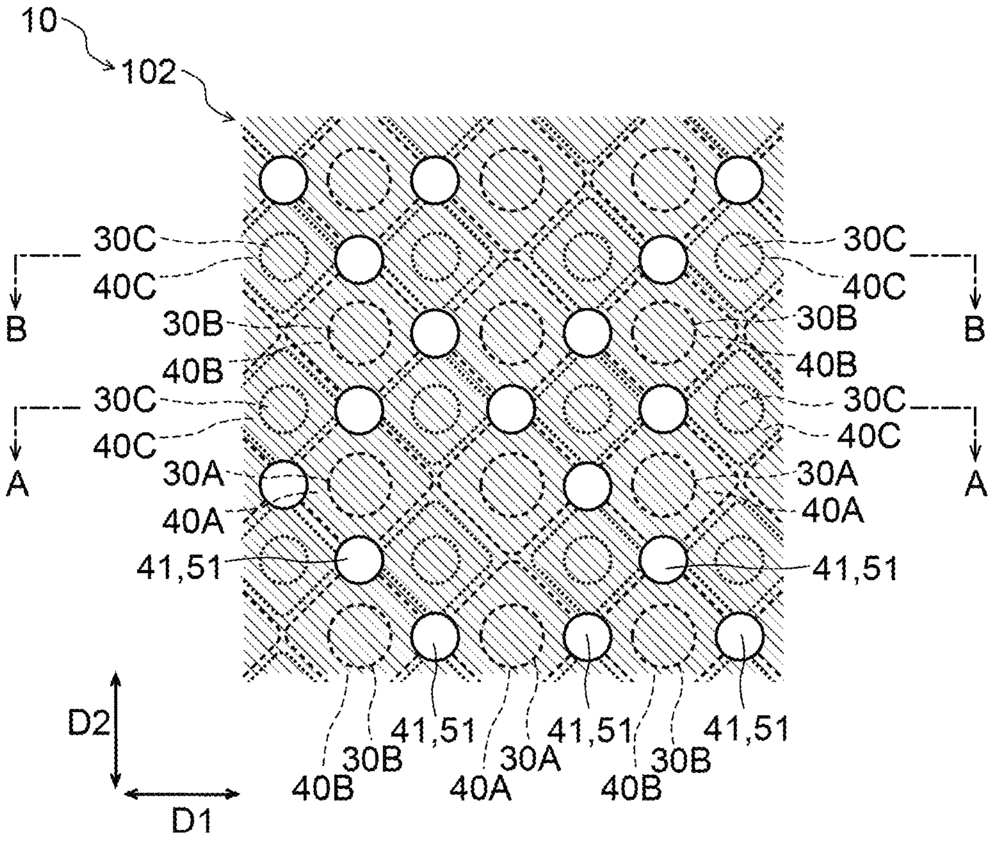
FIG. 3 is an enlarged plan view of the second display area of FIG. 2.
Figure 4:
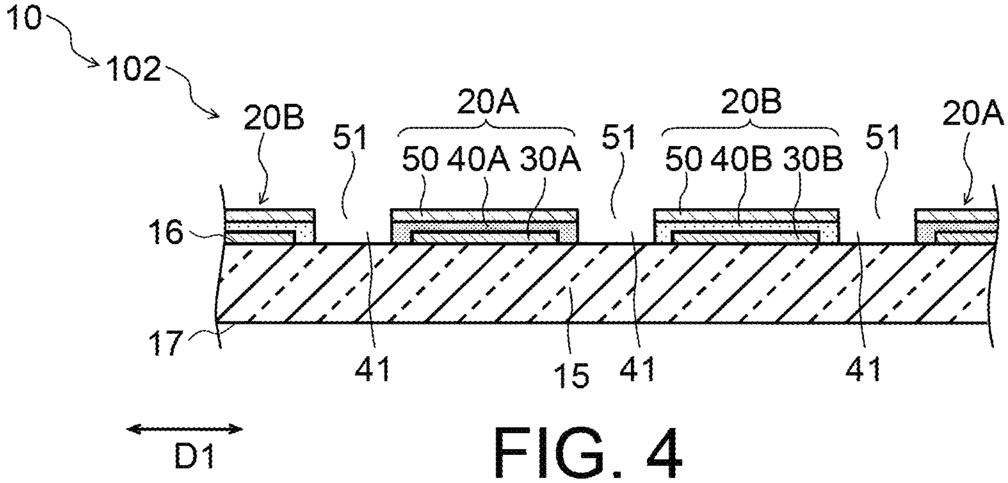
FIG. 4 is a cross-sectional view taken along line A-A in FIG. 3.
Figure 5:
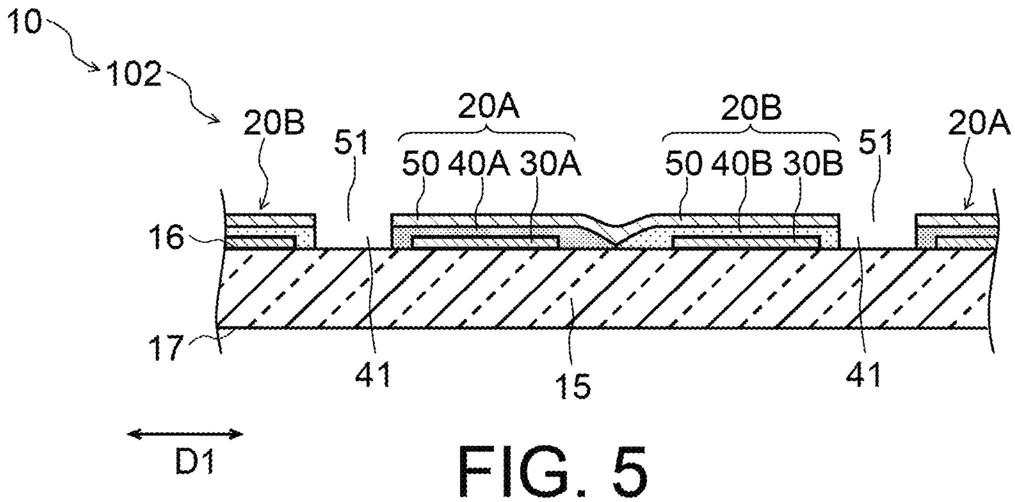
FIG. 5 is a cross-sectional view taken along line B-B in FIG. 3.

FIG. 3 is a plan view showing an example of the second display area 102. FIG. 4 is a cross-sectional view of the second display area 102 as taken along line A-A in FIG. 3. FIG. 5 is a cross-sectional view of the second display area 102 as taken along line B-B in FIG. 3. The electronic device 10 includes the substrate 15, a plurality of first electrodes 30, a plurality of organic layers 40, and the second electrode 50. The substrate 15 includes a first surface 16 and a second surface 17. The second surface 17 is located opposite the first surface 16.

The plurality of first electrodes 30 may be located on the first surface 16 of the substrate 15. The plurality of organic layers 40 may be located on the first electrodes 30. The second electrode 50 may be located on the organic layers 40. The second electrode 50 may spread so as to overlap the plurality of first electrodes 30 in planar view. The elements 20 may each be constituted by a stack structure including a first electrode 30, an organic layer 40, and the second electrode 50. The elements 20 can each achieve some sort of function through the application of a voltage between the first electrode 30 and the second electrode 50 or the flow of an electric current between the first electrode 30 and the second electrode 50. The elements 20 may be arranged on the first surface 16 along an in-plane direction of the first surface 16.

The electronic device 10 may be of an active matrix type. For example, although not illustrated, the electronic device 10 may include switches electrically connected separately to each of the elements 20. The switches are for example transistors. Each of the switches can control the turning on and turning off of a voltage that is applied to or of an electric current that flows through the corresponding one of the elements 20.

The plurality of organic layers 40 may include a plurality of first color organic layers 40A, a plurality of second color organic layers 40B, and a plurality of third color organic layers 40C. The first color organic layers 40A may for example be red luminescent layers. The second color organic layers 40B may for example be blue luminescent layers. The third color organic layers 40C may for example be green luminescent layers. Configurations common to the first color organic layers 40A, the second color organic layers 40B, and the third color organic layers 40C are described with reference to the term and reference sign "organic layers 40".

The plurality of first electrodes 30 may include a plurality of first color electrodes 30A, a plurality of second color electrodes 30B, and a plurality of third color electrodes 30C. The first color electrodes 30A overlap the first color organic layers 40A in planar view. That is, the first color organic layers 40A are located on the first color electrodes 30A. The second color electrodes 30B overlap the second color organic layers 40B in planar view. That is, the second color organic layers 40B are located on the second color electrodes 30B. The third color electrodes 30C overlap the third color organic layers 40C in planar view. That is, the third color organic layers 40C are located on the third color electrodes 30C. Configurations common to the first color electrodes 30A, the second color electrodes 30B, and the third color electrodes 30C are described with reference to the term and reference sign "first electrodes 30".

The plurality of elements 20 may include a plurality of first elements 20A, a plurality of second elements 20B, and a plurality of third elements 20C. The first elements 20A each include a first color electrode 30A, a first color organic layer 40A, and the second electrode 50. The second elements 20B each include a second color electrode 30B, a second color organic layer 40B, and the second electrode 50. The third elements 20C each include a third color electrode 30C, a third color organic layer 40C, and the second electrode 50. Configurations common to the first elements 20A, the second elements 20B, and the third elements 20C are described with reference to the term and reference sign "elements 20".

The first elements 20A and the second elements 20B may be alternately arranged along the first direction D1 and the second direction D2. That is, the first color electrodes 30A included in the first elements 20A and the second color electrodes 30B included in the second elements may be alternately arranged along the first direction D1 and alternately arranged along the second direction D2. Further, the first color organic layers 40A included in the first elements 20A and the second color organic layers 40B included in the second elements 20B too may be alternately arranged along the first direction D1 and alternately arranged along the second direction D2. The third elements may be arranged along the first direction D1 and the second direction D2 so as to be located between the first elements 20A and the second elements 20B. That is, the third color electrodes 30C included in the third elements may be arranged along the first direction D1 so as to be located between the first color electrodes 30A and the second color electrodes 30B in the first direction D1 and may be arranged along the second direction D2 so as to be located between the first color electrodes 30A and the second color electrodes 30B in the second direction D2. Further, the third color organic layers 40C included in the third elements 20C too may be arranged along the first direction D1 so as to be located between the first color organic layers 40A and the second color organic layers 40B in the first direction D1 and may be arranged along the second direction D2 so as to be located between the first color organic layers 40A and the second color organic layers in the second direction D2. Such an array of elements is also referred to as "Pen Tile array".

The substrate 15, the first electrodes 30, the organic layers 40, and the second electrode 50 are described in more detail.

The substrate 15 may be a plate member having insulation properties. The substrate 15 may have optical transparency. For example, the substrate 15 may be a glass substrate. Although not illustrated, there may be a wiring layer located between the substrate 15 and the elements 20. The wiring layer can transmit, for example, electric signals and electric power to the elements 20.

The transmittance of the substrate 15 may for example be higher than or equal to 70% or higher than or equal to 80%. The transmittance of the substrate 15 is measured in conformity with "Plastics—Determination of the total luminous transmittance of transparent materials" provided for in JIS K7361-1.

The substrate 15 may or may not have flexibility. The substrate 15 may be made of a material selected as appropriate depending on the intended use of the electronic device 10. The substrate 15 can be made of a material such as either a rigid material such as quartz glass, Pyrex (registered trademark) glass, a synthetic quartz plate, or alkali-free glass or a flexible material such as a resin film, an optical resin plate, or thin glass. The substrate may be a layered product including a resin film and a barrier layer(s) on one or both surfaces of the resin film.

The thickness of the substrate 15 may be selected as appropriate depending on the material of which the substrate 15 is made, the intended use of the electronic device 10, or other conditions. The thickness of the substrate 15 may for example be greater than or equal to mm. The thickness of the substrate 15 may be less than or equal to 5 mm.

The first electrodes 30 contain a material having electrical conductivity. For example, the first electrodes 30 may contain a metal, a metal oxide having electrical conductivity, an inorganic material having electrical conductivity, or other inorganic materials. The first electrodes 30 may contain a metal oxide having electrical conductivity, such as indium tin oxide. The first electrodes 30 may be made of a material such as indium tin oxide, which is referred to as "ITO", or indium zinc oxide, which is referred to as "IZO".

The organic layers 40 contain an organic material. The passage of electricity through the organic layers 40 allows the organic layers 40 to fulfill some sort of function. The passage of electricity means the application of a voltage to the organic layers 40 or the flow of an electric current through the organic layers 40. Usable examples of the organic layers 40 include luminescent layers that emit light with the passage of electricity and layers whose light transmittances and refractive indices vary with the passage of electricity. The organic layers 40 may contain an organic semiconductor material. The organic layers 40 may further include hole injection layers, hole transport layers, electron transport layers, electron injection layers, or other layers.

The second electrode 50 contains a material having electrical conductivity, such as a metal. The second electrode 50 can be made of a material such as platinum, gold, silver, copper, iron, tin, chromium, aluminum, indium, lithium, sodium, potassium, calcium, magnesium, or carbon. Each of these electrically conducting materials may be used alone, or two or more of these electrically conducting material may be used in combination. In a case where two or more of the materials are used, layer made separately of each of the materials may be stacked. An alloy containing two or more of the materials may be used as an electrically conducting material.

Next, the apertures 51 are described in more detail.

As shown in FIGS. 3 to 6, in the part of the second electrode 50 located in the second display area 102, the apertures 51 are formed in such positions as not to overlap the first electrodes 30 in planar view. The apertures 51 may be surrounded by the second electrode 50 in planar view. Each of the apertures 51 may be located between adjacent two of the first electrodes 30 in planar view. For example, an aperture 51 may be located between two of the first electrodes 30 adjacent to each other in the first direction D1. For example, an aperture 51 may be located between two of the first electrodes 30 adjacent to each other in the second direction D2.

The formation of the apertures 51 in the second electrode 50 allows easier transmission of light through the electronic device 10 than in a case where the second electrode 50 spreads all over the second display area 102. This makes it possible to increase the transmittance of the second display area 102.

As shown in FIGS. 3 to 6, the organic layers 40 may include organic layer apertures 41 overlapping the apertures 51 in planar view. As is the case with an aperture 51, an organic layer aperture 41 may be located between two of the first electrodes 30 adjacent to each other in the first direction D1. As is the case with an aperture 51, an organic layer aperture 41 may be located between two of the first electrodes 30 adjacent to each other in the second direction D2.

A problem that can arise in a case where the apertures 51 are formed in the second electrode 50 is described here. In a case where the apertures 51 are periodically placed, it is conceivable that rays of light diffracted when passing through the apertures 51 may intensify one another in a particular direction of travel of light. In this case, it is conceivable that the sharpness of an image that is generated by an optical component laid on the second display area 102 may be reduced.

To address such a problem, the present embodiment proposes reducing regularity of an arrangement of the apertures 51. This makes it possible to restrain high-intensity diffracted light from falling on an optical component such as a sensor. This makes it possible, for example, to reduce blurring of an image that is generated by the sensor.

Figure 6:
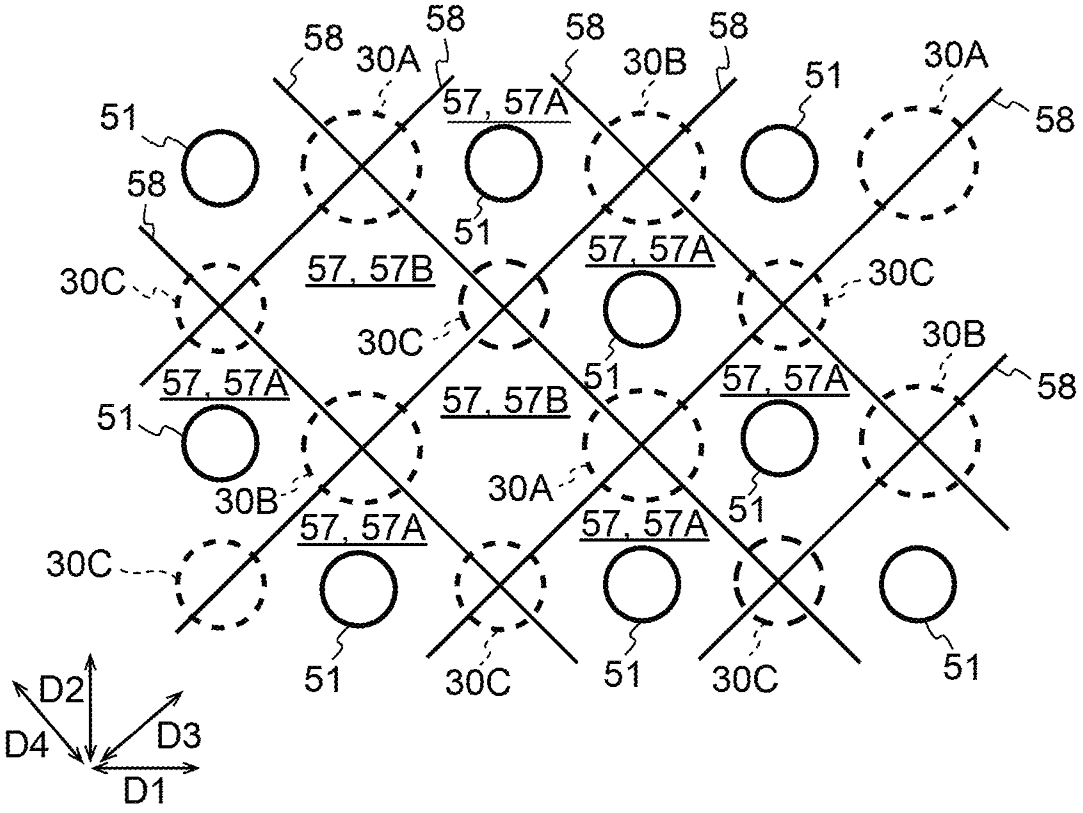
FIG. 6 is a plan view showing a partial enlargement of FIG. 3.

First, unit regions 57 are described. FIG. 6 is a plan view showing a partial enlargement of FIG. 3. For viewability of the drawing, FIG. 6 shows the first electrodes 30 and the apertures 51 with the organic layers 40 and the second electrode 50 removed from FIG. 3.

The part of the second electrode 50 located in the second display area 102 is divided into a plurality of the unit regions 57 on the basis of the plurality of first electrodes 30. Each of the unit regions 57 may have the shape of a polygon demarcated by lines of demarcation 58 connecting center points of first electrodes 30. For example, each of the unit regions 57 may be demarcated by a quadrangle that is obtained by connecting center points of four adjacent ones of the first electrodes 30. The "four adjacent ones of the first electrodes 30" mean four first electrodes 30 three of which are adjacent to the one other first electrode 30 in the first direction D1, the second direction D2, a third direction D3, or a fourth direction D4. The third direction D3 and the fourth direction D4 are directions each intersecting the first direction D1 and the second direction D2. As shown in FIG. 6, the third direction D3 may be a direction inclined at 45 degrees with respect to the first direction D1 and the second direction D2. The fourth direction D4 may be a direction inclined at degrees with respect to the first direction D1 and the second direction D2 and may be a direction orthogonal to the third direction D3.

For example, as shown in FIG. 6, each of the unit regions 57 may be demarcated by a quadrangle that is obtained by connecting center points of four adjacent ones of the first electrodes 30, namely one first color electrode one second color electrode 30B, and two third color electrodes 30C. Note here that the one first color electrode 30A and the one second color electrode 30B are adjacent to each other in the first direction D1 or the second direction D2. The one first color electrode 30A and one of the two third color electrode 30C are adjacent to each other in the third direction D3. The one first color electrode 30A and the other of the two third color electrode are adjacent to each other in the fourth direction D4.

As shown in FIG. 6, the plurality of unit regions 57 includes aperture regions 57A including the apertures 51 and non-aperture regions 57B not including the apertures 51. That is, the unit regions 57 are categorized into aperture regions 57A in which the apertures 51 are formed and non-aperture regions 57B in which the apertures 51 are not formed. In other words, as shown in FIGS. 3, 4, and 6, a region (aperture region 57A) in which an aperture 51 is formed is present between two of the first electrodes 30 adjacent to each other in the first direction D1 or the second direction D2, and as shown in FIGS. 3, 5, and 6, a region (non-aperture region 57B) in which no aperture 51 is formed too is present between two of the first electrodes 30 adjacent to each other in the first direction D1 or the second direction D2.

As shown in FIG. 6, one aperture 51 may be formed in one aperture region 57A. Although not illustrated, two or more apertures 51 may be formed in one aperture region 57A.

As shown in FIG. 6, in planar view, the center point of each of the apertures 51 and the center point of the corresponding one of the aperture regions 57A may coincide with each other. The center point of each of the apertures 51 is the barycenter of that aperture 51 in planar view. The barycenter of each of the apertures 51 is calculated by analyzing an image in the second display area 102 that is generated based on light reflected by the electronic device 10. The center point of each of the aperture regions 57A is defined as a point of intersection of two straight lines each joining opposite corners of a quadrangle constituting that aperture region 57A. Although not illustrated, in planar view, the center point of each of the apertures 51 and the center point of the corresponding one of the aperture regions 57A may be out of alignment with each other.

The aperture regions 57A and the non-aperture regions 57B may be placed all over the second display area 102. The aperture regions 57A and the non-aperture regions 57B may be placed in any manner. As shown in FIGS. 2, 3, and 6, the aperture regions 57A and the non-aperture regions 57B may be randomly placed.

In a case where all unit regions 57 are aperture regions 57A, the arrangement of the apertures 51 is so high in regularity that rays of diffracted light easily intensify one another. The inclusion by the unit regions 57 of non-aperture regions 57B not including the apertures 51 makes it possible to reduce the regularity of the arrangement of the apertures 51. This makes it possible to restrain high-intensity diffracted light from falling on an optical component such as a sensor.

The proportion of the number of non-aperture regions 57B to the number of unit regions 57 may for example be higher than or equal to 5%, higher than or equal to 10%, or higher than or equal to 20%. The proportion of the number of non-aperture regions 57B to the number of unit regions 57 may for example be lower than or equal to 50%, lower than or equal to 80%, or lower than or equal to 95%. The proportion of the number of non-aperture regions 57B to the number of unit regions 57 may fall within a range defined by a first group consisting of 5%, 10%, and 20% and/or a second group consisting of 50%, 80%, and 90%. The proportion of the number of non-aperture regions 57B to the number of unit regions 57 may fall within a range defined by a combination of any one of the values included in the aforementioned first group and any one of the values included in the aforementioned second group. The proportion of the number of non-aperture regions 57B to the number of unit regions 57 may fall within a range defined by a combination of any two of the values included in the aforementioned first group. The proportion of the number of non-aperture regions 57B to the number of unit regions 57 may fall within a range defined by a combination of any two of the values included in the aforementioned second group. The proportion of the number of non-aperture regions 57B to the number of unit regions 57 may for example be higher than or equal to 5% and lower than or equal to 95%, higher than or equal to 5% and lower than or equal to 80%, higher than or equal to 5% and lower than or equal to 50%, higher than or equal to 5% and lower than or equal to 20%, higher than or equal to 5% and lower than or equal to 10%, higher than or equal to 10% and lower than or equal to 95%, higher than or equal to 10% and lower than or equal to 80%, higher than or equal to 10% and lower than or equal to 50%, higher than or equal to 10% and lower than or equal to 20%, higher than or equal to 20% and lower than or equal to 95%, higher than or equal to 20% and lower than or equal to 80%, higher than or equal to 20% and lower than or equal to 50%, higher than or equal to 50% and lower than or equal to 95%, higher than or equal to 50% and lower than or equal to 80%, or higher than or equal to 80% and lower than or equal to 95%.

The number of unit regions 57 and the number of non-aperture regions 57B are measured all across the second display area 102. The number of unit regions 57 can be calculated from the number of first electrodes 30 located in the second display area 102. The number of non-aperture regions 57B can be calculated by subtracting the number of aperture regions 57A from the number of unit regions 57. The number of aperture regions 57A can be calculated by analyzing an image in the second display area 102 that is generated based on light reflected by the electronic device 10. The number of aperture regions 57A can be calculated by counting the number of apertures 51 that are identified based on a difference between the reflectance of light in regions overlapping, for example, the first electrodes 30 and the second electrode 50 and the reflectance of light in regions overlapping the apertures 51.

In FIGS. 2, 3, and 6, the after-mentioned FIGS. 23 to 32, and the after-mentioned examples, circles are employed as the shapes of the first electrodes 30, the organic layers 40, and the apertures 51 in planar view for ease of explanation of an technical idea of the present embodiment. However, the shapes of the first electrodes 30, the organic layers 40, and the apertures 51 are not limited to circles. In the other drawings, rectangles having curved corners are employed as the shapes of the first electrodes the organic layers 40, and the apertures 51.

Next, a cross-section structure of the second electrode 50 is described.

Figure 7:
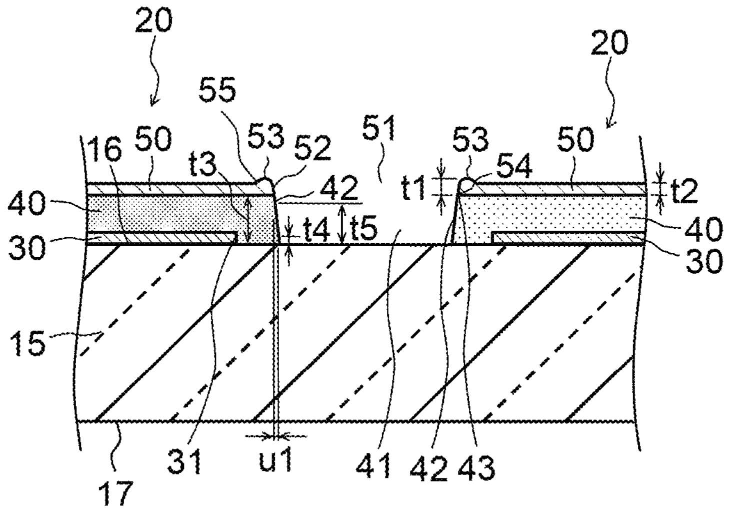
FIG. 7 is a cross-sectional view showing a partial enlargement of FIG. 4.

FIG. 7 is a cross-sectional view showing a partial enlargement of FIG. 4. The second electrode 50 includes side surfaces 52 facing the apertures 51. Similarly, the organic layers 40 include side surfaces 42 facing the organic layer apertures 41. As shown in FIG. 7, upper ends 43 of the side surfaces 42 of the organic layers 40 may be in contact with lower ends 54 of the side surfaces 52 of the second electrode 50. Such a relationship between the side surfaces 42 and the side surfaces 52 can be achieved in a case where the organic layer apertures 41 and the apertures 51 are formed by laser processing.

Figure 8:
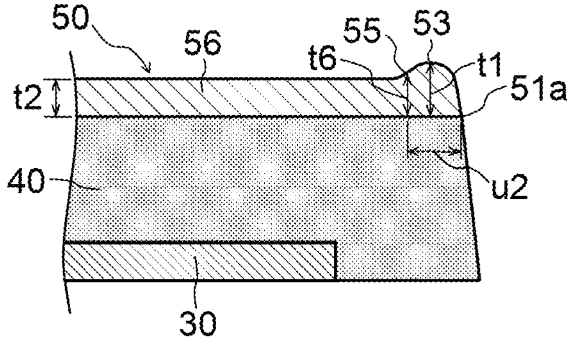
FIG. 8 is a cross-sectional view showing a further partial enlargement of FIG. 7.

FIG. 8 is a cross-sectional view showing a further partial enlargement of FIG. 7. As shown in FIGS. 7 and 8, upper ends 53 of the side surfaces 52 of the second electrode 52 may be raised above surrounding parts of the second electrode 50. Such raised parts can be formed by the second electrode 50 melting during laser processing. The raising of the upper ends 53 of the side surfaces 52 of the second electrode 50 leads to an increase in height of the side surfaces 52 of the second electrode 50. This makes it possible to reduce the electric resistance of the second electrode 50.

In FIGS. 7 and 8, reference sign t1 denotes the height of each of the side surfaces 52 of the second electrode 50. Reference sign t2 denotes the average of the thicknesses of regions of the second electrode 50 that overlap a first electrode 30 in planar view. The height t1 is the distance between the upper end 53 and the lower end 54 of each of the side surfaces 52 in a direction normal to the first surface 16 of the substrate 15. The height t1 of each of the side surfaces 52 and the average thickness t2 of the second electrode 50 are calculated based on a cross-sectional image of the electronic device 10. The cross-sectional image is obtained by observing a cross-section of the electronic device 10 with a scanning electron microscope.

Figure 9:
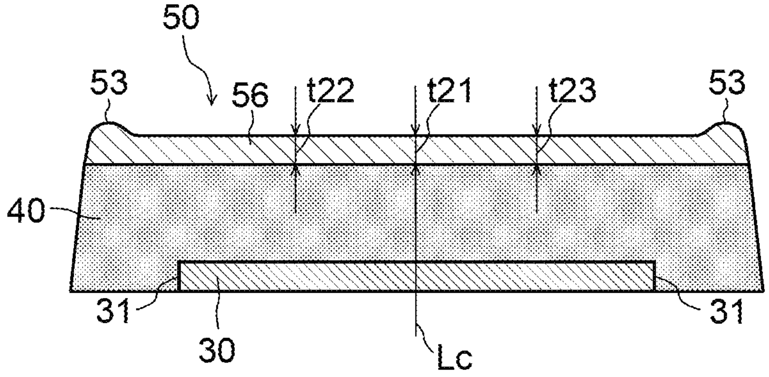
FIG. 9 is a diagram for explaining a method for calculating an average thickness of a second electrode.

A method for calculating the average thickness t2 of the second electrode 50 is described with reference to FIG. 9. The average t2 is calculated by averaging a thickness t21, a thickness t22, and a thickness t23. The thickness t21 is the thickness of a portion of the second electrode 50 that overlaps the center of a first electrode 30 in the in-plane direction of the first surface 16. In FIG. 9, a straight line passing through the center of the first electrode 30 and extending in the direction normal to the substrate 15 is denoted by reference sign Lc. The thicknesses t22 and t23 are the thicknesses of portions of the second electrode 50 each located between an end 31 of the first electrode 30 and the straight line Lc in the in-plane direction of the first surface 16.

The height t1 of each of the side surfaces 52 may be greater than the average thickness t2 of the second electrode 50. That is, t1/t2 may be higher than 1.0. t/1/t2 may for example be higher than or equal to 1.1, higher than or equal to 1.2, higher than or equal to 1.3, or higher than or equal to 1.4. t/1/t2 may for example be lower than or equal to 1.5, lower than or equal to 1.6, lower than or equal to 1.8, or lower than or equal to 2.0. t1/t2 may fall within a range defined by a first group consisting of 1.1, 1.2, 1.3, and 1.4 and/or a second group consisting of 1.5, 1.6, 1.8, and 2.0. t1/t2 may fall within a range defined by a combination of any one of the values included in the aforementioned first group and any one of the values included in the aforementioned second group. t1/t2 may fall within a range defined by a combination of any two of the values included in the aforementioned first group. t1/t2 may fall within a range defined by a combination of any two of the values included in the aforementioned second group. t1/t2 may for example be higher than or equal to 1.1 and lower than or equal to 2.0, higher than or equal to 1.1 and lower than or equal to 1.8, higher than or equal to 1.1 and lower than or equal to 1.6, higher than or equal to 1.1 and lower than or equal to 1.5, higher than or equal to 1.1 and lower than or equal to 1.4, higher than or equal to 1.1 and lower than or equal to 1.3, higher than or equal to 1.1 and lower than or equal to 1.2, higher than or equal to 1.2 and lower than or equal to 2.0, higher than or equal to 1.2 and lower than or equal to 1.8, higher than or equal to 1.2 and lower than or equal to 1.6, higher than or equal to 1.2 and lower than or equal to 1.5, higher than or equal to 1.2 and lower than or equal to 1.4, higher than or equal to 1.2 and lower than or equal to 1.3, higher than or equal to 1.3 and lower than or equal to 2.0, higher than or equal to 1.3 and lower than or equal to 1.8, higher than or equal to 1.3 and lower than or equal to 1.6, higher than or equal to 1.3 and lower than or equal to 1.5, higher than or equal to 1.3 and lower than or equal to 1.4, higher than or equal to 1.4 and lower than or equal to 2.0, higher than or equal to 1.4 and lower than or equal to 1.8, higher than or equal to 1.4 and lower than or equal to 1.6, higher than or equal to 1.4 and lower than or equal to 1.5, higher than or equal to 1.5 and lower than or equal to 2.0, higher than or equal to 1.5 and lower than or equal to 1.8, higher than or equal to 1.5 and lower than or equal to 1.6, higher than or equal to 1.6 and lower than or equal to 2.0, higher than or equal to 1.6 and lower than or equal to 1.8, or higher than or equal to 1.8 and lower than or equal to 2.0.

In a case where the organic layer apertures 41 are formed in the organic layers 40 by laser processing, adjusting the direction of irradiation with light makes it possible to adjust an angle that the side surfaces 42 facing the organic layer apertures 41 form with respect to the first surface 16 of the substrate 15. This makes it possible, for example, to form the organic layer apertures 41 so that the side surfaces 42 sharply rise. In this case, the width u1 of each of the side surfaces 42 of the organic layers 40 is smaller than the width of a side surface of an organic layer that is formed by a deposition method. Since the side surfaces 42 of the organic layers 40 sharply rise, variations in the effective areas of the organic layers 40 are reduced. This reduces variations in the characteristics of the organic layers 40. For example, in a case where the organic layers 40 are luminescent layers, variations in the luminous intensity of light from the luminescent layers are reduced. This makes it possible to restrain a luminance distribution of the electronic device 10 from varying from place to place in the plane of the electronic device 10. The "effective area of an organic layer 40" means the area of a portion of the organic layer 40 that has a thickness needed for the organic layer 40 to fulfill its function and that overlaps a first electrode 30 and the second electrode in planar view.

The width u1 of each of the side surfaces 52 is herein defined as the distance in the in-plane direction of the first surface 16 from a place at which the height of the side surface 52 reaches t4 to a place at which the height of the side surface 52 reaches t5. t4 is 0.2×t3, and t5 is 0.8×t3. Reference sign t3 denotes the average of the thicknesses of regions of each of the organic layers 40 each located between a side surface 42 and an end 31 of a first electrode 30 in planar view. As is the case with the thickness of the second electrode 50, the thickness of each of the organic layers 40 is calculated based on a cross-sectional image of the electronic device 10.

The width u1 may for example be greater than or equal to 0.1 μm, greater than or equal to 0.2 μm, greater than or equal to 0.3 μm, or greater than or equal to 0.4 μm. The width u1 may for example be less than or equal to 0.5 μm, less than or equal to 1.0 μm, less than or equal to 1.5 μm, or less than or equal to 2.0 μm. The width u1 may fall within a range defined by a first group consisting of 0.1 μm, 0.2 μm, 0.3 μm, and 0.4 μm and/or a second group consisting of 0.5 μm, 1.0 μm, 1.5 μm, and 2.0 μm. The width u1 may fall within a range defined by a combination of any one of the values included in the aforementioned first group and any one of the values included in the aforementioned second group. The width u1 may fall within a range defined by a combination of any two of the values included in the aforementioned first group. The width u1 may fall within a range defined by a combination of any two of the values included in the aforementioned second group. The width u1 may for example be greater than or equal to 0.1 μm and less than or equal to 2.0 μm, greater than or equal to 0.1 μm and less than or equal to 1.5 μm, greater than or equal to 0.1 μm and less than or equal to 1.0 μm, greater than or equal to 0.1 μm and less than or equal to 0.5 μm, greater than or equal to 0.1 μm and less than or equal to 0.4 μm, greater than or equal to 0.1 μm and less than or equal to 0.3 μm, greater than or equal to 0.1 μm and less than or equal to 0.2 μm, greater than or equal to 0.2 μm and less than or equal to 2.0 μm, greater than or equal to 0.2 μm and less than or equal to 1.5 μm, greater than or equal to 0.2 μm and less than or equal to 1.0 μm, greater than or equal to 0.2 μm and less than or equal to 0.5 μm, greater than or equal to 0.2 μm and less than or equal to 0.4 μm, greater than or equal to 0.2 μm and less than or equal to 0.3 μm, greater than or equal to 0.3 μm and less than or equal to 2.0 μm, greater than or equal to 0.3 μm and less than or equal to 1.5 μm, greater than or equal to 0.3 μm and less than or equal to 1.0 μm, greater than or equal to 0.3 μm and less than or equal to 0.5 μm, greater than or equal to 0.3 μm and less than or equal to 0.4 μm, greater than or equal to 0.4 μm and less than or equal to 2.0 μm, greater than or equal to 0.4 μm and less than or equal to 1.5 μm, greater than or equal to 0.4 μm and less than or equal to 1.0 μm, greater than or equal to 0.4 μm and less than or equal to 0.5 μm, greater than or equal to 0.5 μm and less than or equal to 2.0 μm, greater than or equal to 0.5 μm and less than or equal to 1.5 μm, greater than or equal to 0.5 μm and less than or equal to 1.0 μm, greater than or equal to 1.0 μm and less than or equal to 2.0 μm, greater than or equal to 1.0 μm and less than or equal to 1.5 μm, or greater than or equal to 1.5 μm and less than or equal to 2.0 μm.

In a case where the side surfaces 52 of the second electrode 50 are raised, the second electrode 50 includes basal portions 55 located outside the upper ends 53 as shown in FIGS. 7 and 8. The second electrode 50 decreases in thickness outward from the upper ends 53. The term "outward" means "away from the centers of the apertures 51 in planar view". The basal portions 55 are places at which the thickness of the second electrode 50 is sufficiently smaller than the height t1 of each of the side surfaces 52. For example, the thickness t6 of each of the basal portions of the second electrode 50 is 1.05 times as great as the average thickness t2 of the second electrode 50.

Reference sign 51*a* denotes the outer edge of each of the apertures 51 in planar view. Reference sign u2 denotes the distance in planar view from the outer edge 51*a* of each of the apertures 51 to the corresponding one of the basal portions 55. The distance u2 may for example be greater than or equal to 0.05 μm, greater than or equal to 0.1 μm, or greater than or equal to 0.5 μm. The distance u2 may for example be less than or equal to 2.0 μm, less than or equal to 3.0 μm, or less than or equal to 5.0 μm. The distance u2 may fall within a range defined by a first group consisting of 0.05 μm, 0.1 μm, and 0.5 μm and/or a second group consisting of 2.0 μm, 3.0 μm, and 5.0 μm. The distance u2 may fall within a range defined by a combination of any one of the values included in the aforementioned first group and any one of the values included in the aforementioned second group. The distance u2 may fall within a range defined by a combination of any two of the values included in the aforementioned first group. The distance u2 may fall within a range defined by a combination of any two of the values included in the aforementioned second group. The distance u2 may for example be greater than or equal to 0.05 μm and less than or equal to 5.0 μm, greater than or equal to 0.05 μm and less than or equal to 3.0 μm, greater than or equal to 0.05 μm and less than or equal to 2.0 μm, greater than or equal to 0.05 μm and less than or equal to 0.5 μm, greater than or equal to 0.05 μm and less than or equal to 0.1 μm, greater than or equal to 0.1 μm and less than or equal to 5.0 μm, greater than or equal to 0.1 μm and less than or equal to 3.0 μm, greater than or equal to 0.1 μm and less than or equal to 2.0 μm, greater than or equal to 0.1 μm and less than or equal to 0.5 μm, greater than or equal to 0.5 μm and less than or equal to 5.0 μm, greater than or equal to 0.5 μm and less than or equal to 3.0 μm, greater than or equal to 0.5 μm and less than or equal to 2.0 μm, greater than or equal to 2.0 μm and less than or equal to 5.0 μm, greater than or equal to 2.0 μm and less than or equal to 3.0 μm, or greater than or equal to 3.0 μm and less than or equal to 5.0 μm.

The dimensions of the constituent elements of the electronic devices 10, the distances between the constituent elements, or other values are measured by observing a cross-sectional image of the electronic device 10 with a scanning electron microscope.

The second electrode 50 may include a homogenous region 56. The homogenous region 56 is for example a region having a thickness 1.05 times or less as great as the average t2. The homogenous region 56 spreads so as to surround the apertures 51 in planar view. The homogenous region 56 may spread outside the basal portions 55. The homogenous region 56 may occupy a large portion of the second electrode 50. The occupancy rate of the homogenous region 56 in the second electrode 50 may for example be higher than or equal to 90%, higher than or equal to 95%, higher than or equal to 98%, or higher than or equal to 99%. In a case where a large portion of the second electrode 50 is the homogenous region 56, light is easily transmitted through the second electrode 50. This makes it possible to increase the transmittance of the electronic device 10.

electronic device 10 is described.

Figure 10:
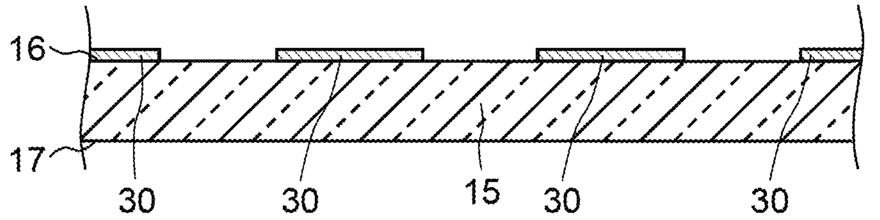
FIG. 10 is a cross-sectional view for explaining a substrate preparing step of a manufacturing method for the electronic device.
Figure 11:
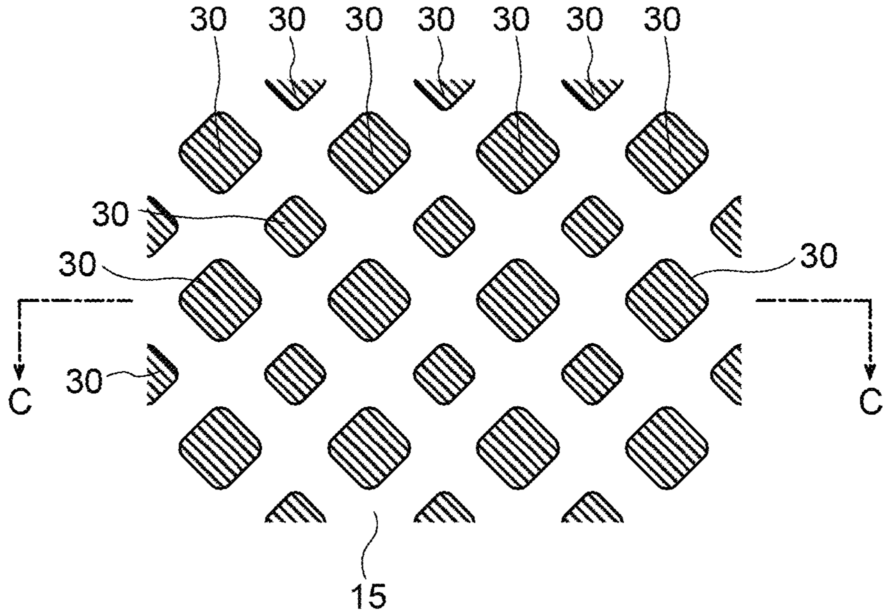
FIG. 11 is a plan view corresponding to FIG. 10.

First, a substrate preparing step is executed. FIG. 10 is a cross-sectional view showing a state in which the first electrodes 30 are formed on the substrate 15. FIG. 11 is a plan view corresponding to FIG. 10. FIG. 10 is equivalent to a cross-sectional view taken along line C-C in FIG. 11. In the substrate preparing step, the substrate 15 is prepared with the first electrodes 30 formed thereon. The first electrodes 30 are formed, for example, by forming a conductive layer on the substrate 15 by sputtering or other processes and then patterning the conductive layer into the first electrodes 30 by a photolithography process.

Figure 12:
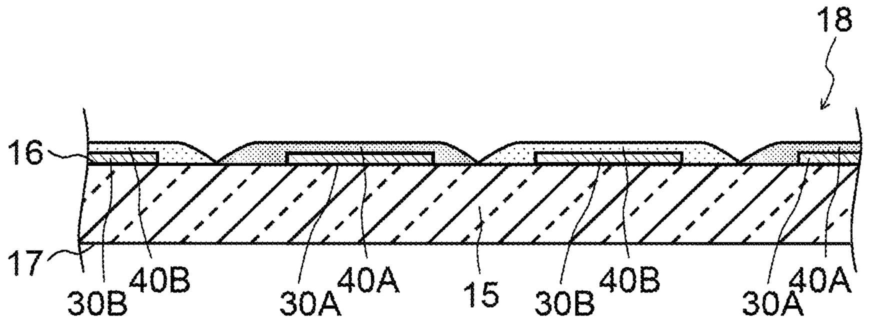
FIG. 12 is a cross-sectional view for explaining an organic layer forming step of the manufacturing method for the electronic device.
Figure 13:
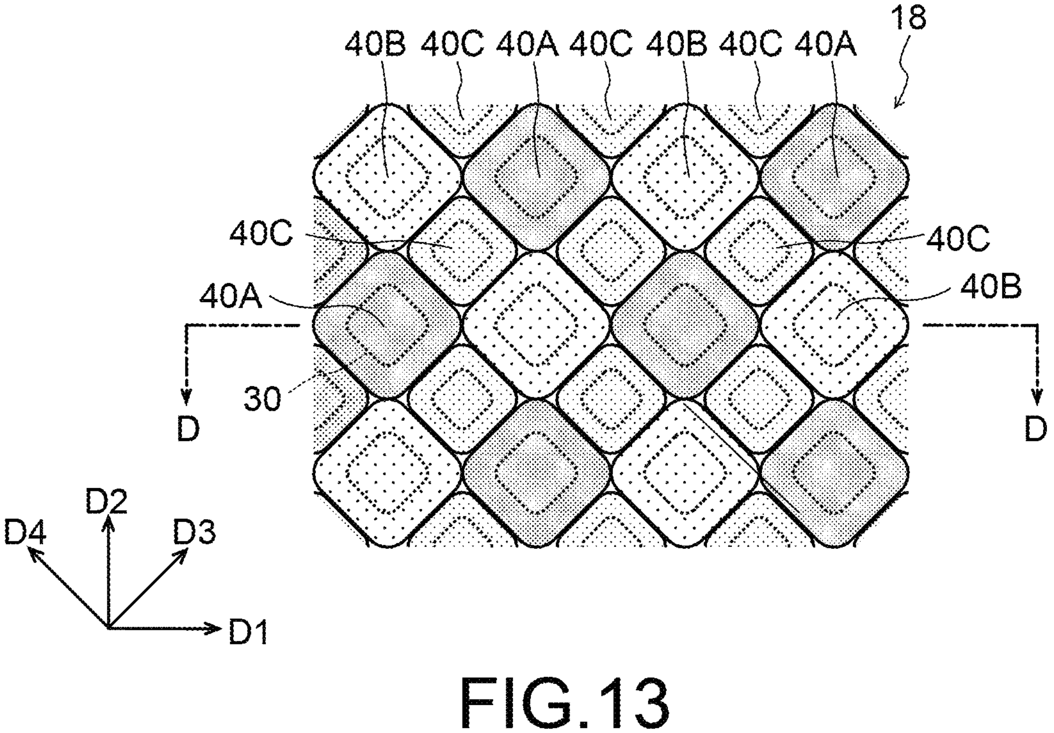
FIG. 13 is a plan view corresponding to FIG. 12.

Then, an organic layer forming step is executed. FIG. 12 is a cross-sectional view showing a state in which the first electrodes 30 and the organic layers 40 are formed on the substrate 15. FIG. 13 is a plan view corresponding to FIG. 12. FIG. 12 is equivalent to a cross-sectional view taken along line D-D in FIG. 13. In the organic layer forming step, the organic layers 40 are formed on the first electrodes 30. The organic layers 40 are formed, for example, by causing an organic material to adhere onto the substrate 15 and onto the first electrodes 30 by a deposition method that involves the use of a deposition mask having through holes corresponding to the organic layers 40. In this way, a layered product 18 including a substrate 15, a plurality of first electrodes 30 located on the substrate 15, and a plurality of organic layers 40 located on the first electrodes 30 can be prepared.

As shown in FIG. 13, the first color organic layers 40A and the second color organic layers 40B may be alternately arranged along the first direction D1 and alternately arranged along the second direction D2. The third color organic layers 40C may be arranged along the first direction D1 so as to be located between the first color organic layers 40A and the second color organic layers in the first direction D1 and may be arranged along the second direction D2 so as to be located between the first color organic layers 40A and the second color organic layers in the second direction D2. It can also be said that the first color organic layers 40A and the third color organic layers 40C are alternately arranged along the third direction D3 and alternately arranged along the fourth direction D4. Further, it can also be said that the second color organic layers 40B and the third color organic layers are alternately arranged along the third direction D3 and alternately arranged along the fourth direction D4.

Figure 14:
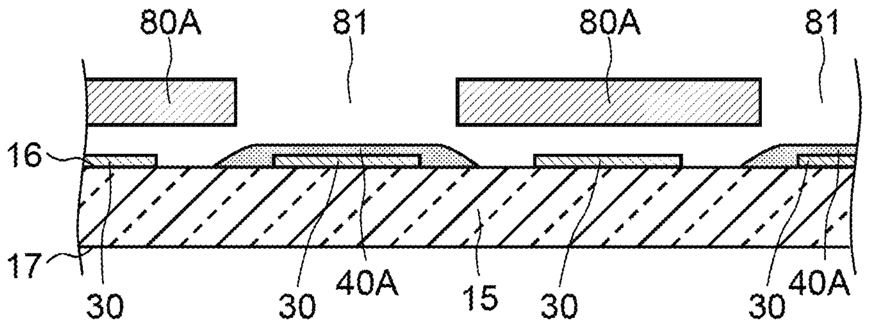
FIG. 14 is a cross-sectional view for explaining a step of forming first color organic layers in the organic layer forming step of the manufacturing method for the electronic device.

The organic layer forming step includes a step of forming the first color organic layers 40A, a step of forming the second color organic layers 40B, and a step of forming the third color organic layers 40C. FIG. 14 is a cross-sectional view showing an example of the step of forming the first color organic layers 40A. First, a first deposition mask 80A including a plurality of through holes 81 is prepared. Then, the first deposition mask 80A is brought face-to-face with the substrate 15 with the first electrodes 30 formed on the substrate 15. Then, a first deposition step of depositing the material of the first color organic layers 40A on the first electrodes 30 via the through holes 81 of the deposition mask 80A is executed. As shown in FIG. 14, the first color organic layers 40A may be formed not only in regions overlapping the first electrodes in planar view, but also in regions not overlapping the first electrodes 30.

Figure 15:
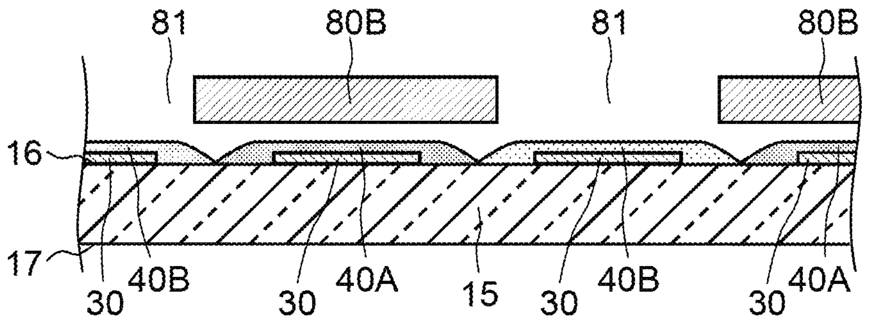
FIG. 15 is a cross-sectional view for explaining a step of forming second color organic layers in the organic layer forming step of the manufacturing method for the electronic device.

FIG. 15 is a cross-sectional view showing an example of the step of forming the second color organic layers 40B. First, a second deposition mask 80B including a plurality of through holes 81 is prepared. Then, the second deposition mask 80B is brought face-to-face with the substrate 15 with the first electrodes 30 and the first color organic layers 40A formed on the substrate 15. After that, a second deposition step of depositing the material of the second color organic layers 40B on the first electrodes via the through holes 81 of the deposition mask 80B is executed. As shown in FIG. 15, the second color organic layers 40B may be formed not only in regions overlapping the first electrodes 30 in planar view, but also in a region not overlapping the first electrodes 30.

Although not illustrated, a third deposition step of depositing the material of the third color organic layers on the first electrodes 30 via through holes of a deposition mask is executed in the step of forming the third color organic layers 40C as in the case of the first color organic layers 40A and the second color organic layers 40B. In this way, the organic layers 40, including the first color organic layers 40A, the second color organic layers 40B, and the third color organic layers 40C, can be formed on the first electrodes 30.

Figure 16:
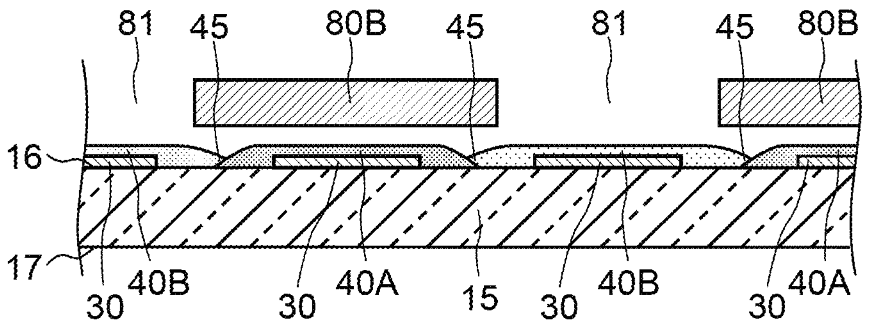
FIG. 16 is a modification of the step shown in FIG. 15.

FIG. 16 is a cross-sectional view showing another example of the step of forming the second color organic layers 40B. As shown in FIG. 16, the second deposition step may be executed so that parts of the second color organic layers 40B overlap the first color organic layers 40A. In this case, the first color organic layers 40A and the second color organic layers 40B include overlap portions 45 that do not overlap the first electrodes 30 but partially overlap each other. Although not illustrated, the first color organic layers 40A and the third color organic layers 40C may partially overlap each other. Further, the second color organic layers 40B and the third color organic layers 40C may partially overlap each other.

Figure 17:
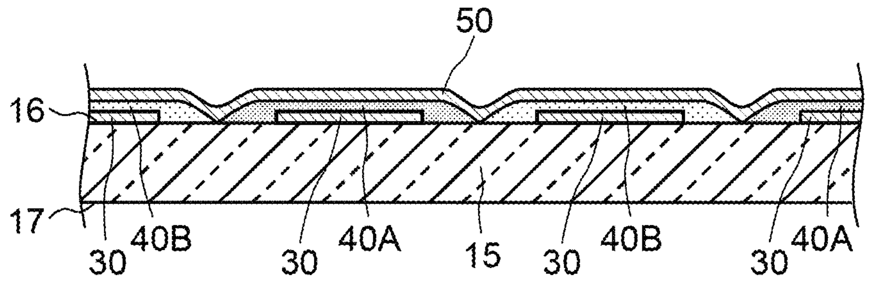
FIG. 17 is a cross-sectional view for explaining a second electrode forming step of the manufacturing method for the electronic device.
Figure 18:
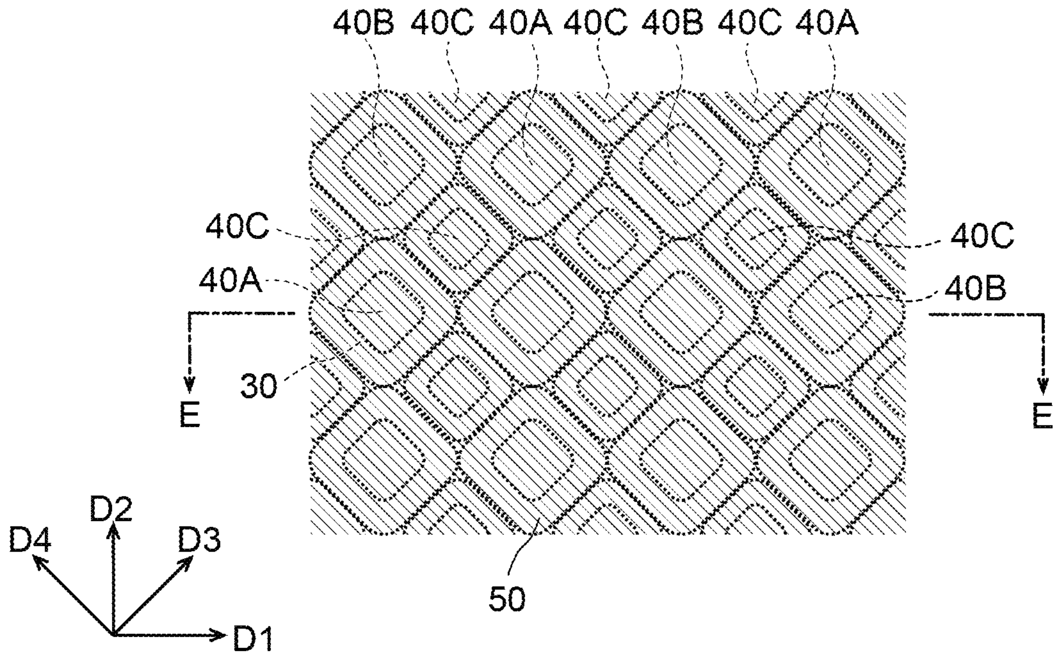
FIG. 18 is a plan view corresponding to FIG. 17.

Next, a second electrode forming step is executed. FIG. 17 is a cross-sectional view showing a state in which the second electrode 50 is formed on the organic layers 40. FIG. 18 is a plan view corresponding to FIG. 17. FIG. 17 is equivalent to a cross-sectional view taken along line E-E in FIG. 18. In the second electrode forming step, the second electrode 50 is formed on the organic layers 40 so as to overlap a plurality of the first electrodes 30 in planar view. For example, the second electrode 50 is formed all over the first surface 16 of the substrate 15 by a deposition method.

The second electrode 50 may be formed all over the first display area 101 and the second display rea 102. The second electrode 50 may include a layer that continuously spreads in a gapless manner. The second electrode 50 may be composed of one layer that continuously spreads in a gapless manner. The second electrode 50 may be formed by a single deposition step.

After that, an aperture forming step is executed. In the aperture forming step, in the part of the second electrode 50 located in the second display area 102, the apertures 51 are formed in such positions as not to overlap the first electrodes 30 in planar view. The aperture forming step may include a preparing step and a removing step.

First, the preparing step is executed. In the preparing step, the arrangement of the apertures 51 to be formed in the part of the second electrode 50 located in the second display area 102 is calculated. More specifically, the unit regions 57 into which the second electrode 50 was divided based on the plurality of first electrodes 30 are categorized into aperture regions 57A in which the apertures 51 are formed and non-aperture regions 57B in which the apertures 51 are not formed. The preparing step may include an arrangement determining step. In the arrangement determining step, the arrangement of the aperture regions 57A and the non-aperture regions 57B is determined. For example, the arrangement of the aperture regions 57A and the non-aperture regions 57B may be randomly determined. The preparing step may include a proportion determining step. In the proportion determining step, the proportion of the number of non-aperture regions 57B to the number of unit regions 57. In the aforementioned arrangement determining step, the arrangement of the aperture regions 57A and the non-aperture regions 57B may be determined so that the proportion determined in the proportion determining step is satisfied.

Figure 19:
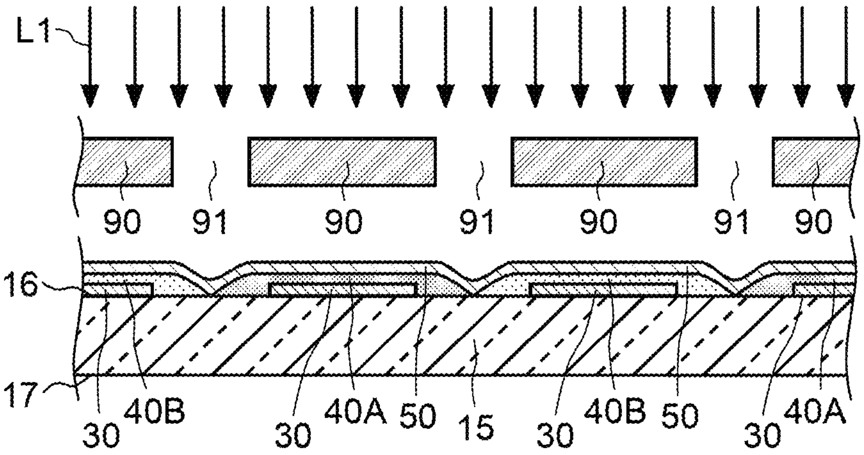
FIG. 19 is a cross-sectional view for explaining an irradiating step of the manufacturing method for the electronic device.
Figure 20:
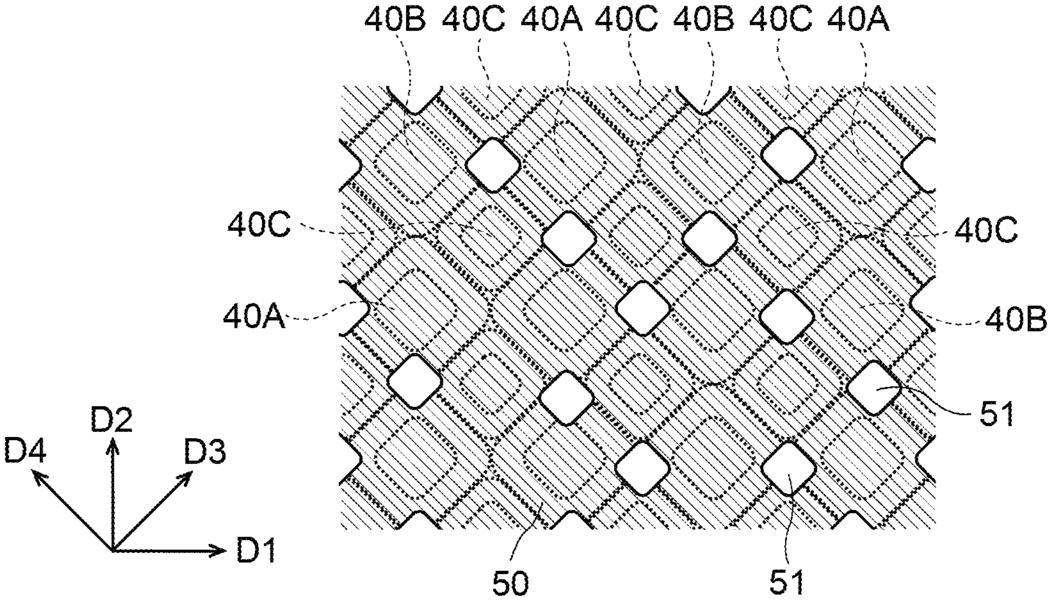
FIG. 20 is a plan view showing a state in which apertures are formed in a second electrode in the irradiating step of the manufacturing method for the electronic device.

After the preparing step, the removing step is executed. The removing step includes forming the plurality of apertures 51 in the second electrode 50 by removing part of the second electrode 50 on the basis of the arrangement calculated in the preparing step. The removing step may include an irradiating step. In the irradiating step, the second electrode 50 is irradiated with a laser L1. FIG. 19 is a cross-sectional view showing an example of the irradiating step. As shown in FIG. 19, the second electrode may be irradiated with the laser L1 via through holes 91 of a laser mask 90. FIG. 20 is a plan view showing a state in which the apertures 51 are formed in the second electrode By irradiating the second electrode 50 with the laser L1, the apertures 51 can be formed in the second electrode as shown in FIG. 20. In this way, an electronic device including a plurality of unit regions 57 including aperture regions 57A including apertures 51 and non-aperture regions 57B not including the apertures 51 can be obtained.

The irradiating step may include a step of, after the apertures 51 have been formed in the second electrode irradiating, with the laser L1, regions of the organic layers 40 that overlap the apertures 51. By irradiating the organic layers 40 with the laser L1, organic layer apertures 41 overlapping the apertures 51 can be formed in the organic layers 40.

In a case where the first color organic layers 40A and the second color organic layers 40B partially overlap each other as shown in FIG. 16 described above, the overlap portions 45 may be irradiated with the laser L1. This makes it possible to remove the overlap portions 45.

Figure 21:
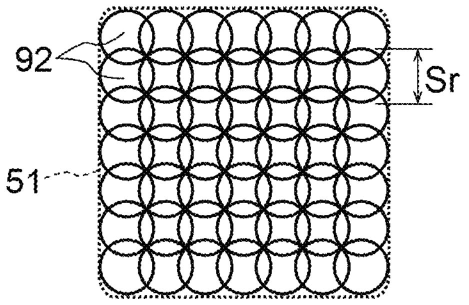
FIG. 21 is a plan view showing an example of a method for forming the apertures with a laser in the irradiating step of the manufacturing method for the electronic device.

FIG. 21 is a diagram showing an example of a method for forming the apertures with the laser L1 in the irradiating step. In FIG. 21, a region in which the apertures 51 are to be formed is indicated by dotted lines. As shown in FIG. 21, spots 92 produced by the laser L1 with which the second electrode 50 is irradiated may have spot diameters Sr that are smaller than the dimensions of the apertures 51. In this case, the region of the second electrodes 50 in which the apertures 51 are to be formed may be irradiated with the laser L1 by passing a light source of the laser L1 in the in-plane direction of the first surface 16 of the substrate 15 with the laser mask 90 interposed between the laser light source and the second electrode 50.

A usable example of the laser L1 is a YAG laser. The YAG laser may be generated by a light source containing an oscillating medium containing a crystal obtained by adding neodymium to yttrium, aluminum, and garnet. In this case, a laser with a wavelength of 1064 nm may be produced as a fundamental wave. Further, by passing the fundamental wave through a nonlinear optical crystal, a second harmonic with a wavelength of 532 nm may be produced. Further, by passing the fundamental wave and the second harmonic through the nonlinear optical crystal, a third harmonic with a wavelength of 355 nm may be produced. The laser with which the second electrode 50 is irradiated may include one, two, or three types of the fundamental wave, the second harmonic, and the third harmonic. As the laser L1, a laser other than the YAG laser may be used.

Figure 22:
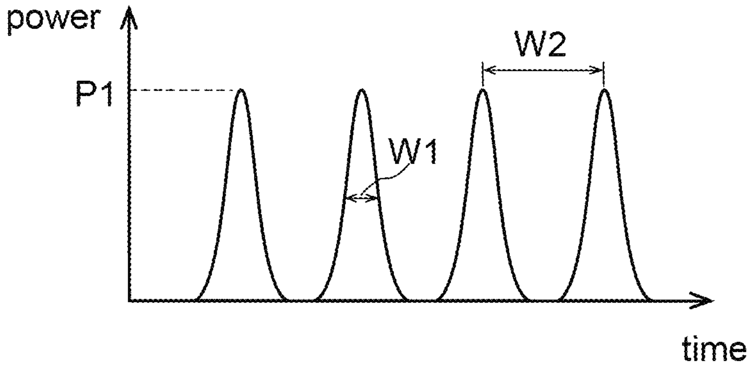
FIG. 22 is a diagram for explaining a pulsed laser that is used in the irradiating step of the manufacturing method for the electronic device.

In the irradiating step, the second electrode 50 may be intermittently irradiated with pulses of the laser L1. That is, as the laser L1 with which the second electrode 50 is irradiated, not continuous light but a laser L1 including pulses obtained by pulse oscillation may be used. This makes it easy to control heat that is generated in the second electrode 50 due to irradiation with the laser L1. FIG. 22 is a diagram showing an example of a pulsed laser L1. In FIG. 22, reference sign W1 denotes the pulse width of the laser L1, reference sign W2 the period of a pulse of the laser L1, and reference sign P1 the peak output of the laser L1. The pulse width W1 is the half-width of the peak of a pulse.

In the irradiating step, parameters such as the spot diameter Sr of the laser L1, the pulse width W1, the period W2 of a pulse, the peak output Si, and pulse energy may be appropriately adjusted. This makes it possible to adjust the extent to which the upper ends 53 of the side surfaces 52 of the second electrode 50 are raised. This also makes it possible to adjust the width u1 of each of the side surfaces 42 of the organic layers 40.

According to the present embodiment, the plurality of unit regions 57 of the second electrode 50 includes aperture regions 57A including the apertures 51 and non-aperture regions 57B not including the apertures 51. The inclusion of the aperture regions 57A by the unit regions 57 makes it easy for light to be transmitted through the electronic device 10. This makes it possible to increase the transmittance of the electronic device 10 in the second display area 102. Meanwhile, the inclusion of the non-aperture regions 57B by the unit regions 57 makes it possible to reduce the regularity of the arrangement of the apertures 51. This makes it possible to retain high-intensity diffracted light from falling on an optical component such as a sensor. This makes it possible, for example, to reduce blurring of an image that is generated by the sensor.

Various changes may be made to the foregoing embodiment. The following describes other embodiments with reference to the drawings as needed. In the following description and the drawings to which the following description refers, components that may be configured in the same manner as in the foregoing embodiment are assigned the same reference signs as those assigned to the corresponding components in the foregoing embodiment, and a repeated description is omitted. In a case where it is clear that a working effect that is brought about by the foregoing embodiment can also be brought about by another embodiment, a description of the working effect may be omitted.

An electronic device 10 according to another embodiment of the present disclosure and a manufacturing method for the electronic device 10 are described with reference to FIGS. 23 to 31.

FIGS. 23 to 26 are plan views showing examples of basic patterns that constitute the second display area 102 of the electronic device 10. In the present embodiment, the second display area 102 is divided into a plurality of basic patterns 110 such as those shown in FIGS. 23 to 26. As shown in FIGS. 23 to 26, each basic pattern 110 includes one first color electrode 30A or one second color electrode 30B and one third color electrode 30C. In each basic pattern 110, the first color electrode 30A or the second color electrode 30B and the third color electrode 30C may be adjacent to each other in the third direction D3. Note here that in each basic pattern 110, the first color electrode 30A and the second color electrode 30B are not distinguished from each other. That is, no matter whether each basic pattern 110 includes a first color electrode 30A or includes a second color electrode 30B instead of a first color electrode 30A, it is regarded as an identical basic pattern 110. The basic patterns 110 may include any two or more of a first basic pattern 110A such as that shown in FIG. 23, second basic patterns 110B and 110B' such as those shown in FIGS. 24 and 25, and a third basic pattern 110C such as that shown in FIG. 26.

Figure 23:
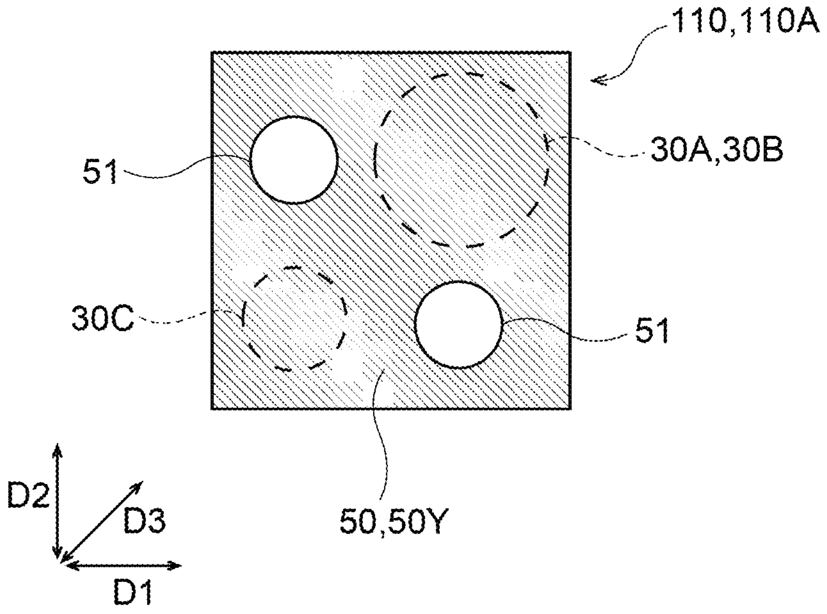
FIG. 23 is a plan view showing an example of a first basic pattern that constitutes the second display area of an electronic device according to an embodiment of the present disclosure.

As shown in FIG. 23, the first basic pattern 110A includes two apertures 51. In the first basic pattern 110A, an aperture 51 is placed in a position adjacent to the first color electrode 30A or the second color electrode 30B in the first direction D1, and an aperture 51 is placed in a position adjacent to the first color electrode 30A or the second color electrode 30B in the second direction D2. It can also be said that an aperture 51 is placed in a position adjacent to the third color electrode 30C in the first direction D1 and an aperture 51 is placed in a position adjacent to the third color electrode 30C in the second direction D2.

Figure 24:
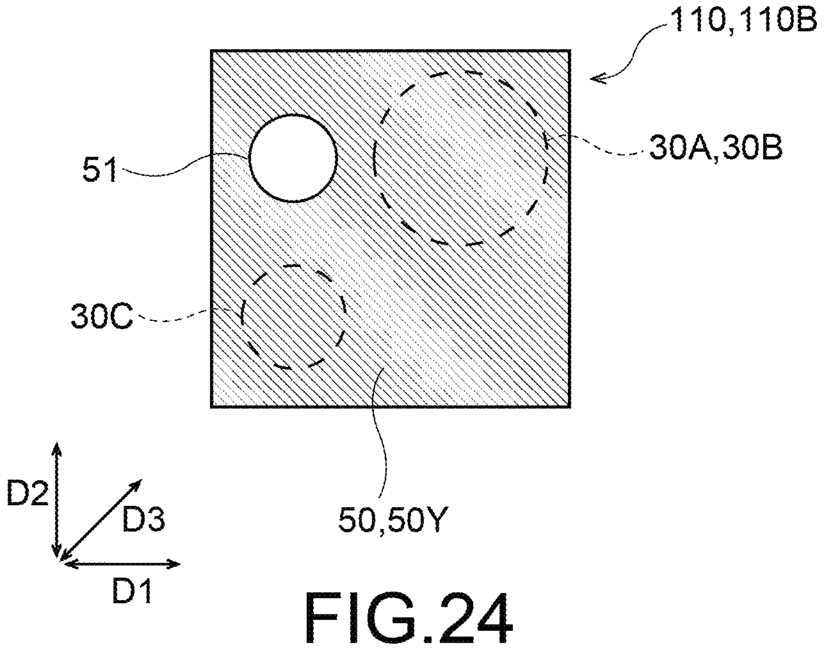
FIG. 24 is a plan view showing an example of a second basic pattern that constitutes the second display area of an electronic device according to an embodiment of the present disclosure.
Figure 25:
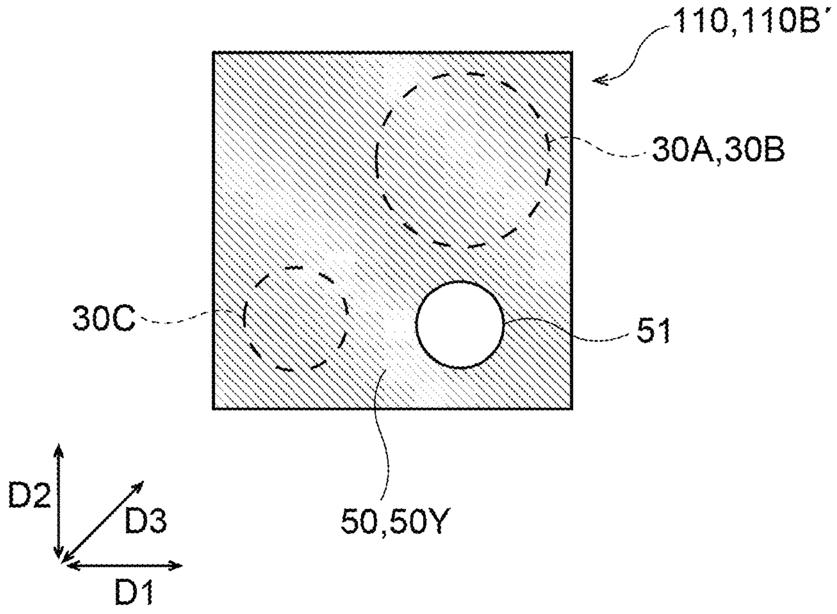
FIG. 25 is a plan view showing an example of a second basic pattern that constitutes the second display area of an electronic device according to an embodiment of the present disclosure.

As shown in FIGS. 24 and 25, the second basic patterns 110B and 110B' each include one aperture 51. In the second basic pattern 110B shown in FIG. 24, an aperture 51 is placed in a position adjacent to the first color electrode 30A or the second color electrode 30B in the first direction D1. It can also be said that an aperture 51 is placed in a position adjacent to the third color electrode in the second direction D2. In the second basic pattern 110B' shown in FIG. 25, an aperture 51 is placed in a position adjacent to the first color electrode 30A or the second color electrode 30B in the second direction D2. It can also be said that an aperture 51 is placed in a position adjacent to the third color electrode 30C in the first direction D1.

Figure 26:
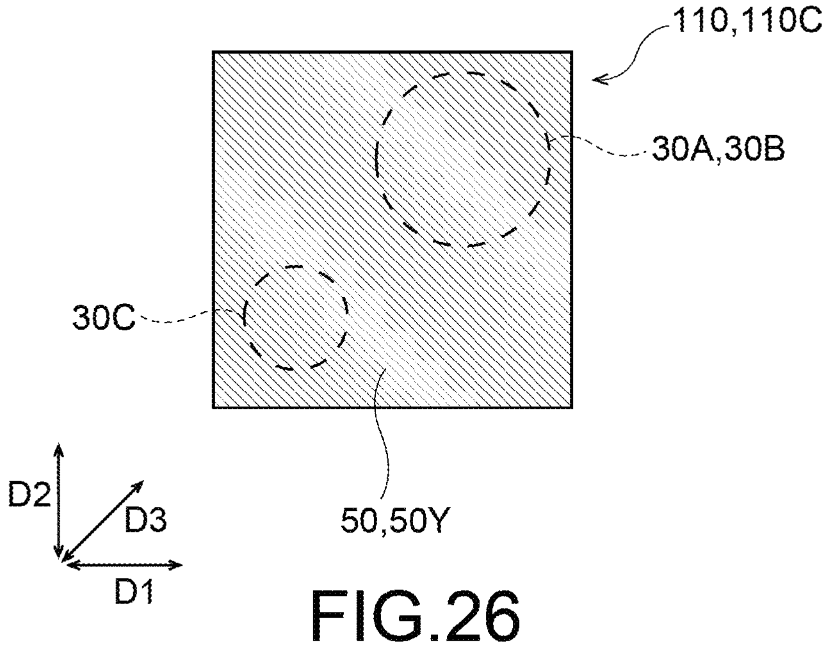
FIG. 26 is a plan view showing an example of a third basic pattern that constitutes the second display area of an electronic device according to an embodiment of the present disclosure.

As shown in FIG. 26, the third basic pattern 1100 includes no aperture 51. That is, in the third basic pattern 110C, no aperture 51 is placed.

Figure 27:
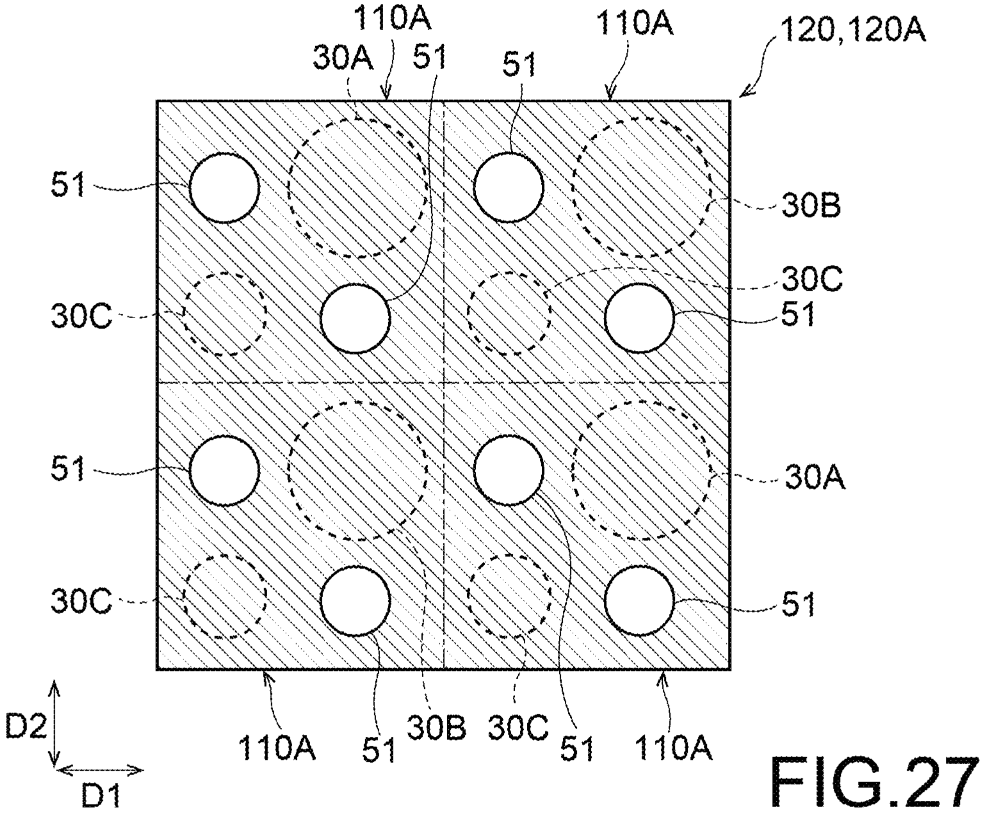
FIG. 27 is a plan view showing an example of a block pattern that constitutes the second display area of an electronic device according to an embodiment of the present disclosure.
Figure 28:
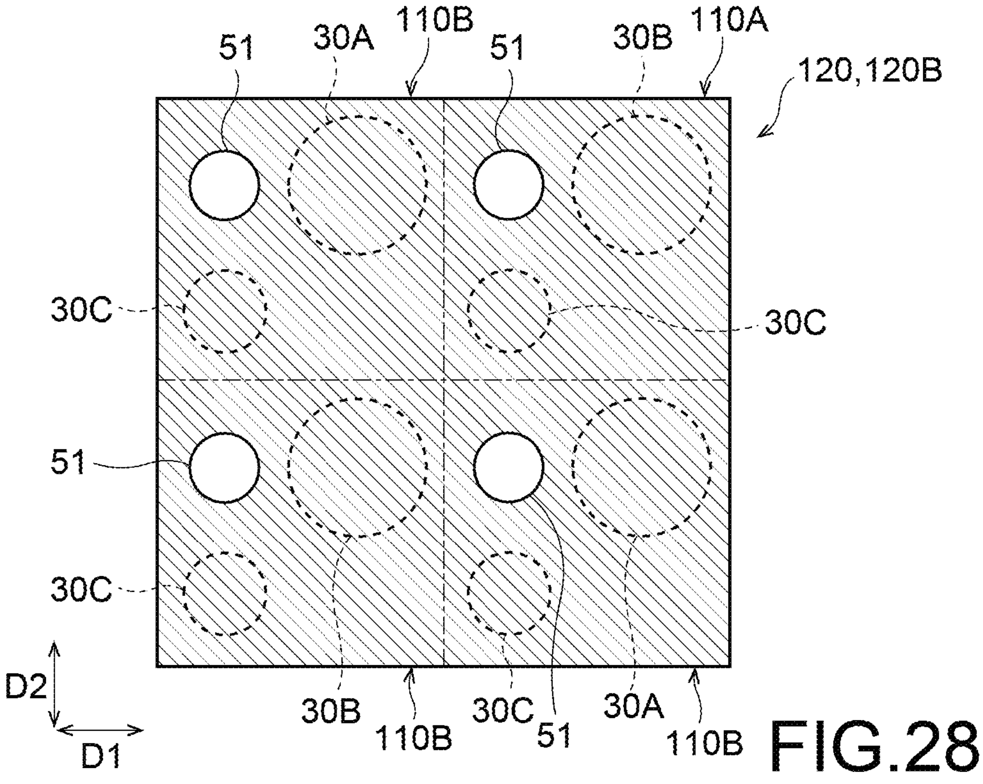
FIG. 28 is a plan view showing an example of a block pattern that constitutes the second display area of an electronic device according to an embodiment of the present disclosure.
Figure 29:
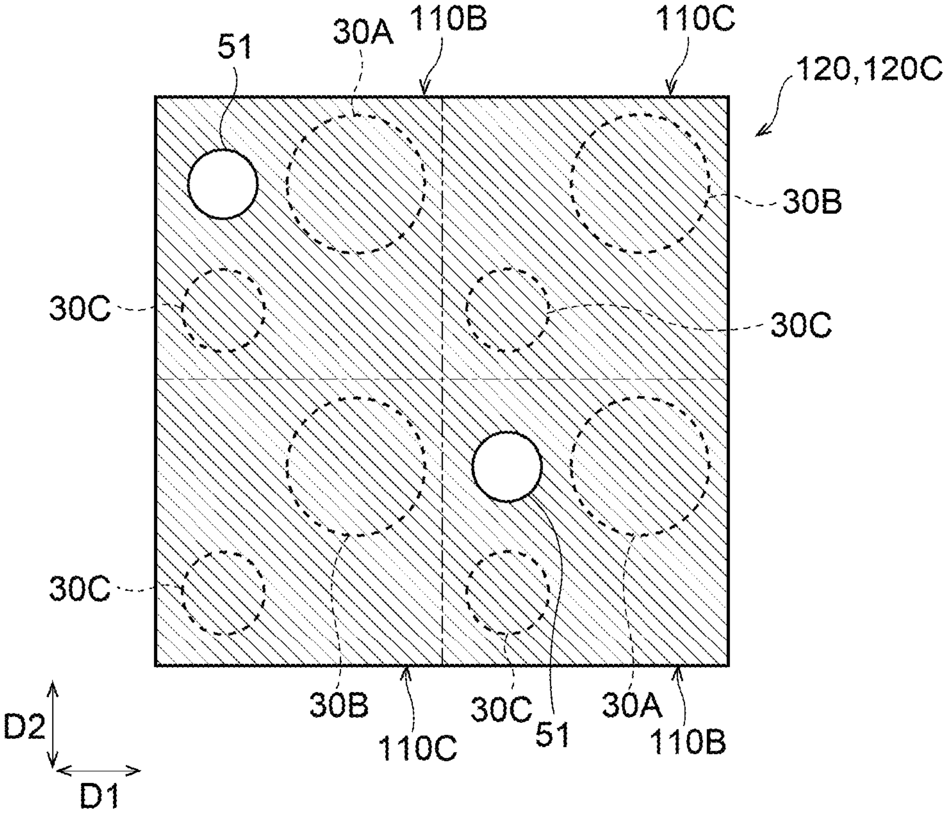
FIG. 29 is a plan view showing an example of a block pattern that constitutes the second display area of an electronic device according to an embodiment of the present disclosure.

The second display area 102 may be constituted by any two or more of the first basic pattern 110A, the second basic patterns 110B and 110B', and the third basic pattern 1100. In this case, some basic patterns 110 may be combined to form a plurality of block patterns 120, and the second display area 102 may be constituted by the plurality of block patterns 120. FIGS. 27 to 29 are plan views showing examples of block patterns that constitute the second display area 102 of the electronic device 10. The block patterns 120 may include an A pattern 120A such as that shown in FIG. 27, a B pattern 120B such as that shown in FIG. 28, and a C pattern 120C such as that shown in FIG. 29.

As shown in FIG. 27, the A pattern 120A may be constituted by four first basic patterns 110A arranged along the first direction D1 and the second direction D2. As shown in FIG. 28, the B pattern 120B may be constituted by four second basic patterns 110B arranged along the first direction D1 and the second direction D2. As shown in FIG. 29, the C pattern 120C may be constituted by two second basic patterns 110B and two third basic patterns 110B arranged along the first direction D1 and the second direction D2 so that the second basic patterns 110B and the third basic patterns 110C are adjacent to each other in the first direction D1 and the second direction D2.

Figure 30:
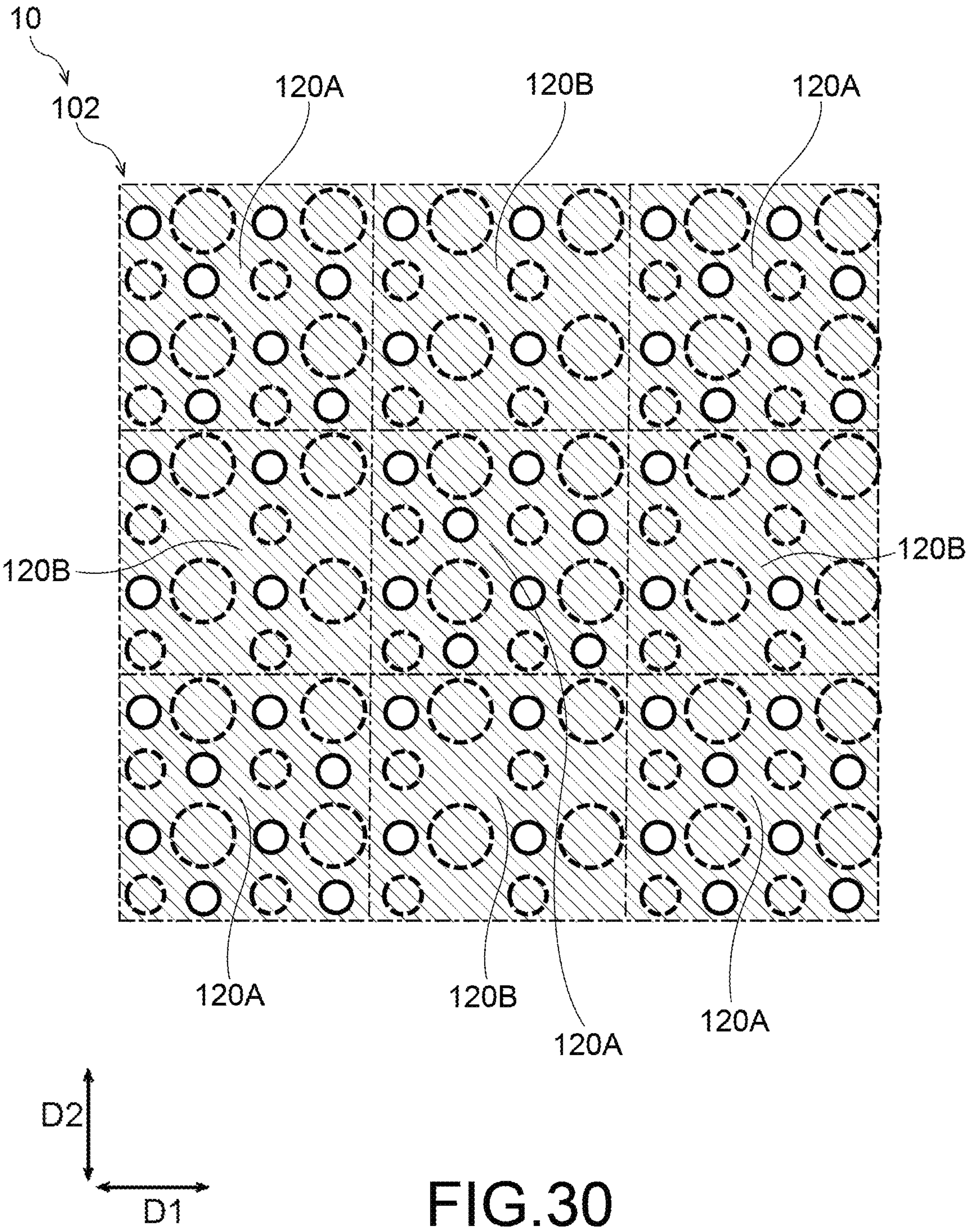
FIG. 30 is a plan view showing a second display area of an electronic device according to an embodiment of the present disclosure.

FIG. 30 is a plan view showing an example of the second display area 102 of the electronic device 10 according to the present embodiment. The second display area 102 shown in FIG. 30 is constituted by A patterns 120A and B patterns 120B. When symbol "A" represents an A pattern 120A and symbol "B" represents a B pattern 120B, the A patterns 120A and the B patterns 120B in the second display area 102 shown in FIG. 30 are arrayed as follows:

••ABA••

••BAB••

••ABA••

Thus, in the second display area 102 shown in FIG. 30, the A patterns 120A and the B patterns 120B are regularly arranged along the first direction D1 and the second direction D2. More specifically, the A patterns 120A and the B patterns 120B are alternately arranged along the first direction D1 and alternately arranged along the second direction D2. Since the A patterns 120A are constituted by first basic patterns 110A and the B patterns 120B are constituted by second basic patterns 110B, it can also be said that in the second display area 102, the first basic patterns 110A and the second basic patterns 110B are regularly arranged along the first direction D1 and the second direction D2.

Figure 31:
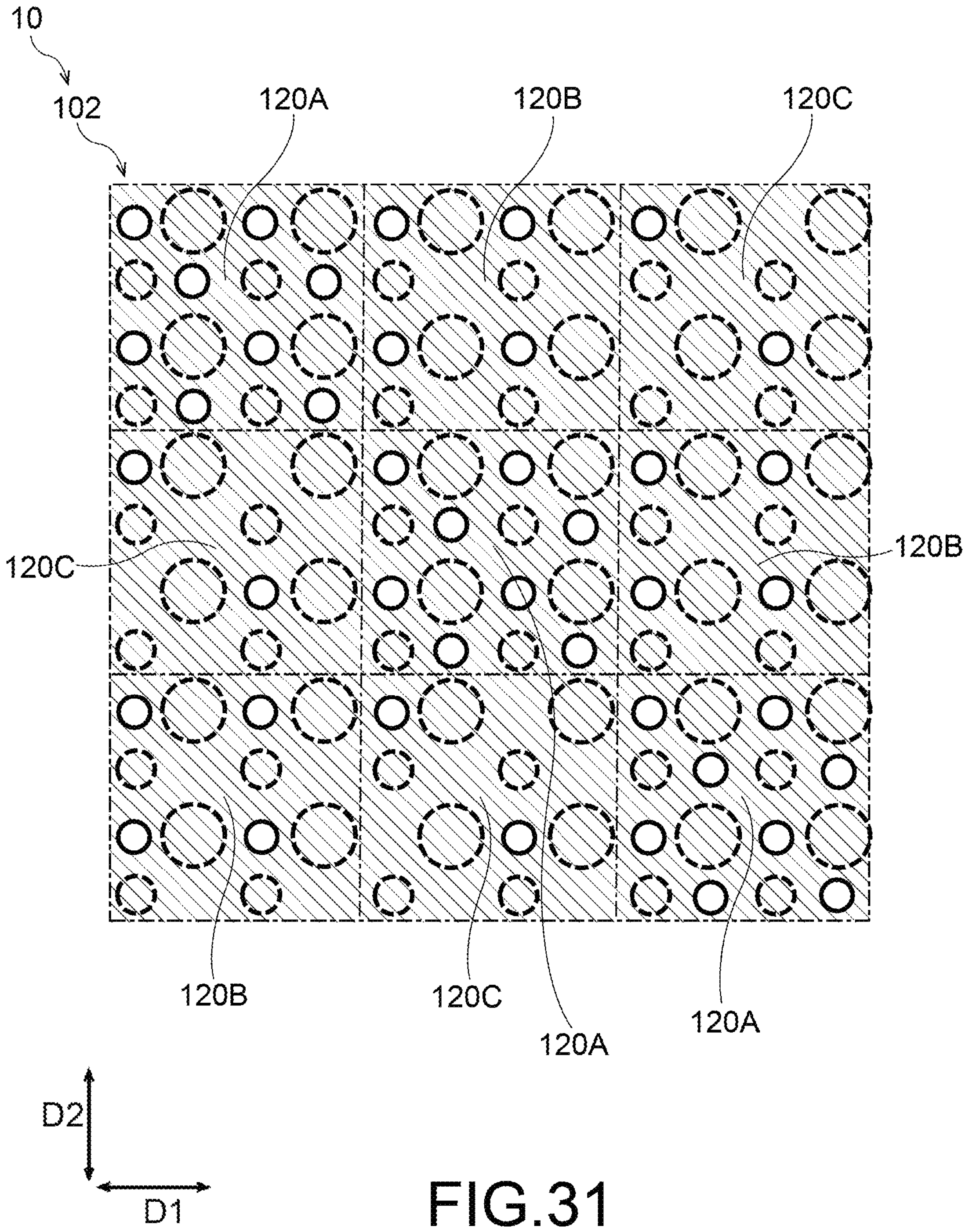
FIG. 31 is a plan view showing a second display area of an electronic device according to an embodiment of the present disclosure.

FIG. 31 is a plan view showing another example of the second display area 102 of the electronic device 10 according to the present embodiment. The second display area 102 shown in FIG. 31 is constituted by A patterns 120A, B patterns 120B, and C patterns 120C. When symbol "A" represents an A pattern 120A, symbol "B" represents a B pattern 120B, and symbol "C" represents a C pattern 120C, the A patterns 120A, the B patterns 120B, and the C patterns 120C in the second display area 102 shown in FIG. 31 are arrayed as follows:

••ABC••
••CAB••
••BCA••

Thus, in the second display area 102 shown in FIG. 31, the A patterns 120A, the B patterns 120B, and the C patterns 1200 are regularly arranged along the first direction D1 and the second direction D2. More specifically, the A patterns 120A, the B patterns 120B, and the C patterns 120C are arranged in sequence along the first direction D1 and arranged in sequence along the second direction D2. Since the A patterns 120A are constituted by first basic patterns 110A, the B patterns 120B are constituted by second basic patterns 110B, and the C patterns are constituted by second basic patterns 110B and third basic patterns 110C, it can also be said that in the second display area 102, the first basic patterns 110A, the second basic patterns 110B, and the third basic patterns 110C are regularly arranged along the first direction D1 and the second direction D2.

In addition to the aforementioned examples, the second display area 102 may be constituted by any combination of basic patterns 110. For example, the second display area 102 may be constituted by A patterns 120A and C patterns 120C. That is, in the second display area 102, the A patterns 120A and the C patterns 120C may be regularly arranged along the first direction D1 and the second direction D2. In this case, since the A patterns 120A are constituted by first basic patterns 110A and the C patterns 120C are constituted by second basic patterns 110B and third basic patterns 110C, it can be said that in the second display area 102, the first basic patterns 110A, the second basic patterns 110B, and the third basic patterns 110C are regularly arranged along the first direction D1 and the second direction D2. Further, the second display area 102 may be constituted by B patterns 120B. That is, in the second display area 102, the B patterns 120B may be arranged along the first direction D1 and the second direction D2 (see FIG. 65). In this case, since the B patterns 120B are constituted by second basic patterns 110B, it can be said that in the second display area 102, the second basic patterns 110B are arranged along the first direction D1 and the second direction D2.

As is the case with the foregoing embodiment, the present embodiment too makes it possible to reduce the regularity of the arrangement of the apertures 51. This makes it possible to restrain high-intensity diffracted light from falling on an optical component such as a sensor. This makes it possible, for example, to reduce blurring of an image that is generated by the sensor.

Further, the present embodiment can make it easy to determine the arrangement of the aperture regions 57A and the non-aperture regions 57B in the aperture forming step at the time of manufacture of the electronic device 10. That is, regularly arraying the basic patterns 110 makes it unnecessary to randomly determine the arrangement of the apertures 51, making it possible to efficiently determine the arrangement of the apertures 51. This makes manufacturing design of the electronic device 10 easy.

An electronic device 10 according to another embodiment of the present disclosure and a manufacturing method for the electronic device 10 are described with reference to FIG. 32.

Figure 32:
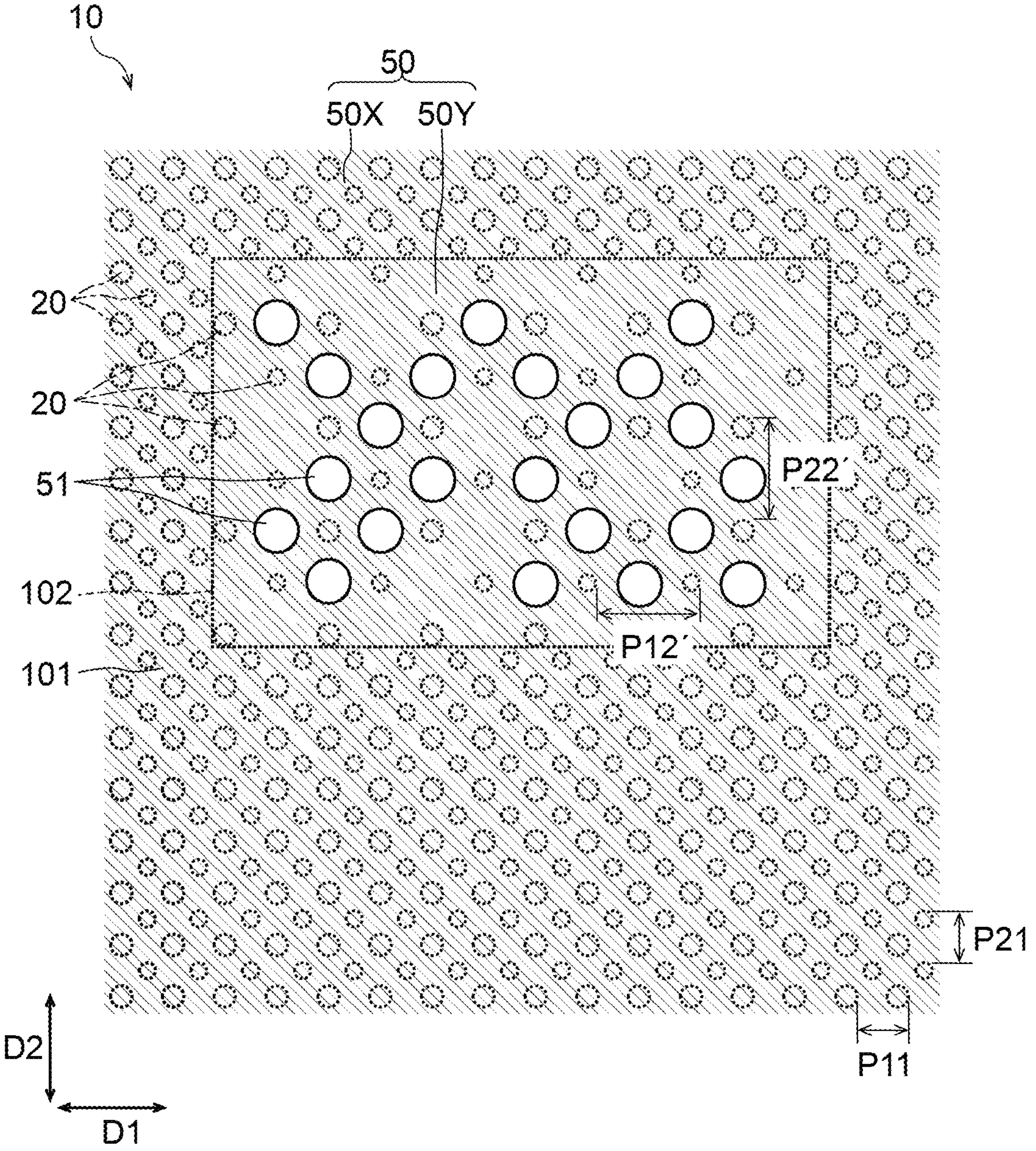
FIG. 32 is a plan view showing a first display area and a second display area of an electronic device according to an embodiment of the present disclosure.

FIG. 32 is a plan view showing an example of the first display area 101 and an example of the second display area 102 of the electronic device 10 according to the present embodiment. The plurality of elements 20 located in the first display area 101 may be arranged at eleventh pitches P11 along the first direction D1 and arranged at twenty-first pitches P21 along the second direction D2. The plurality of elements 20 located in the first display area 101 may be arranged at twelfth pitches P12' along the first direction D1 and arranged at twenty-second pitches P22' along the second direction D2. The twelfth pitches P12' may be greater than the eleventh pitches P11. The twenty-second pitches P22' may be greater than the twenty-first pitches P21.

P12'/P11, which is the ratio of a twelfth pitch P12' to an eleventh pitch P11, may for example be higher than or equal to 1.0, higher than or equal to 1.3, or higher than or equal to 1.5. P12'/P11 may for example be lower than or equal to 2.0, lower than or equal to 3.0, or lower than or equal to 4.0. P12'/P11 may fall within a range defined by a first group consisting of 1.0, 1.3, and 1.5 and/or a second group consisting of 2.0, 3.0, and 4.0. P12'/P11 may fall within a range defined by a combination of any one of the values included in the aforementioned first group and any one of the values included in the aforementioned second group. P12/P11 may fall within a range defined by a combination of any two of the values included in the aforementioned first group. P12'/P11 may fall within a range defined by a combination of any two of the values included in the aforementioned second group. P12'/P11 may for example be higher than or equal to 1.0 and lower than or equal to 4.0, higher than or equal to 1.0 and lower than or equal to 3.0, higher than or equal to 1.0 and lower than or equal to 2.0, higher than or equal to 1.0 and lower than or equal to 1.5, higher than or equal to 1.0 and lower than or equal to 1.3, higher than or equal to 1.3 and lower than or equal to 4.0, higher than or equal to 1.3 and lower than or equal to 3.0, higher than or equal to 1.3 and lower than or equal to 2.0, higher than or equal to 1.3 and lower than or equal to 1.5, higher than or equal to 1.5 and lower than or equal to 4.0, higher than or equal to 1.5 and lower than or equal to 3.0, higher than or equal to 1.5 and lower than or equal to 2.0, higher than or equal to 2.0 and lower than or equal to 4.0, higher than or equal to 2.0 and lower than or equal to 3.0, or higher than or equal to 3.0 and lower than or equal to 4.0.

As the range of numerical values of P22'/P21, which is the ratio of a twenty-second pitch P22' to a twenty-first pitch P21, the aforementioned range of numerical values of P12'/P11 may be employed.

An electronic device 10 according to another embodiment of the present disclosure and a manufacturing method for the electronic device 10 are described with reference to FIGS. 33 to 40.

Figure 33:
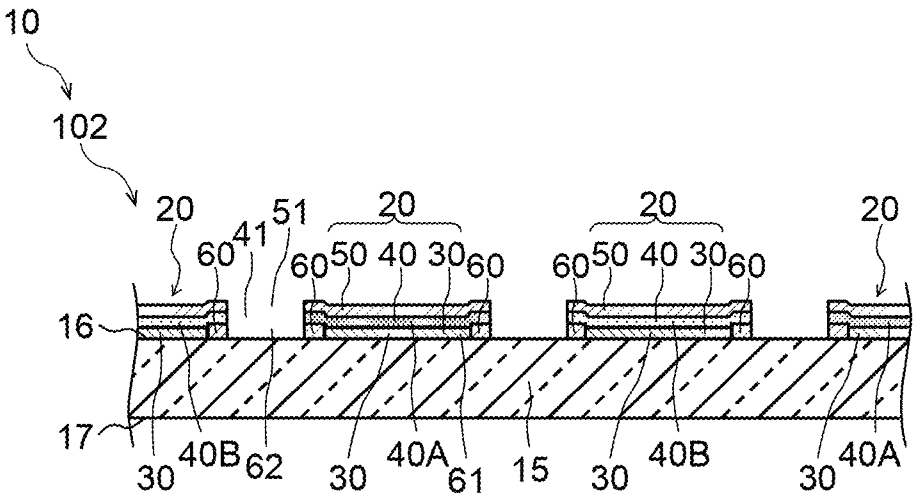
FIG. 33 is a cross-sectional view showing a second display area of an electronic device according to an embodiment of the present disclosure.
Figure 34:
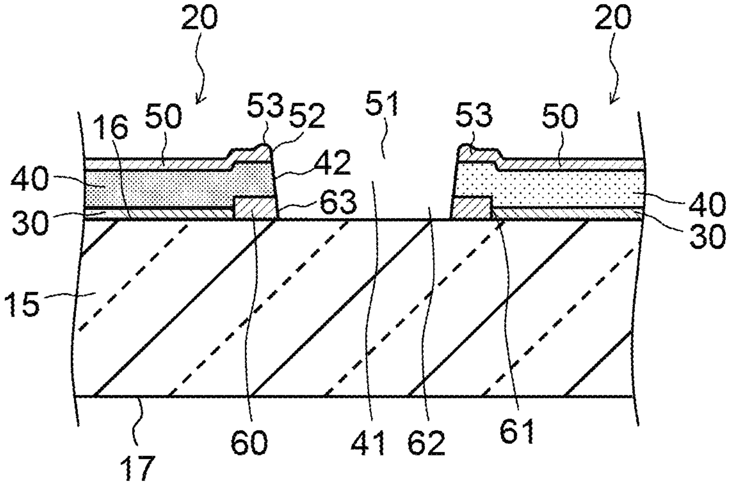
FIG. 34 is a cross-sectional view showing a partial enlargement of FIG. 33.

FIG. 33 is a cross-sectional view showing an example of the second display area 102 of the electronic device 10 according to the present embodiment. FIG. 34 is a cross-sectional view showing a partial enlargement of FIG. 33. As shown in FIGS. 33 and 34, the electronic device 10 may include an insulating layer 60. The insulating layer 60 may be located between the substrate 15 and the organic layers 40 in the direction normal to the substrate 15.

The insulating layer 60 may include insulating layer first apertures 61. The first electrodes 30 may be located in the insulating layer first apertures 61. Although not illustrated, parts of the first electrodes 30 may be located between the insulating layer 60 and the first surface 16 of the substrate 15.

Further, the insulating layer 60 may include insulating layer second apertures 62. The insulating layer second apertures 62 may overlap the apertures 51 of the second electrode 50 in planar view. The insulating layer second apertures 62 may also overlap the organic layer apertures 41 of the organic layers 40. The insulating layer 60 includes sides surfaces 63 facing the insulating layer second apertures 62. As shown in FIG. 34, upper ends of the side surfaces 63 of the organic layers 60 may be in contact with lower ends of the side surfaces 42 of the organic layers 40. Such a relationship between the side surfaces 63 and the side surfaces 42 can be achieved in a case where the organic layer apertures 41 and the insulating layer second apertures 62 are formed by laser processing.

The insulating layer 60 contains a material having insulation properties. For example, the insulating layer 60 may contain a resin material such as polyimide resin.

Although not illustrated, in the insulating layer second apertures 62, a layer having insulation properties and differing from the insulating layer 60 may be located on the first surface 16 of the substrate 15. This makes it possible to restrain two of the first electrodes 30 adjacent to each other across an insulating layer aperture 62 in planar view from being electrically connected to each other.

Figure 35:
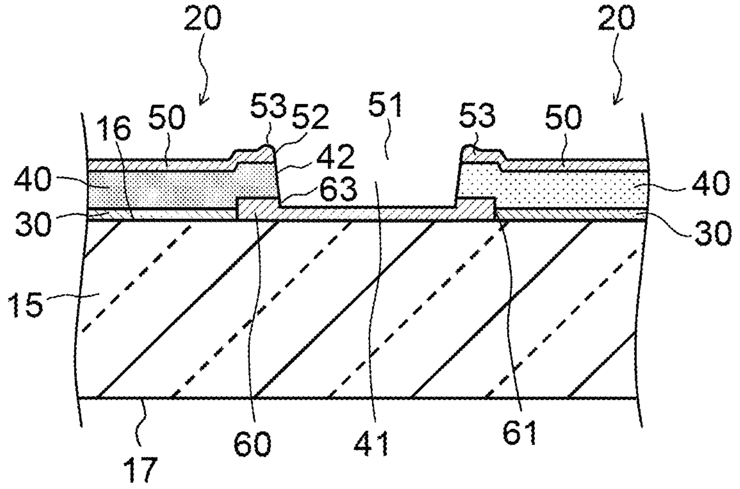
FIG. 35 shows a modification of the second display area shown in FIG. 34.

FIG. 35 is a cross-sectional view showing another example of the second display area 102 of the electronic device 10 according to the present embodiment. As shown in FIG. 35, the insulating layer 60 may not include the insulating layer apertures 62. That is, in the organic layer apertures 41, the insulating layer 60 may be located on the first surface 16 of the substrate 15. The thickness of a portion of the insulating layer 60 located in an organic layer aperture 41 in planar view may be smaller than the thickness of a portion of the insulating layer 60 that overlaps an organic layer 40 in planar view. Such an insulating layer 60 may be obtained by partially removing the insulating layer 60 in a direction parallel with the thickness of the insulating layer 60 in the after-mentioned irradiating step. Leaving the insulating layer 60 in the organic layer apertures 41 makes it possible to restrain two of the first electrodes 30 adjacent to each other across an organic layer aperture 41 in planar view from being electrically connected to each other.

In a manufacturing method for the electronic device 10 shown in FIGS. 34 and 35, first, a substrate preparing step of preparing a substrate 15 with first electrodes 30 formed thereon is executed, as in the case of the foregoing embodiment shown in FIGS. 10 and 11.

Figure 36:
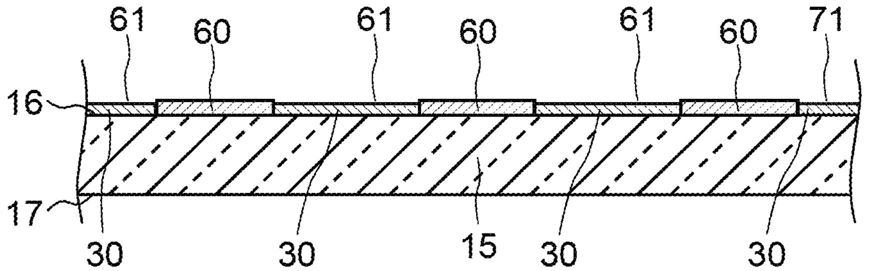
FIG. 36 is a cross-sectional view for explaining a substrate preparing step of a manufacturing method for the electronic device.
Figure 37:
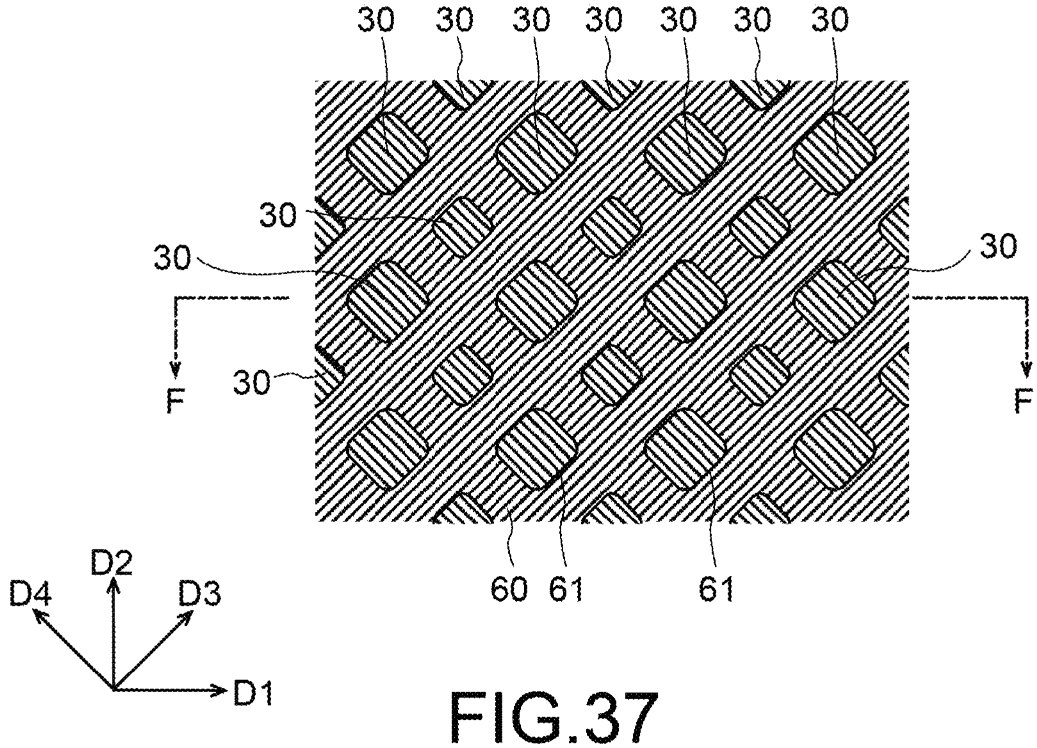
FIG. 37 is a plan view corresponding to FIG. 36.

Then, an insulating layer forming step of forming, on the substrate 15, an insulating layer 60 having insulating layer first apertures 61 formed therein. FIG. 36 is a cross-sectional view showing a state in which the first electrodes 30 and the insulating layer 60 are formed on the substrate 15. FIG. 37 is a plan view corresponding to FIG. 36. FIG. 36 is equivalent to a cross-sectional view taken along line F-F in FIG. 37.

In the insulating layer forming step, for example, first, the insulating layer 60 is formed all over the first surface 16 of the substrate 15 by applying a solution containing the material of the insulating layer 60 onto the first surface 16 and drying the solution. Then, the insulating layer first apertures 61 are formed in the insulating layer 60 by exposing and developing the insulating layer 60. In this way, the insulating layer 60 can be formed between the first electrodes 30.

Figure 38:
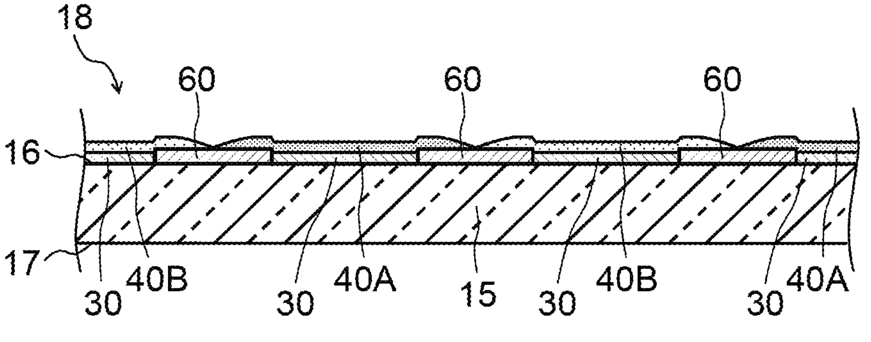
FIG. 38 is a cross-sectional view for explaining an organic layer forming step of the manufacturing method for the electronic device.

Next, as shown in FIG. 38, an organic layer forming step of forming organic layers 40 on the first electrodes 30 is executed. FIG. 38 is a cross-sectional view showing a state in which the first electrodes 30, the insulating layer 60, and the organic layers 40 are formed on the substrate 15. The organic layers 40 may be formed so as to overlap the first electrodes 30 and the insulating layer in planar view. In this way, a layered product 18 including a substrate 15, a plurality of first electrodes 30 located on the substrate 15, an insulating layer 60 located between the first electrodes 30, and organic layers 40 located on the first electrodes 30 and the insulating layer can be prepared.

Figure 39:
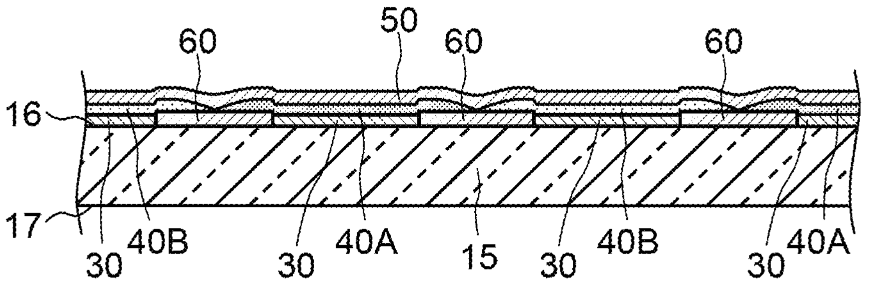
FIG. 39 is a cross-sectional view for explaining a second electrode forming step of the manufacturing method for the electronic device.

Then, as shown in FIG. 39, a second electrode forming step of forming a second electrode 50 on the organic layers 40 is executed. FIG. 39 is a cross-sectional view showing a state in which the second electrode 50 is formed on the organic layers 40. In the second electrode forming step, as in the case of the foregoing embodiment shown in FIGS. 17 and 18, the second electrode 50 is formed on the organic layers 40 so as to overlap a plurality of the first electrodes 30 in planar view.

Figure 40:
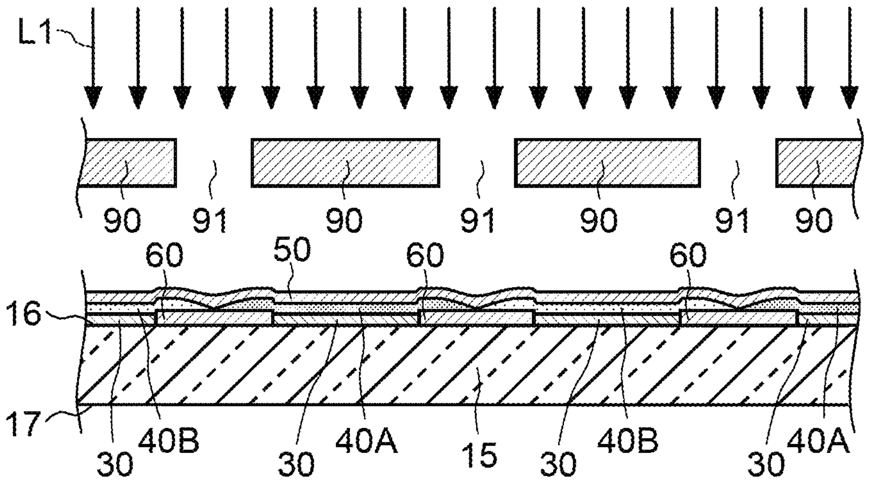
FIG. 40 is a cross-sectional view for explaining an irradiating step of the manufacturing method for the electronic device.

After that, an aperture forming step of forming a plurality of apertures 51 in such positions in the second electrode 50 that the plurality of apertures 51 do not overlap the first electrodes 30 in planar view is executed. The aperture forming step may include a removing step of forming the apertures 51 by removing part of the second electrode 50. In the removing step, the apertures 51 may be formed by partially removing a region of the second electrode 50 that overlaps the insulating layer 60 in planar view. The removing step may include an irradiating step of irradiating the second electrode 50 with a laser L1. FIG. 40 is a cross-sectional view showing an example of the irradiating step. As shown in FIG. 40, the region of the second electrode 50 that overlaps the insulating layer 60 in planar view may be irradiated with the laser L1. By irradiating the second electrode 50 with the laser L1, the apertures 51 can be formed in the second electrode 50 as shown in FIGS. 34 and 35 described above.

The irradiating step may include a step of, after the apertures 51 have been formed in the second electrode irradiating, with the laser L1, regions of the organic layers 40 that overlap the apertures 51. By irradiating the organic layers 40 with the laser L1, organic layer apertures 41 overlapping the apertures 51 can be formed in the organic layers 40 as shown in FIGS. 34 and 35 described above.

Further, the irradiating step may include a step of, after the organic layer apertures 41 have been formed in the organic layers 40, irradiating, with the laser L1, regions of the insulating layer 60 that overlap the organic layer apertures 41. By irradiating the insulating layer 60 with the laser L1, insulating layer second apertures 62 overlapping the apertures 51 and the organic layer apertures 41 can be formed in the insulating layer 60 as shown in FIG. 34 described above. Further, in the step of irradiating, with the laser L1, the regions of the insulating layer 60 that overlap the organic layer apertures 41, the insulating layer 60 may be partially removed in a direction parallel with the thickness of the insulating layer 60. By the insulating layer 60 being partially removed in a direction parallel with the thickness of the insulating layer 60, the insulating layer 60 can be formed as shown in FIG. 35 described above.

An electronic device 10 according to another embodiment of the present disclosure and a manufacturing method for the electronic device 10 are described with reference to FIGS. 41 and 42.

Figure 41:
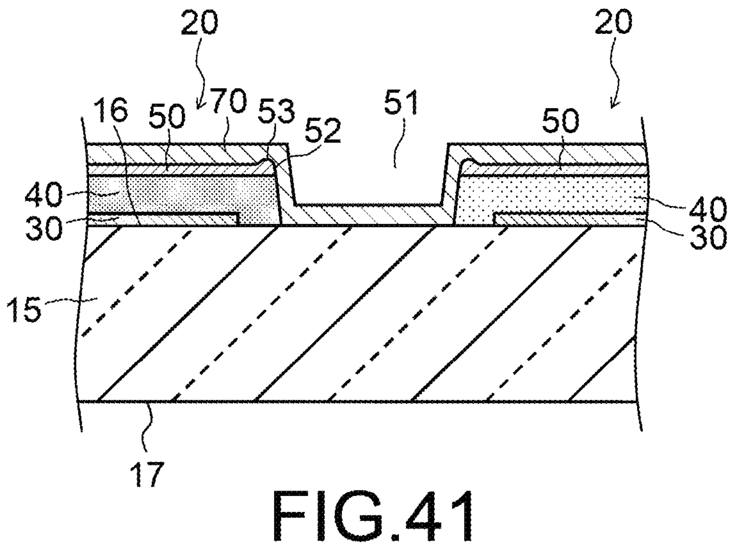
FIG. 41 is a cross-sectional view showing a second display area of an electronic device according to an embodiment of the present disclosure.

FIG. 41 is a cross-sectional view showing an example of the electronic device 10 according to the present embodiment. As shown in FIG. 41, the electronic device 10 may include a protective layer 70 overlapping the second electrode 50 and the apertures 51 in planar view.

The protective layer 70 contains a material having insulation properties and optical transparency. The material of the protective layer 70 may be an organic material, or may be an inorganic material. For example, the protective layer 70 may contain a resin material such as polyimide resin, acrylic resin, or epoxy resin. For example, the protective layer 70 may contain an inorganic material. The inorganic material may be an inorganic nitride such as silicon nitride, or may be an inorganic oxide such as silicon oxide or aluminum oxide. The protective layer 70 may include two or more layers composed of these materials and joined on each other in the direction normal to the substrate 15.

In a case where, as shown in FIG. 41, upper ends 53 of the side surfaces 52 of the second electrode 52 are raised above surrounding parts of the second electrode 50, the upper ends 53 of the side surfaces 52 of the second electrode 52 can penetrate into the protective layer 70. This leads to an increase in area of contact between the second electrode 50 and the protective layer 70. This makes it possible to restrain the protective layer 70 from coming off the second electrode 50.

As shown in FIG. 41, the protective layer 70 may cover side surfaces of the organic layers 40. In this case, the protective layer 70 can restrain water vapor, oxygen, or other substances in the atmosphere from penetrating into the organic layers 40. This makes it possible to reduce deterioration of the organic layers 40.

The protective layer 70 may spread along cross-sectional shapes of the organic layers 40. For example, as shown in FIG. 41, a surface of a portion of the protective layer 70 that overlaps an aperture 51 may be located between a surface of a portion of the second electrode 50 that overlaps a first electrode 30 and the first surface 16 of the substrate 15 in the direction normal to the substrate 15.

The protective layer 70 may have a thickness that is greater than the total of the thicknesses of a first electrode 30, an organic layer 40, and the second electrode 50. FIG. 42 is a cross-sectional view showing another example of the electronic device 10 according to the present embodiment. As shown in FIG. 42, a surface of a portion of the second electrode 50 that overlaps a first electrode 30 may be located between a surface of a portion of the protective layer 70 that overlaps an aperture 51 and the first surface 16 of the substrate 15 in the direction normal to the substrate 15.

Figure 42:
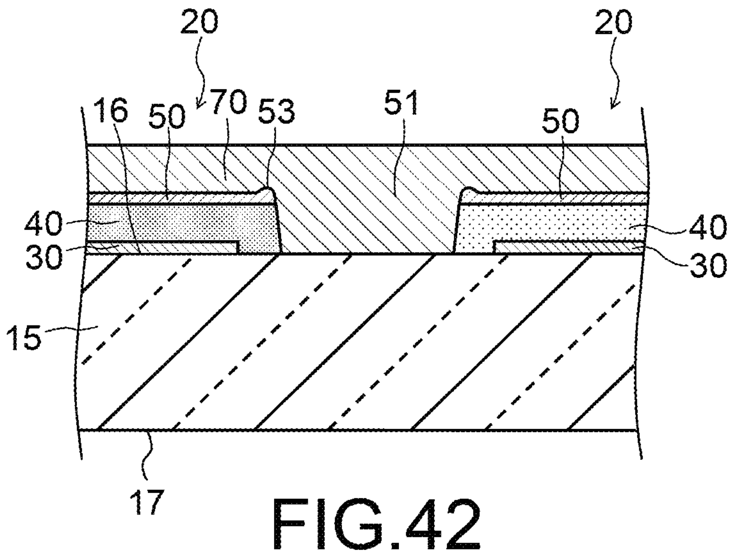
FIG. 42 shows a modification of the second display area shown in FIG. 41.

A manufacturing method for the electronic device 10 shown in FIGS. 41 and 42 may include a protective layer forming step of forming the protective layer 70. The protective layer forming step may be executed after the aperture forming step. The protective layer forming step may include a step of applying a liquid containing the material of the protective layer 70 to the second electrode and the apertures 51. The protective layer 70 may be formed by another method.

An electronic device 10 according to another embodiment of the present disclosure and a manufacturing method for the electronic device 10 are described with reference to FIGS. 43 to 46.

The foregoing embodiment has illustrated an example in which the apertures 51 are formed by removing portions of the second electrode 50 located on the organic layers 40. The present embodiment describes an example in which the apertures 51 are formed by removing a region of the second electrode 50 that does not overlap the organic layers 40 in planar view.

Figure 43:
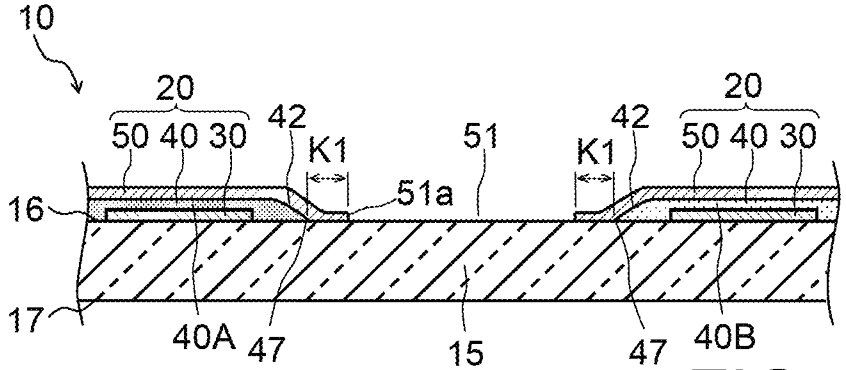
FIG. 43 is a cross-sectional view showing a second display area of an electronic device according to an embodiment of the present disclosure.

FIG. 43 is a cross-sectional view showing an example of the electronic device 10 according to the present embodiment. As shown in FIG. 43, the organic layers 40 may not face the apertures 51 of the second electrode 50, and ends 47 of the organic layers 40 may overlap the second electrode 50.

In a manufacturing method for the electronic device 10 shown in FIG. 43, first, a substrate preparing step of preparing a substrate 15 with first electrodes 30 formed thereon is executed, as in the case of the foregoing embodiment shown in FIGS. 10 and 11.

Figure 44:
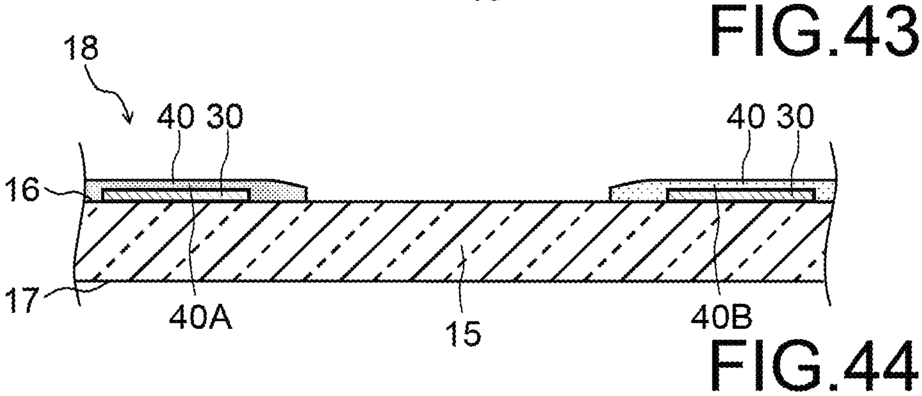
FIG. 44 is a cross-sectional view for explaining an organic layer forming step of a manufacturing method for the electronic device.

Then, as shown in FIG. 44, an organic layer forming step of forming organic layers 40 on the first electrodes 30 is executed. FIG. 44 is a cross-sectional view showing a state in which the first electrodes 30 and the organic layers 40 are formed on the substrate 15. As shown in FIG. 44, a region in which no organic layer 40 is present may be interposed between adjacent two of the organic layers 40 in planar view.

Figure 45:
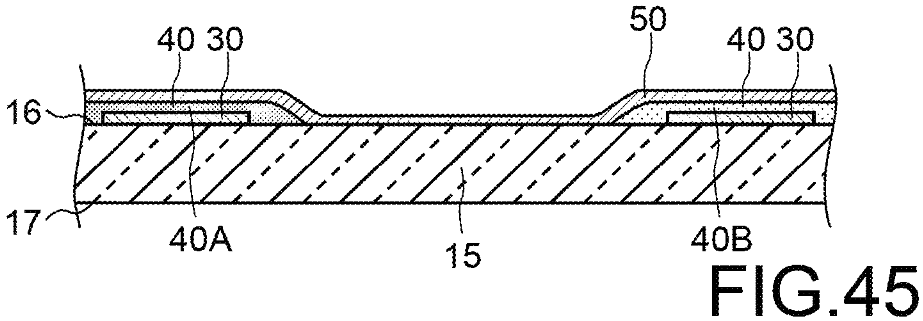
FIG. 45 is a cross-sectional view for explaining a second electrode forming step of the manufacturing method for the electronic device.

Next, as shown in FIG. 45, a second electrode forming step of forming a second electrode 50 on the organic layers 40 is executed. FIG. 45 is a cross-sectional view showing a state in which the second electrode 50 is formed on the organic layers 40. In the second electrode forming step, the second electrode 50 is formed on the organic layers 40 and on the surface 16 of the substrate 15 so as to overlap a plurality of the first electrodes 30 in planar view.

Figure 46:
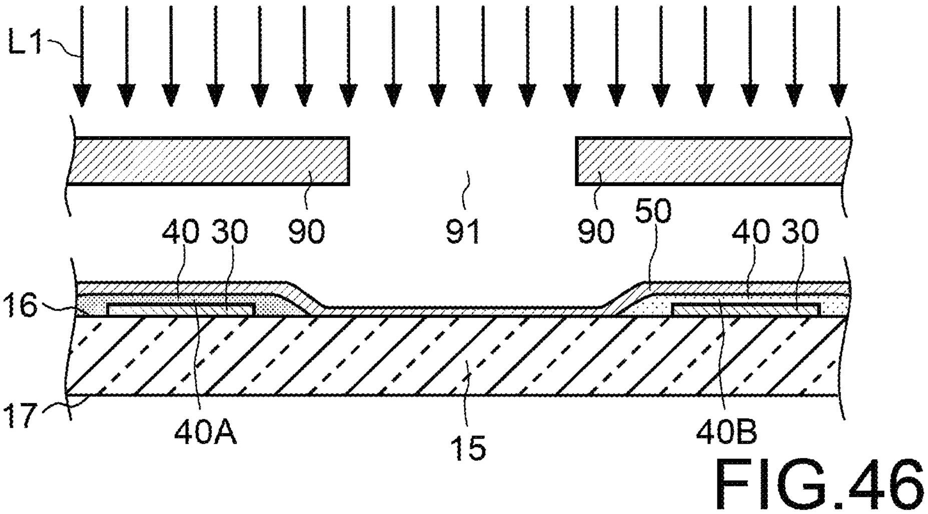
FIG. 46 is a cross-sectional view for explaining an irradiating step of the manufacturing method for the electronic device.

After that, an aperture forming step of forming a plurality of apertures 51 in such positions in the second electrode 50 that the plurality of apertures 51 do not overlap the first electrodes 30 in planar view is executed. The aperture forming step may include a removing step of forming the apertures 51 by removing part of the second electrode 50. In the removing step, the apertures 51 may be formed by partially removing regions of the second electrode that do not overlap the organic layers 40 in planar view. The removing step may include an irradiating step of irradiating the second electrode 50 with a laser L1. FIG. 46 is a cross-sectional view showing an example of the irradiating step. As shown in FIG. 46, the regions of the second electrode 50 that do not overlap the organic layers in planar view may be irradiated with the laser L1. By irradiating the second electrode 50 with the laser L1, the apertures 51 can be formed in the second electrode 50 as shown in FIG. 43 described above.

In FIG. 43, reference sign K1 denotes the distance in planar view from the outer edge 51*a* of each of the apertures 51 to the corresponding one of the ends 47 of the organic layers 40. The distance K1 may for example be greater than or equal to 0.1 μm, greater than or equal to 0.5 μm, or greater than or equal to 1.0 μm. The distance K1 may for example be less than or equal to 2.0 μm, less than or equal to 4.0 μm, or less than or equal to 8.0 μm. The distance K1 may fall within a range defined by a first group consisting of 0.1 μm, 0.5 μm, and 1.0 μm and/or a second group consisting of 2.0 μm, 4.0 μm, and 8.0 μm. The distance K1 may fall within a range defined by a combination of any one of the values included in the aforementioned first group and any one of the values included in the aforementioned second group. The distance K1 may fall within a range defined by a combination of any two of the values included in the aforementioned first group. The distance K1 may fall within a range defined by a combination of any two of the values included in the aforementioned second group. The distance K1 may for example be greater than or equal to 0.1 μm and less than or equal to 8.0 μm, greater than or equal to 0.1 μm and less than or equal to 4.0 μm, greater than or equal to 0.1 μm and less than or equal to 2.0 μm, greater than or equal to 0.1 μm and less than or equal to 1.0 μm, greater than or equal to 0.1 μm and less than or equal to 0.5 μm, greater than or equal to 0.5 μm and less than or equal to 8.0 μm, greater than or equal to 0.5 μm and less than or equal to 4.0 μm, greater than or equal to 0.5 μm and less than or equal to 2.0 μm, greater than or equal to 0.5 μm and less than or equal to 1.0 μm, greater than or equal to 1.0 μm and less than or equal to 8.0 μm, greater than or equal to 1.0 μm and less than or equal to 4.0 μm, greater than or equal to 1.0 μm and less than or equal to 2.0 μm, greater than or equal to 2.0 μm and less than or equal to 8.0 μm, greater than or equal to 2.0 μm and less than or equal to 4.0 μm, or greater than or equal to 4.0 μm and less than or equal to 8.0 μm.

A manufacturing method for an electronic device 10 according to another embodiment of the present disclosure is described with reference to FIGS. 47 and 48.

The foregoing embodiment has illustrated an example in which the apertures 51 are formed by removing part of the second electrode 50. The present embodiment describes an example in which inhibiting layers 95 are formed on the substrate 15 before the second electrode 50 is formed on the organic layers 40. The inhibiting layers 95 have such properties that it is hard for the electrically conducting material constituting the second electrode 50 to adhere to the inhibiting layers 95.

Figure 47:
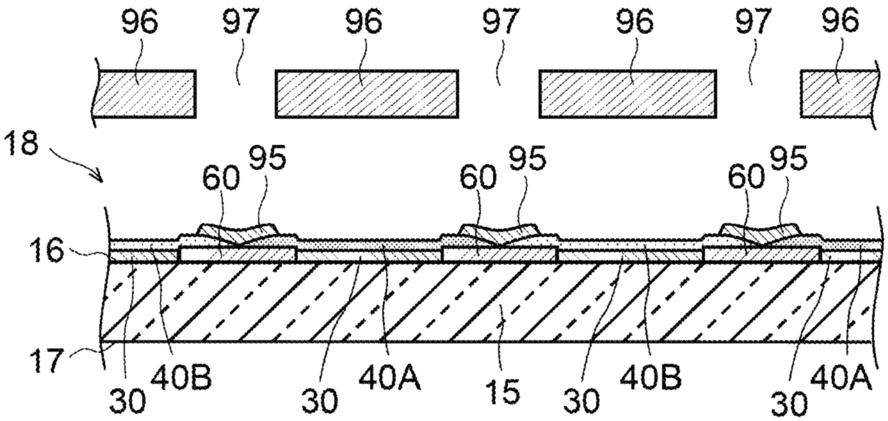
FIG. 47 is a cross-sectional view for explaining an inhibiting layer forming step of a manufacturing method for the electronic device.

FIG. 47 is a cross-sectional view showing an example of an inhibiting layer forming step of forming the inhibiting layers 95 on the substrate 15. The inhibiting layer forming step may be executed between the organic layer forming step and the second electrode forming step. That is, the inhibiting layer forming step may be executed after the organic layer forming step and before the second electrode forming step. In the example shown in FIG. 47, an insulating forming step of forming an insulating layer 60 between the first electrodes 30 is executed before the organic layer forming step, as in the case of the foregoing embodiment shown in FIGS. 33 to 40.

In the inhibiting layer forming step, the inhibiting layers 95 are formed in positions on the substrate 15 in which the apertures 51 are to be formed. As shown in FIG. 47, the inhibiting layers 95 may be formed on the substrate 15 via the insulating layer 60 and the organic layers 40. Although not illustrated, the inhibiting layers may be formed on the substrate 15 via the organic layers alone without the insulating layer 60 being formed, or the inhibiting layers 95 may be formed directly on the substrate 15. The inhibiting layer forming step may include a step of depositing a material of the inhibiting layers 95 on the substrate 15 via a mask 96. As shown in FIG. 47, the inhibiting layers 95 may be formed in regions of the substrate 15 that overlap through holes 97 of the mask 96. A pattern of the through holes 97 of the mask 96 correspond to a pattern of the apertures 51. That is, the shapes and arrangement of the through holes 97 of the mask 96 are set in accordance with the shapes and arrangement of the apertures 51 as calculated in the aforementioned preparing step.

Figure 48:
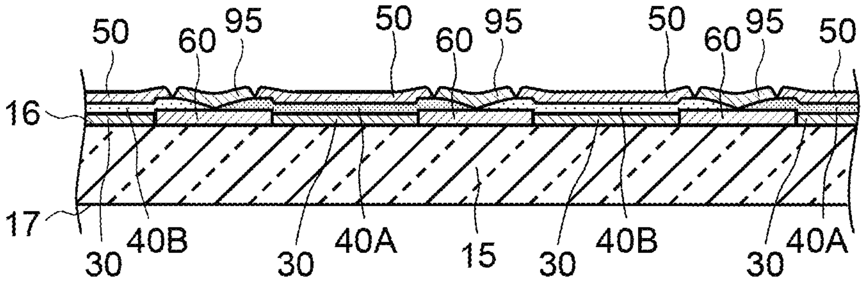
FIG. 48 is a cross-sectional view for explaining a second electrode forming step of the manufacturing method for the electronic device.

FIG. 48 is a cross-sectional view showing an example of the second electrode forming step. The second electrode 50 is formed by depositing the material of the second electrode 50 on the substrate 15. As mentioned above, the inhibiting layers 95 have such properties that it is hard for the electrically conducting material constituting the second electrode 50 to adhere to the inhibiting layers 95. For this reason, as shown in FIG. 48, the second electrode 50 is restrained from being formed on the inhibiting layers 95. This allows the regions in which the inhibiting layers 95 are formed to function as the apertures 51.

The inhibiting layers 95 have optical transparency. For example, the transmittance of a layered product including the substrate 15 and the inhibiting layers may be higher than or equal to 70% or may be higher than or equal to 80%. The transmittance of the layered product including the substrate 15 and the inhibiting layers 95 can be measured in conformity with "Plastics—Determination of the total luminous transmittance of transparent materials" provided for in JIS K7361-1.

The material of the inhibiting layers 95 may be a material of a nucleation inhibiting coating described in WO 2017072678 A1 or WO 2019150327 A1. For example, the material of the inhibiting layers 95 may contain an organic material such as a low-molecular organic material and an organic polymer. The organic material may for example be a polycyclic aromatic compound. The polycyclic aromatic compound contains organic molecules each including a core portion and at least one terminal portion bonded to the core portion. Each of the organic molecules may contain one or more heteroatoms of nitrogen, sulfur, oxygen, phosphorus, aluminum, or other substances. The number of terminal portions may be larger than or equal to 1, larger than or equal to 2, larger than or equal to 3, or larger than or equal to 4. In a case where each of the organic molecules contains two or more terminal portions, the two or more terminal portions may be identical to or different from each other.

The terminal portion may include a biphenylyl portion represented by any of the following chemical structures (1-a), (1-b), and (1-c):

(1-a)

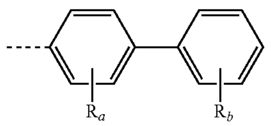

(1-b)

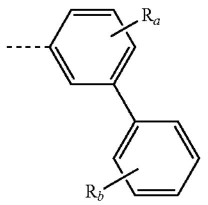

(1-c)

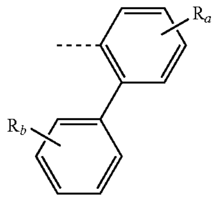

The substituents Ra and Rb may each independently be selected from among heavy hydrogen, fluorine, alkyl including $C_1$ to $C_4$ alkyl, cycloalkyl, arylalkyl, silyl, aryl, heteroaryl, fluoroalkyl, and any combination thereof.

EXAMPLES

Next, the embodiments of the present disclosure are described in more concrete terms with reference to examples. The embodiments of the present disclosure are not limited to the following description of the examples, provided the embodiments of the present disclosure do not depart from the scope of the embodiments of the present disclosure.

Figure 49:
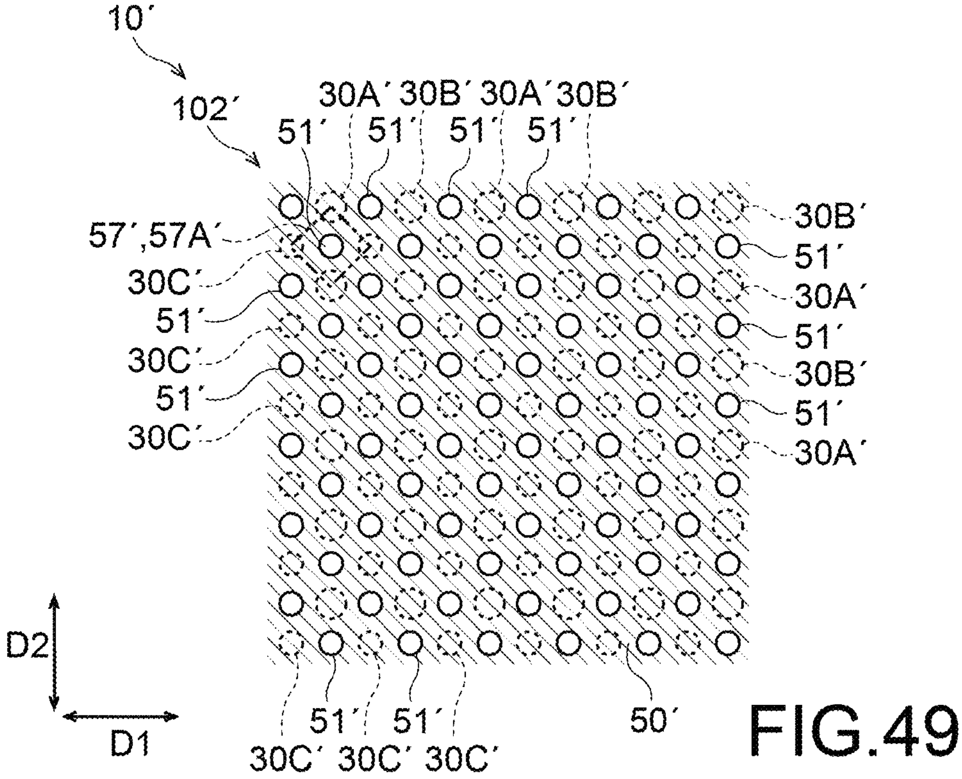
FIG. 49 is a plan view showing a second display area of an electronic device according to a comparative example.

FIG. 49 is a plan view showing a second display area 102' of an electronic device 10' according to a comparative example. The electronic device 10' shown in FIG. 49 includes a plurality of first electrodes 30' and a second electrode 50'. The plurality of first electrodes 30' includes a plurality of first color electrodes 30A', a plurality of second color electrodes 30B', and a plurality of third color electrodes 30C'. The first color electrodes 30A' and the second color electrodes 30B' are alternately and periodically arranged along the first direction D1 and alternately and periodically arranged along the second direction D2. The, the third color electrodes 30C' are periodically arranged along the first direction D1 so as to be located between the first color electrodes 30A' and the second color electrodes 30B' in the first direction D1 and are periodically arranged along the second direction D2 so as to be located between the first color electrodes 30A' and the second color electrodes 30B' in the second direction D2. The pitch between first electrodes 30' in the first direction D1 and the second direction D2 is 84.7 μm.

The shapes of the first electrodes 30' in planar view are circles. The diameter of each of the first color electrodes 30A' and the diameter of each of the second color electrodes 30B' are 34.1 μm. The diameter of each of the third color electrodes 30C' is 24.2 μm. The transmittance of each of the first electrodes 30' is 0%. The transmittance here is total transmittance with respect to light with a wavelength of 550 nm.

The second electrode 50' has a plurality of apertures 51' formed therein. In the comparative example shown in FIG. 49, the apertures 51' are placed in all unit regions 57' each demarcated by a quadrangle that is obtained by connecting center points of four adjacent ones of the first electrodes 30'. That is, the plurality of unit regions 57' includes aperture regions 57A' including the apertures 51' but does not include non-aperture regions not including the apertures 51'. One aperture 51' is formed in one aperture region 57A'. In planar view, the center point of each of the apertures 51' and the center point of the corresponding one of the aperture regions 57A' coincide with each other. In the comparative example, the proportion of the number of non-aperture regions to the number of unit regions 57' is 0%.

The shapes of the apertures 51' in planar view are circles. The diameter of each of the apertures 51' is 23 μm. The transmittance of each of the apertures 51' is 85%. The transmittance of the second electrode 50' is 38%. The transmittance here is total transmittance with respect to light with a wavelength of 550 nm.

Figure 50:
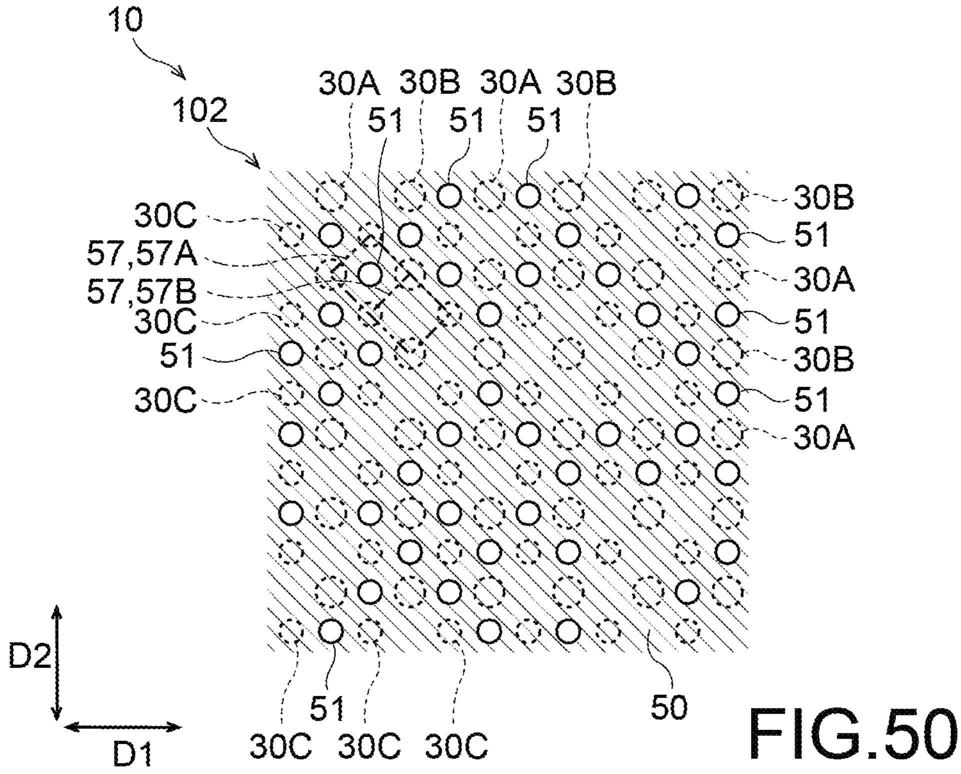
FIG. 50 is a plan view showing a second display area of an electronic device according to a first example.

FIG. 50 is a plan view showing a second display area 102 of an electronic device 10 according to a first example. The electronic device 10 shown in FIG. 50 includes a plurality of first electrodes 30 and a second electrode 50. The plurality of first electrodes 30 includes a plurality of first color electrodes 30A, a plurality of second color electrodes 30B, and a plurality of third color electrodes 30C. The array of first electrodes 30 and the pitch between first electrodes 30 are the same as those of the comparative example. The shape, size, and transmittance of each of the first electrodes 30 too are the same as those of the comparative example.

The second electrode 50 has a plurality of apertures 51 formed therein. In the first example shown in FIG. 50, the plurality of unit regions 57 includes aperture regions 57A including the apertures 51 and non-aperture regions 57B not including the apertures 51. One aperture 51 is formed in one aperture region 57A. In planar view, the center point of each of the apertures 51 and the center point of the corresponding one of the aperture regions 57A coincide with each other. The aperture regions 57A and the non-aperture regions 57B are randomly placed. In the first example, the proportion of the number of non-aperture regions 57B to the number of unit regions 57 is 50%. The shape, size, and transmittance of each of the apertures 51 are the same as those of the comparative example. The transmittance of the second electrode 50 too is the same as that of the comparative example.

Figure 51:
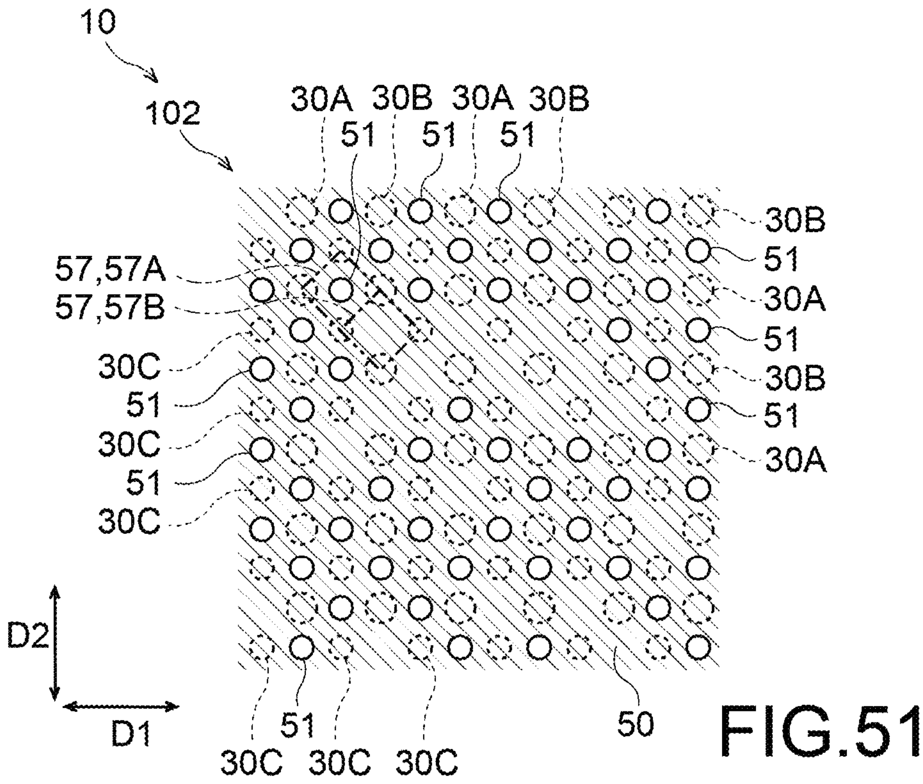
FIG. 51 is a plan view showing a second display area of an electronic device according to a second example.

FIG. 51 is a plan view showing a second display area 102 of an electronic device 10 according to a second example. The electronic device 10 shown in FIG. 51 includes a plurality of first electrodes 30 and a second electrode 50. The plurality of first electrodes 30 includes a plurality of first color electrodes 30A, a plurality of second color electrodes 30B, and a plurality of third color electrodes 30C. The array of first electrodes 30 and the pitch between first electrodes 30 are the same as those of the comparative example and the first example. The shape, size, and transmittance of each of the first electrodes 30 too are the same as those of the comparative example and the first example.

The second electrode 50 has a plurality of apertures 51 formed therein. In the second example shown in FIG. 51, the plurality of unit regions 57 includes aperture regions 57A including the apertures 51 and non-aperture regions 57B not including the apertures 51. One aperture 51 is formed in one aperture region 57A. In planar view, the center point of each of the apertures 51 and the center point of the corresponding one of the aperture regions 57A coincide with each other. The aperture regions 57A and the non-aperture regions 57B are randomly placed as in the case of the first example. In the second example shown in FIG. 51, the number of non-aperture regions 57B is smaller than in the case of the first example shown in FIG. 50. That is, in the second example shown in FIG. 51, the number of aperture regions 57A (i.e. the number of apertures 51) is larger than in the case of the first example shown in FIG. 50. In the second example, the proportion of the number of non-aperture regions 57B to the number of unit regions 57 is 25%. The shape, size, and transmittance of each of the apertures 51 are the same as those of the comparative example and the first example. The transmittance of the second electrode 50 too is the same as that of the comparative example and the first example.

Figure 52:
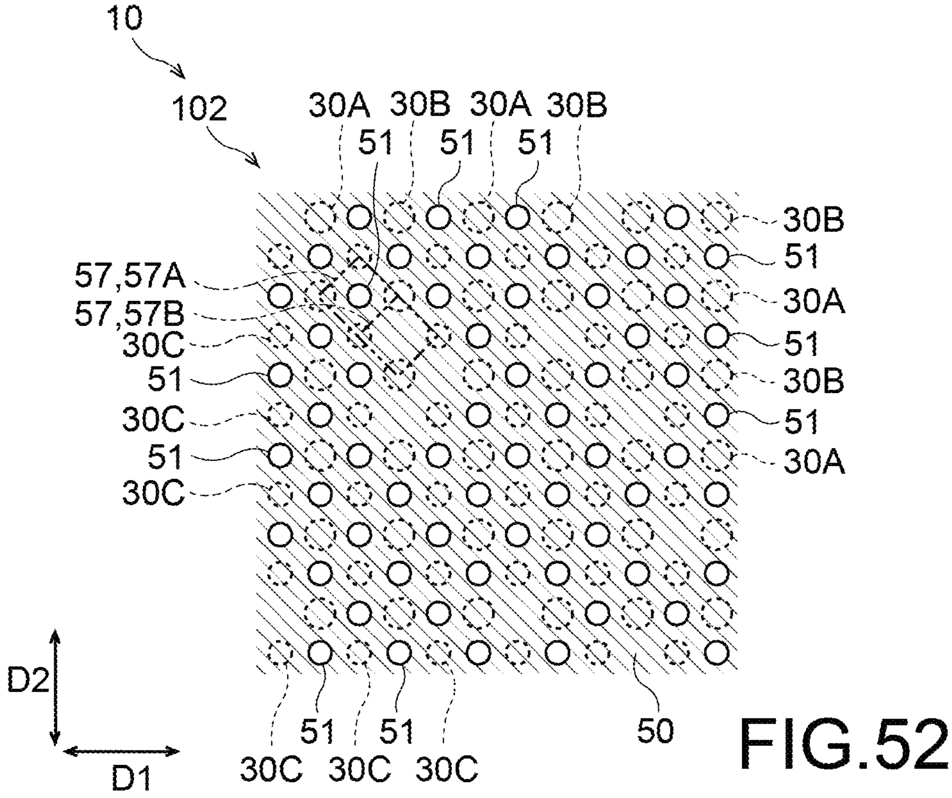
FIG. 52 is a plan view showing a second display area of an electronic device according to a third example.

FIG. 52 is a plan view showing a second display area 102 of an electronic device 10 according to a third example. The electronic device 10 shown in FIG. 52 includes a plurality of first electrodes 30 and a second electrode 50. The plurality of first electrodes 30 includes a plurality of first color electrodes 30A, a plurality of second color electrodes 30B, and a plurality of third color electrodes 30C. The array of first electrodes 30 and the pitch between first electrodes 30 are the same as those of the comparative example and the first and second examples. The shape, size, and transmittance of each of the first electrodes 30 too are the same as those of the comparative example and the first and second examples.

The second electrode 50 has a plurality of apertures 51 formed therein. In the third example shown in FIG. 52, the plurality of unit regions 57 includes aperture regions 57A including the apertures 51 and non-aperture regions 57B not including the apertures 51. One aperture 51 is formed in one aperture region 57A. In planar view, the center point of each of the apertures 51 and the center point of the corresponding one of the aperture regions 57A coincide with each other. The aperture regions 57A and the non-aperture regions 57B are randomly placed as in the case of the first and second examples. In the third example shown in FIG. 52, the number of non-aperture regions 57B is smaller than in the case of the second example shown in FIG. 51. That is, in the third example shown in FIG. 52, the number of aperture regions 57A (i.e. the number of apertures 51) is larger than in the case of the second example shown in FIG. 51. In the third example, the proportion of the number of non-aperture regions 57B to the number of unit regions 57 is 12.5%. The shape, size, and transmittance of each of the apertures 51 are the same as those of the comparative example and the first and second examples. The transmittance of the second electrode 50 too is the same as that of the comparative example and the first and second examples.

Figure 53:
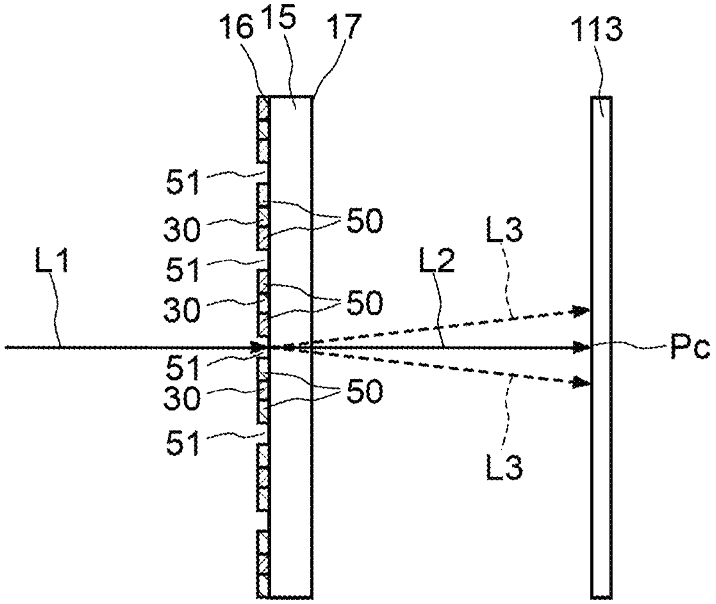
FIG. 53 is a diagram for explaining a method for evaluating diffraction in the comparative example and the first to third examples.

Regarding each of the comparative examples and the first to third examples, diffraction of light having passed through the second electrode 50 was verified by simulation. FIG. 53 is a diagram for explaining a method for evaluating diffraction in the comparative example and the first to third examples. As shown in FIG. 53, light L1 was made to fall on the substrate 15 along the direction normal to the first surface 16 of the substrate 15. The wavelength of the light L1 is 550 nm. The diameter of the light L1 is 3 mm. Then, diffraction of light having passed through the apertures 51 and been transmitted through the second electrode 50 was calculated by simulation. Reference sign L2 denotes light that travels in a straight line without being diffracted and arrives at a screen 113. Reference sign Pc denotes a point of arrival of light L2 on the screen 113. Reference sign L3 denotes light diffracted when passing through the apertures 51. The distance between the second surface 17 of the substrate 15 and the screen 113 is 5000 mm.

Figure 54:
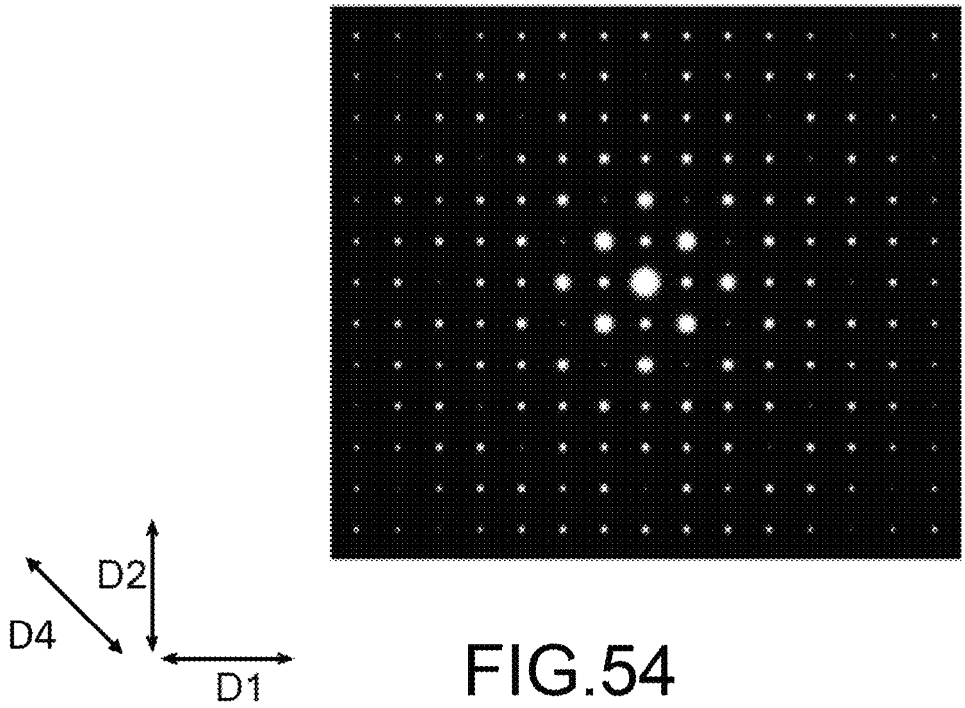
FIG. 54 is a diagram showing a result of evaluation of a pattern of projection in the comparative example.
Figure 55:
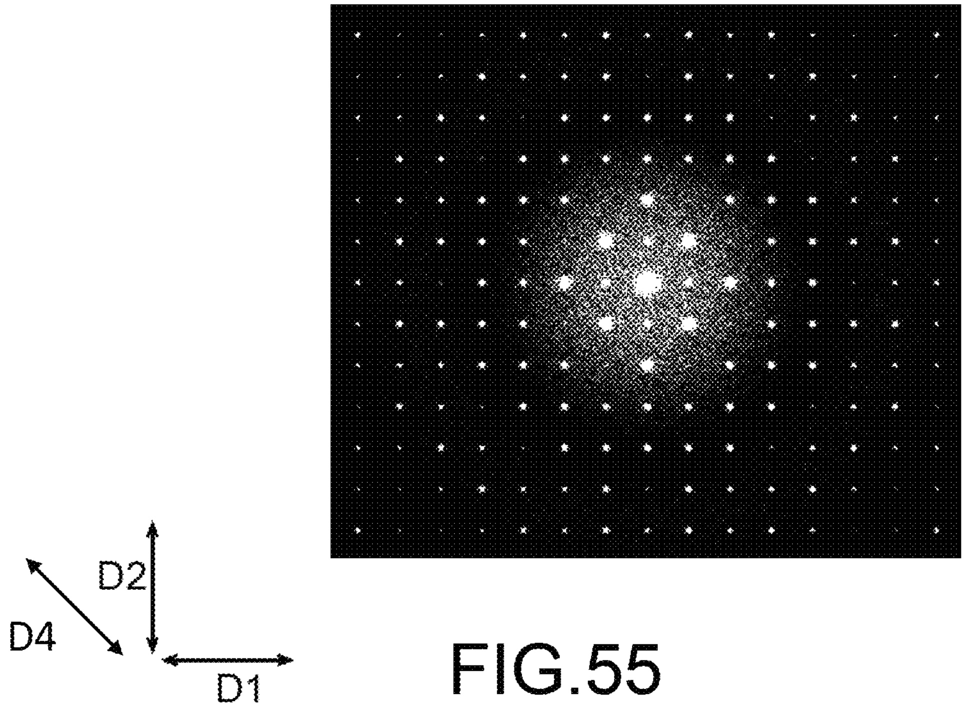
FIG. 55 is a diagram showing a result of evaluation of a pattern of projection in the first example.
Figure 56:
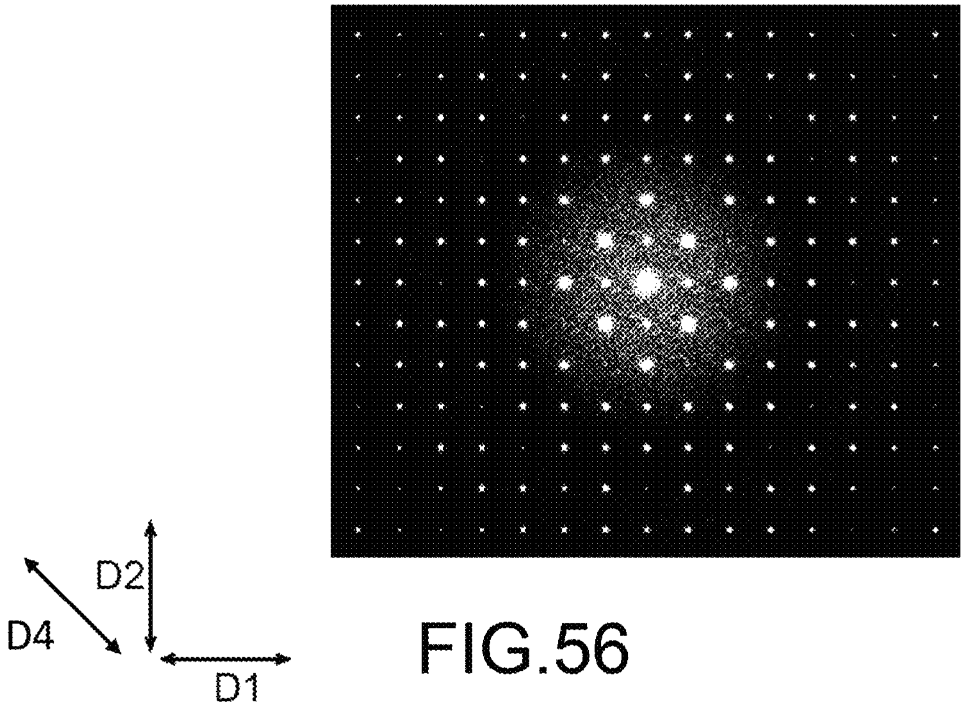
FIG. 56 is a diagram showing a result of evaluation of a pattern of projection in the second example.
Figure 57:
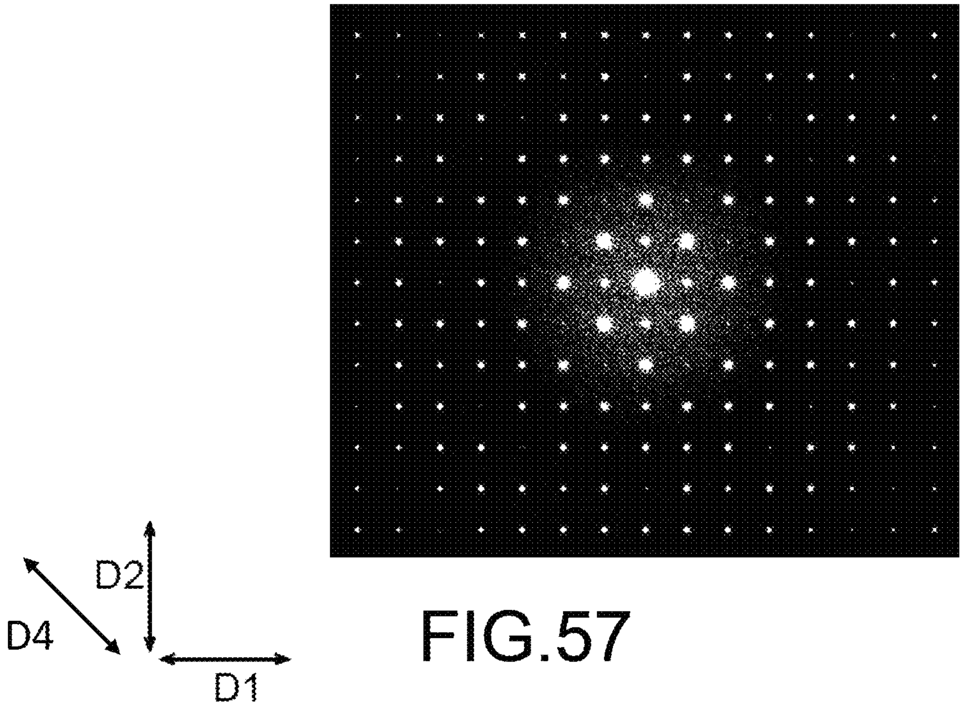
FIG. 57 is a diagram showing a result of evaluation of a pattern of projection in the third example.

FIG. 54 is a diagram showing a pattern of projection of light arriving at the screen 113 in the comparative example. FIG. 55 is a diagram showing a pattern of projection of light arriving at the screen 113 in the first example. FIG. 56 is a diagram showing a pattern of projection of light arriving at the screen 113 in the second example. FIG. 57 is a diagram showing a pattern of projection of light arriving at the screen 113 in the third example. The patterns of projection of light in FIGS. 55 to 57 are more blurred than the pattern of projection of light in FIG. 54. This shows that the first to third examples can further reduce the intensity of diffracted light than the comparative example. Accordingly, the first to third examples can restrain high-intensity diffracted light from falling on an optical component such as a sensor.

Further, the pattern of projection of light in FIG. 55 is more blurred than the patterns of projection of light in FIGS. 56 and 57. The pattern of projection of light in FIG. 56 is more blurred than the pattern of projection of light in FIG. 57. This shows that the intensity of diffracted light can be more effectively reduced when the proportion of the number of non-aperture regions 57B to the number of unit regions 57 is larger.

Figure 58:
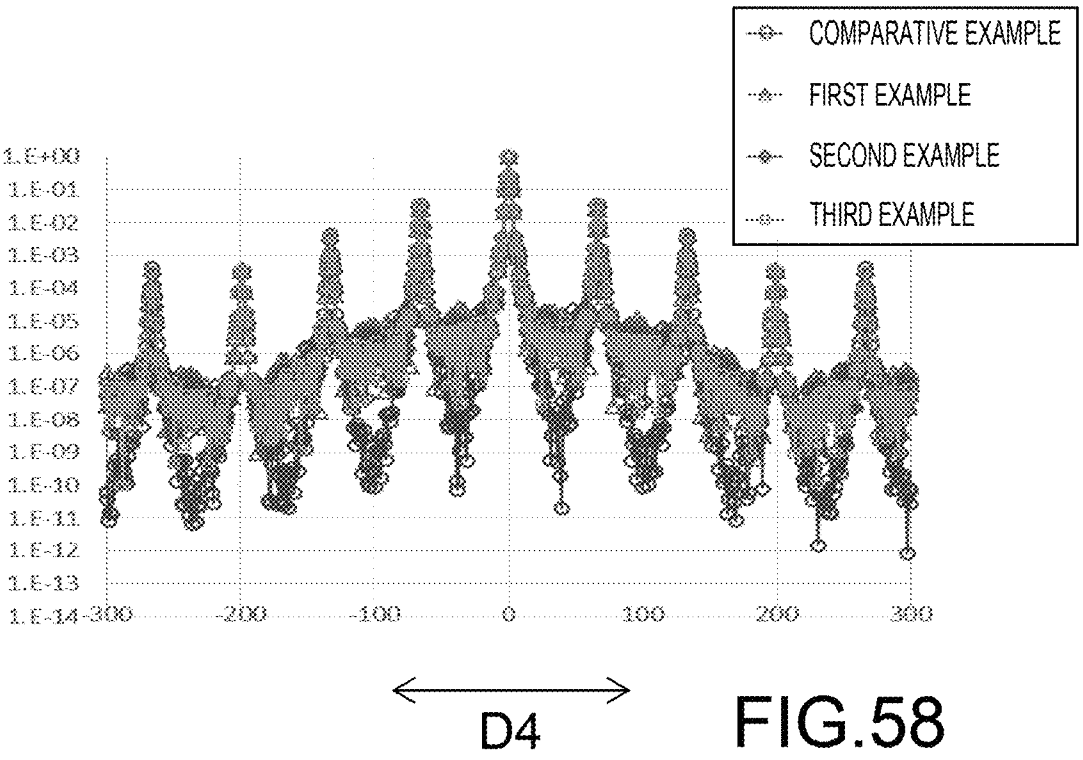
FIG. 58 is a diagram showing results of extraction of the intensities of diffracted light along a fourth direction in the comparative example and the first to third examples.

FIG. 58 is a diagram showing results of extraction of the intensities of diffracted light along the fourth direction D4 in the comparative example and the first to third examples. The horizontal axis represents the distance from the point Pc in the fourth direction D4. The vertical axis represents the intensity of light having arrived at the screen 113. A peak located in the middle of the horizontal axis represents zeroth-order diffracted light. With distance from the peak of the zeroth-order diffracted light in the fourth direction D4, peaks of first-order diffracted light, peaks of second-order diffracted light, peaks of third-order diffracted light, and peaks of fourth-order diffracted light appear in sequence.

Figure 59:
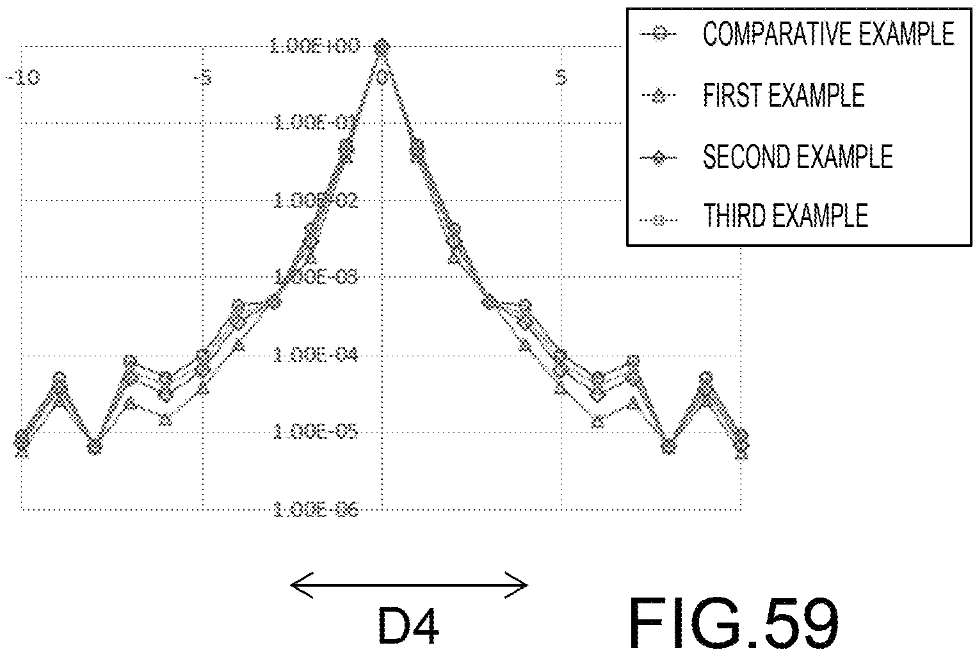
FIG. 59 is a diagram showing results of extraction of the peak intensities of diffracted light of FIG. 58.

FIG. 59 is a diagram showing results of extraction of the peak intensities of zeroth-order to tenth-order diffracted light of FIG. 58. In the comparative example and the first to third examples, the peak intensities of the first-order diffracted light are highest, excluding the peak of the zeroth-order diffracted light. These peak intensities are also referred to as "maximum peak intensities".

Figure 60:
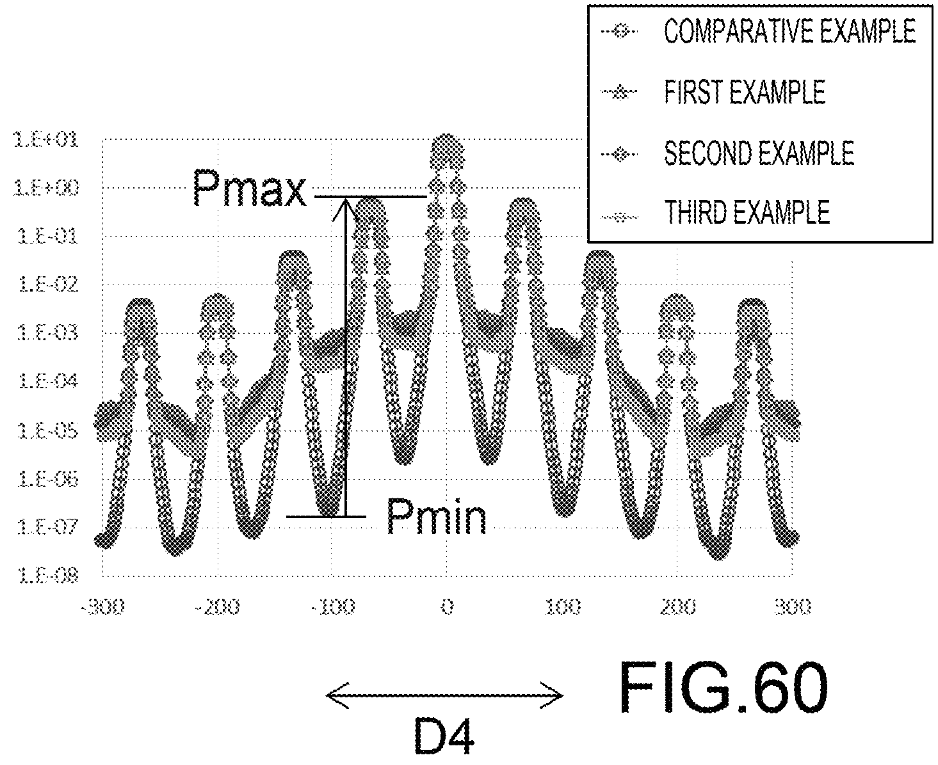
FIG. 60 is a diagram showing results of integration for each predetermined area of the peak intensities of diffracted light of FIG. 58.
Figure 61:
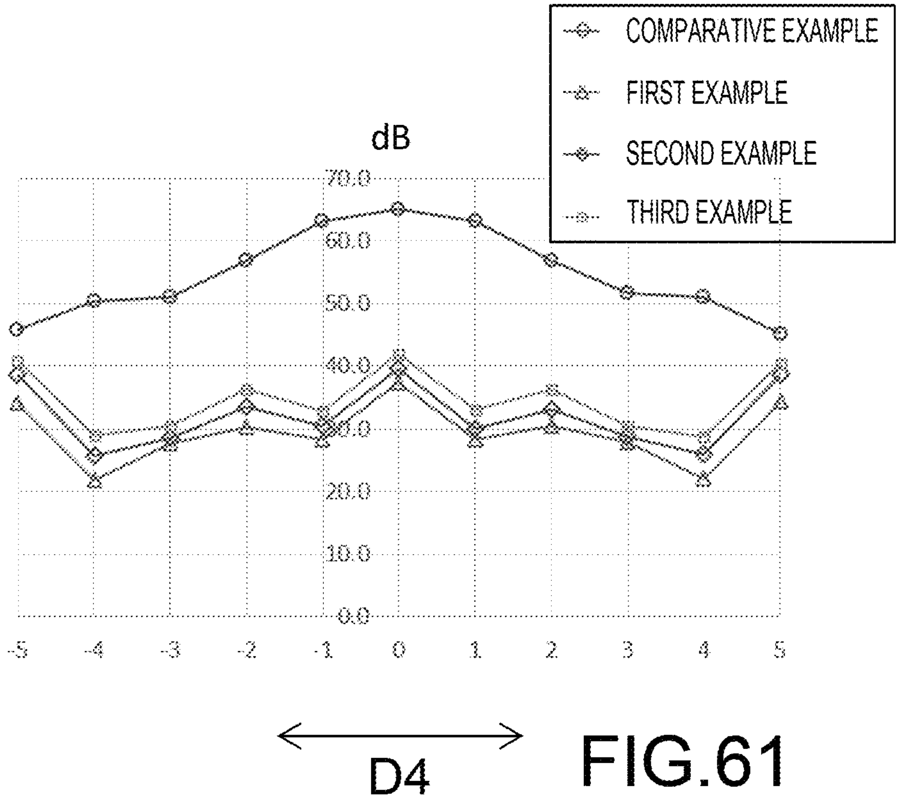
FIG. 61 is a diagram showing results of extraction and dB conversion of the peak intensities of diffracted light of FIG. 60.

FIG. 60 is a diagram showing results of integration for each predetermined area of the peak intensities of diffracted light of FIG. 58. This predetermined area is a square area measuring 8.3 mm per side. FIG. 61 is a diagram showing results of extraction and dB conversion of the peak intensities of diffracted light of FIG. 60. As shown in FIG. 60, a dB converted value was calculated by calculating the ratio ($P_{max}/P_{min}$) of the maximum peak $P_{max}$ to the minimum peak intensity $P_{min}$ of diffracted light and integrating this common logarithm with 10. Then, for the first-order to third-order diffracted light, the averages of dB converted values of the peak intensities were calculated. Similarly, for the first direction D1 and the second direction D2 too, the averages of dB converted values of the peak intensities of the first-order to third-order diffracted light were calculated. Moreover, a dB average total value was obtained by adding up the dB converted values of those three directions.

FIG. 62 is a diagram showing results of evaluation of diffraction in the comparative example and the first to third examples. It was confirmed that the maximum peak intensities and the dB average total values in the first to third examples can be further reduced than in the case of the comparative example. It was thus confirmed that the first to third examples can further reduce the intensity of diffracted light than the comparative example.

Figure 63:
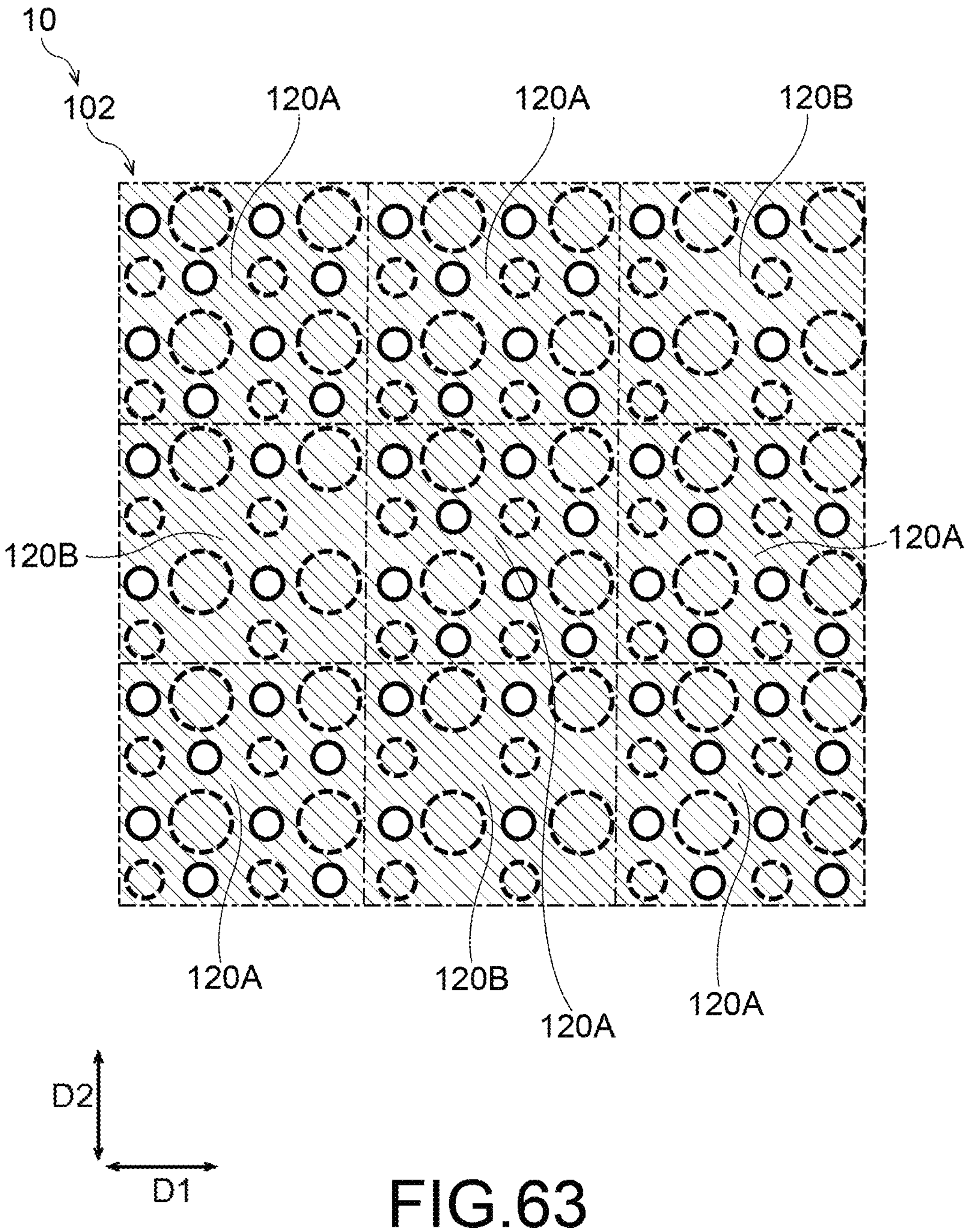
FIG. 63 is a plan view showing a second display area of an electronic device according to a fourth example.

Further, other examples too were evaluated. FIG. 63 is a plan view showing a second display area 102 of an electronic device 10 according to a fourth example. The second display area 102 of the electronic device 10 shown in FIG. 63 is constituted by block patterns 120 being arrayed. More specifically, the second display area 102 of the electronic device 10 shown in FIG. 63 is constituted by A patterns 120A and B patterns 120B. When symbol "A" represents an A pattern 120A and symbol "B" represents a B pattern 120B, the A patterns 120A and the B patterns 120B in the second display area 102 of the electronic device 10 shown in FIG. 63 are arrayed as follows:

••AAB••
••BAA••
••ABA••

In the fourth example, the array of first electrodes 30 and the pitch between first electrodes 30 are the same as those of the comparative example and the first to third examples. The shape, size, and transmittance of each of the first electrodes 30 too are the same as those of the comparative example and the first to third examples. The shape, size, and transmittance of each of the apertures 51 too are the same as those of the comparative example and the first to third examples. The transmittance of the second electrode 50 too is the same as that of the comparative example and the first to third examples. In the fourth example, the proportion of the number of non-aperture regions 57B to the number of unit regions 57 is 16.9%.

Figure 64:
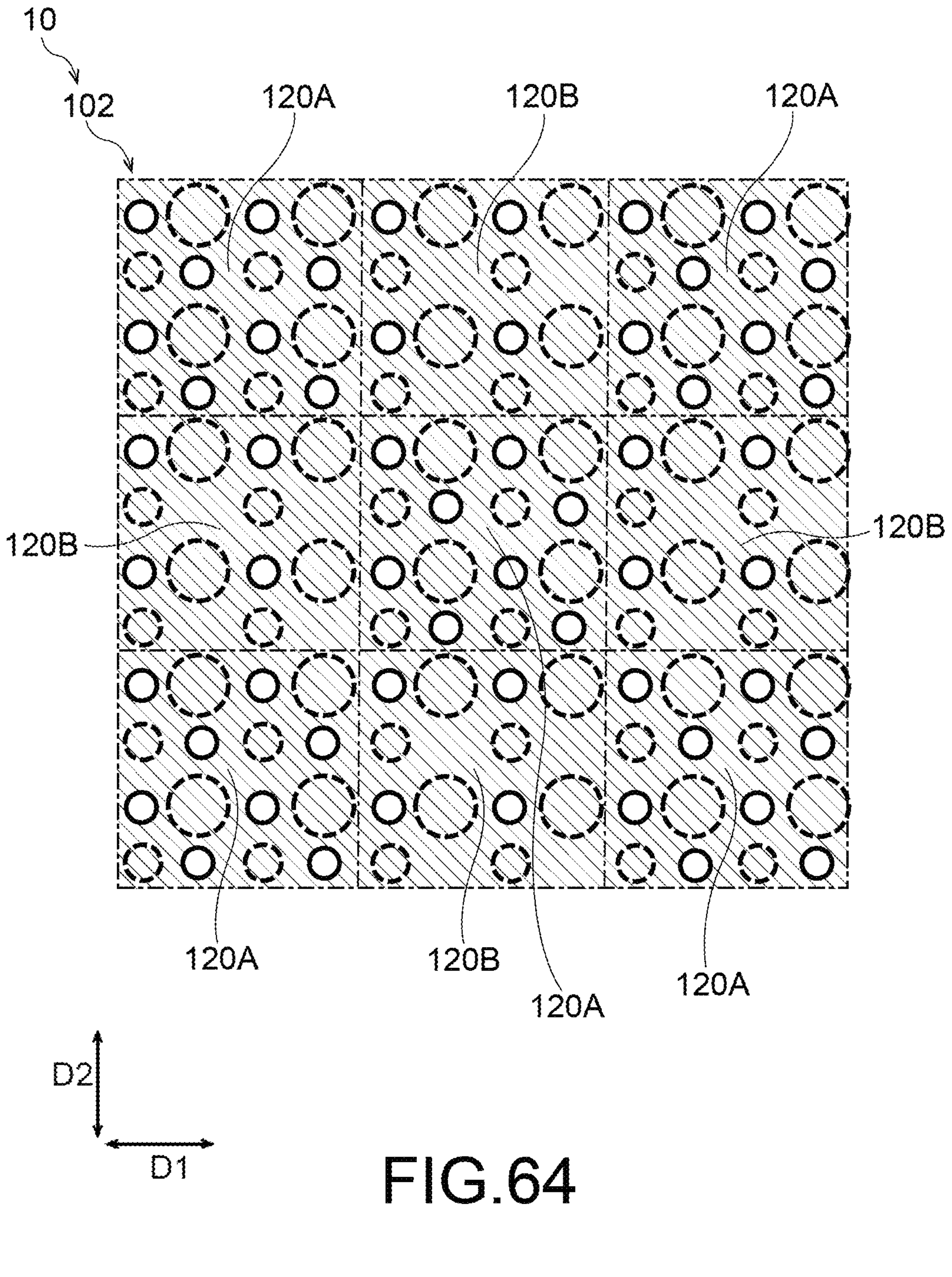
FIG. 64 is a plan view showing a second display area of an electronic device according to a fifth example.

FIG. 64 is a plan view showing a second display area 102 of an electronic device 10 according to a fifth example. The second display area 102 of the electronic device 10 shown in FIG. 64 is constituted by block patterns 120 being arrayed. More specifically, the second display area 102 of the electronic device 10 shown in FIG. 64 is constituted by A patterns 120A and B patterns 120B. When symbol "A" represents an A pattern 120A and symbol "B" represents a B pattern 120B, the A patterns 120A and the B patterns 120B in the second display area 102 of the electronic device 10 shown in FIG. 64 are arrayed as follows:

••ABA••
••BAB••
••ABA••

In the fifth example, the array of first electrodes 30 and the pitch between first electrodes 30 are the same as those of the comparative example and the first to fourth examples. The shape, size, and transmittance of each of the first electrodes 30 too are the same as those of the comparative example and the first to fourth examples. The shape, size, and transmittance of each of the apertures 51 too are the same as those of the comparative example and the first to fourth examples. The transmittance of the second electrode 50 too is the same as that of the comparative example and the first to fourth examples. In the fifth example, the proportion of the number of non-aperture regions 57B to the number of unit regions 57 is 25.4%.

Figure 65:
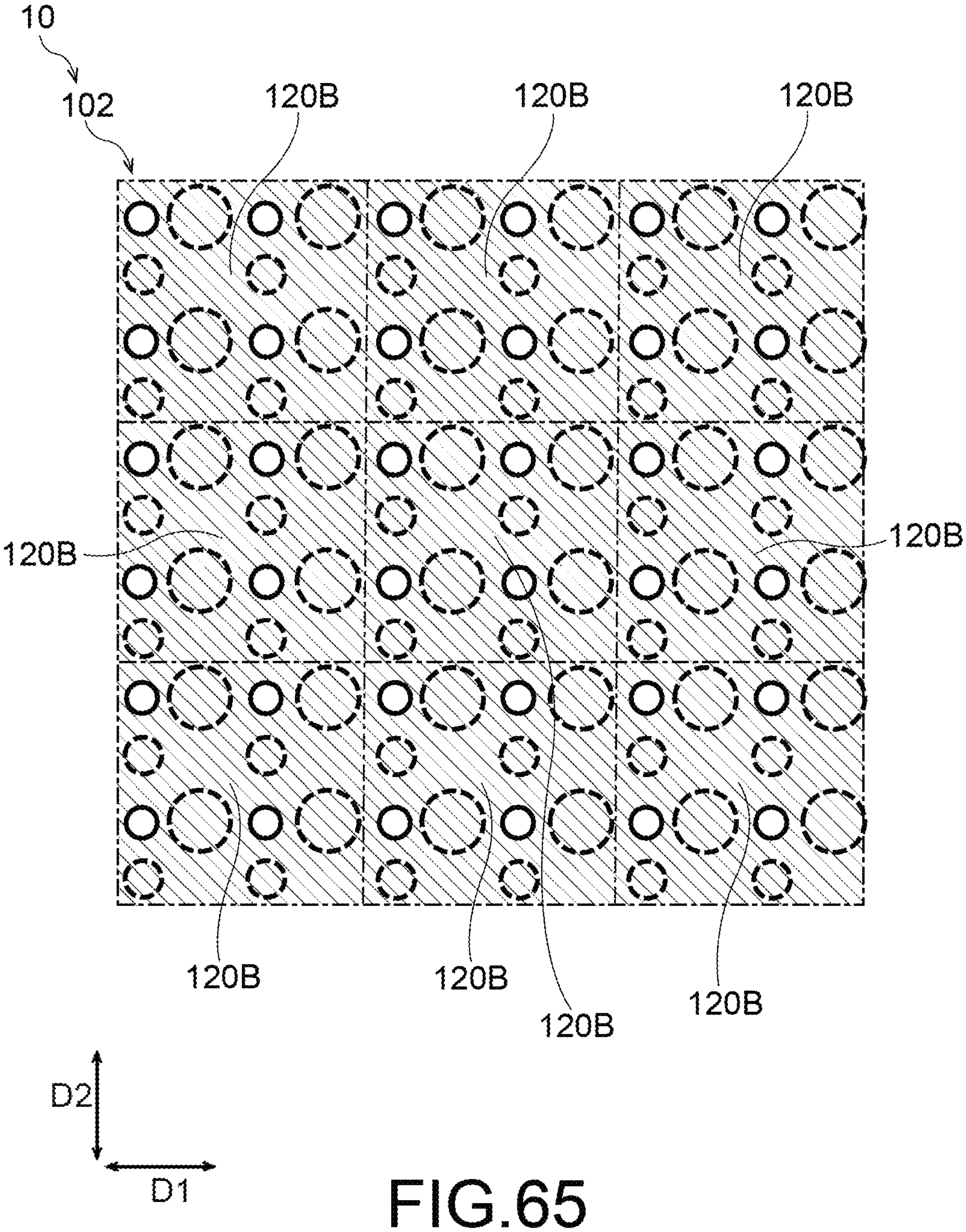
FIG. 65 is a plan view showing a second display area of an electronic device according to a sixth example.

FIG. 65 is a plan view showing a second display area 102 of an electronic device 10 according to a sixth example. The second display area 102 of the electronic device 10 shown in FIG. 65 is constituted by block patterns 120 being arrayed. More specifically, the second display area 102 of the electronic device 10 shown in FIG. 65 is constituted by B patterns 120B. When s symbol "B" represents a B pattern 120B, the B patterns 120B in the second display area 102 of the electronic device 10 shown in FIG. 65 are arrayed as follows:

••BBB••
••BBB••
••BBB••

In the sixth example, the array of first electrodes 30 and the pitch between first electrodes 30 are the same as those of the comparative example and the first to fifth examples. The shape, size, and transmittance of each of the first electrodes 30 too are the same as those of the comparative example and the first to fifth examples. The shape, size, and transmittance of each of the apertures 51 too are the same as those of the comparative example and the first to fifth examples. The transmittance of the second electrode 50 too is the same as that of the comparative example and the first to fifth examples. In the sixth example, the proportion of the number of non-aperture regions 57B to the number of unit regions 57 is 50.9%.

Figure 66:
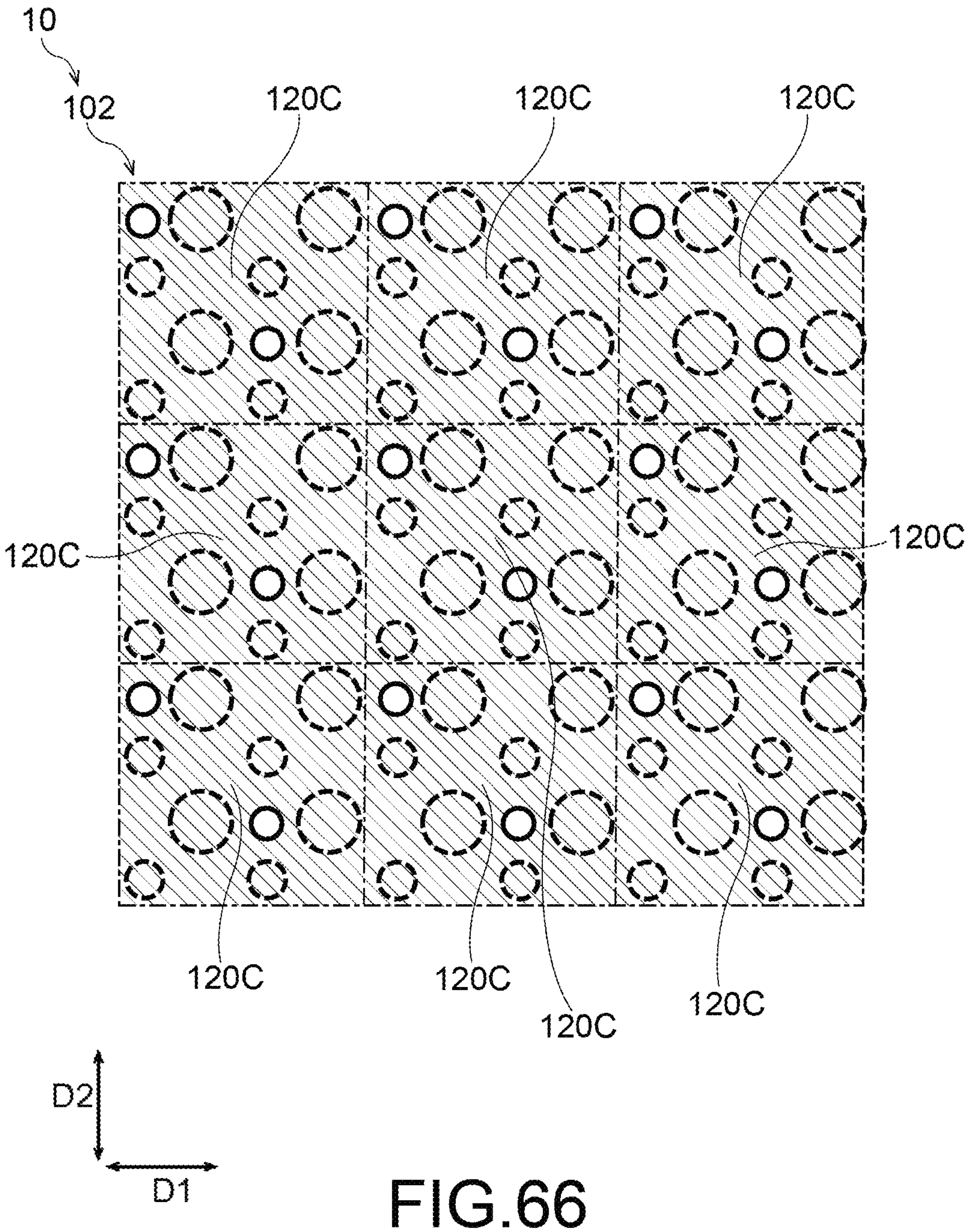
FIG. 66 is a plan view showing a second display area of an electronic device according to a seventh example.

FIG. 66 is a plan view showing a second display area 102 of an electronic device 10 according to a seventh example. The second display area 102 of the electronic device 10 shown in FIG. 66 is constituted by block patterns 120 being arrayed. More specifically, the second display area 102 of the electronic device 10 shown in FIG. 66 is constituted by C patterns 120C. When s symbol "C" represents a C pattern 120C, the C patterns 120C in the second display area 102 of the electronic device 10 shown in FIG. 66 are arrayed as follows:

••CCC••
••CCC••
••CCC••

In the seventh example, the array of first electrodes 30 and the pitch between first electrodes 30 are the same as those of the comparative example and the first to sixth examples. The shape, size, and transmittance of each of the first electrodes 30 too are the same as those of the comparative example and the first to sixth examples. The shape, size, and transmittance of each of the apertures 51 too are the same as those of the comparative example and the first to sixth examples. The transmittance of the second electrode 50 too is the same as that of the comparative example and the first to sixth examples. In the seventh example, the proportion of the number of non-aperture regions 57B to the number of unit regions 57 is 75.4%.

Figure 67:
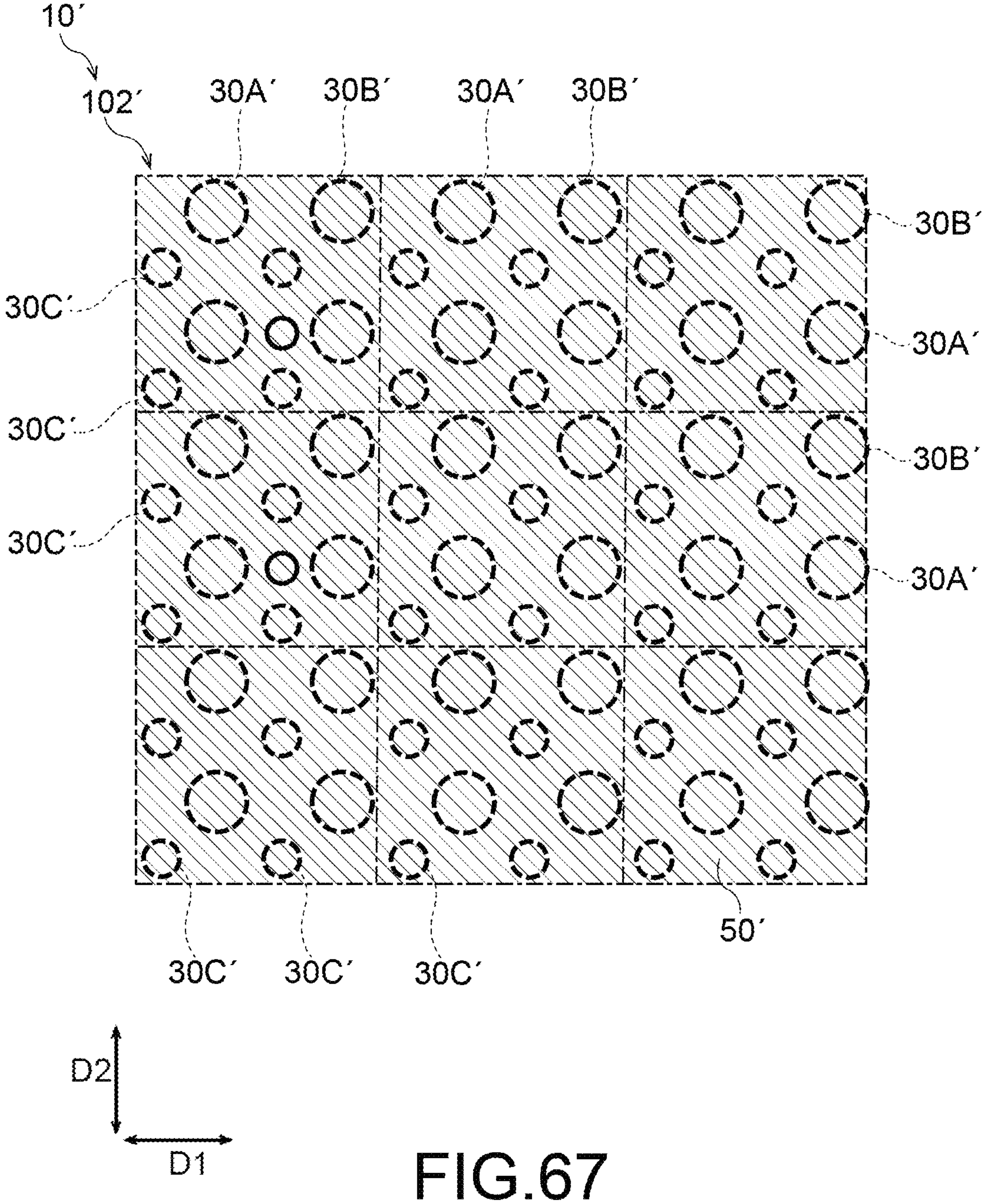
FIG. 67 is a plan view showing a second display area of an electronic device according to a reference example.

FIG. 67 is a plan view showing a second display area 102' of an electronic device 10' according to a reference example. In the second display area 102' of the electronic device 10' shown in FIG. 67, the second electrode 50' has no apertures formed therein. In the reference example, the array of first electrodes 30 and the pitch between first electrodes 30 are the same as those of the comparative example and the first to seventh examples. The shape, size, and transmittance of each of the first electrodes 30 too are the same as those of the comparative example and the first to seventh examples. The transmittance of the second electrode 50' too is the same as that of the comparative example and the first to seventh examples. In the reference example, the proportion of the number of non-aperture regions to the number of unit regions is 100%.

Figure 69:
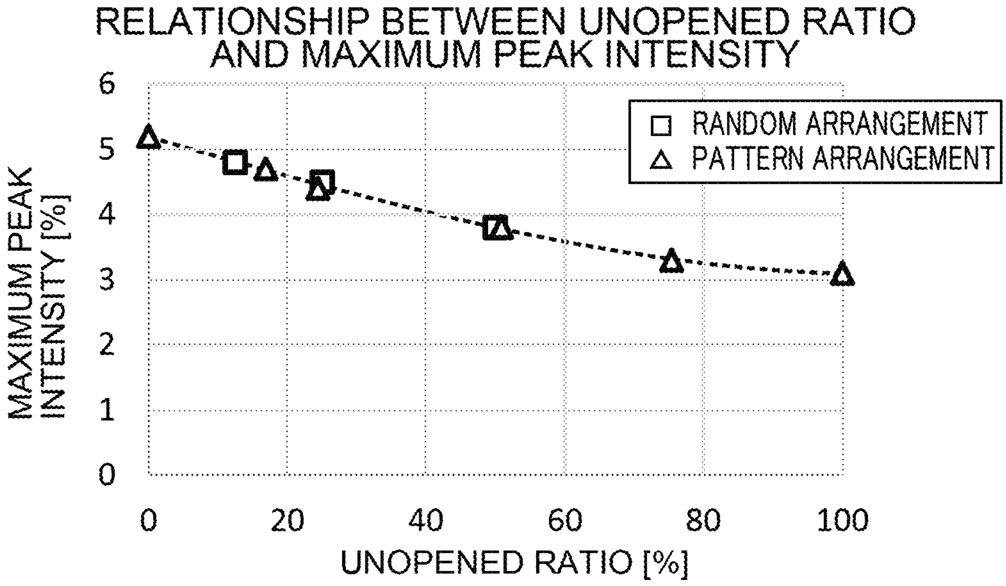
FIG. 69 is a diagram showing a relationship between unopened ratio and maximum peak intensity.
Figure 70:
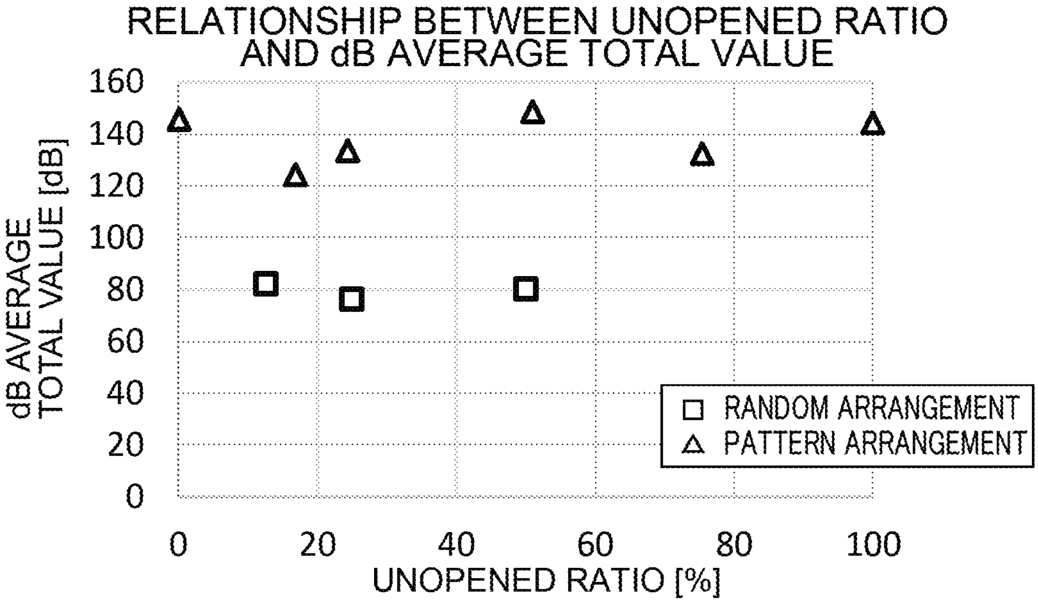
FIG. 70 is a diagram showing a relationship between unopened ratio and dB average total value.

The fourth to seventh examples and the reference example were evaluated in a manner similar to the comparative example and the first to third examples. FIG. 68 is a diagram results of evaluation of diffraction in the fourth to seventh examples and the reference example. FIG. 69 is a diagram showing a relationship between unopened ratio (i.e. proportion of the number of non-aperture regions to the number of unit regions) and maximum peak intensity. FIG. 70 is a diagram showing a relationship between unopened ratio (i.e. proportion of the number of non-aperture regions to the number of unit regions) and dB average total value. FIGS. 69 and 70 are graphic tabulations of the results of evaluations of FIGS. 62 and 68 for the first to seventh examples, the comparative example, and the reference example. In FIG. 69, the horizontal axis represents unopened ratio (%), and the vertical axis represents maximum peak intensity (%). In FIG. 70, the horizontal axis represents unopened ratio (%), and the vertical axis represents dB average total value (dB). In the graphs of FIGS. 69 and 70, the plots "□" indicate the results of the first to third examples and refer to random arrangements. The plots "Δ" indicate the results of the fourth to seventh examples and refer to pattern arrangements. The plots "Δ" also indicate the results of the comparative example and the reference examples and refer to pattern arrangements.

As shown in FIG. 69, it was confirmed that the higher the unopened ratio is, the further the maximum peak intensity can be reduced. As shown in FIG. 69, the maximum peak intensity was reduced when the unopened ratio was in the range of 5% or higher to 95% or less. In particular, the maximum peak intensity was greatly reduced when the unopened ratio was in the range of 10% or higher to 80% or less. Further, as shown in FIG. 70, it was confirmed that in a random arrangement such as those shown in the first to third examples, the dB average total value can be further reduced than in the case of a pattern arrangement such as those shown in the fourth to seventh examples, the comparative example, and the reference example.

The invention claimed is:

1. An electronic device including a first display area and a second display area located in a position different from that of the first display area in planar view, the electronic device comprising:

a substrate;

a plurality of first electrodes located on the substrate;

a plurality of organic layers located on the first electrodes; and a second electrode that is located on the organic layers and that spreads so as to overlap the plurality of the first electrodes in planar view, wherein the second electrode located in the second display area has a plurality of apertures formed in such positions as not to overlap the first electrodes in planar view and is divided into a plurality of unit regions on the basis of the plurality of first electrodes, and the plurality of unit regions includes aperture regions including the apertures and non-aperture regions not including the apertures, wherein the plurality of first electrodes includes a plurality of first color electrodes, a plurality of second color electrodes, and a plurality of third color electrodes, the plurality of organic layers includes a plurality of first color organic layers located on the first color electrodes, a plurality of second color organic layers located on the second color electrodes, and a plurality of third color organic layers located on the third color electrodes, the first color electrodes and the second color electrodes are alternately arranged along a first direction and alternately arranged along a second direction orthogonal to the first direction, and the third color electrodes are arranged along the first direction so as to be located between the first color electrodes and the second color electrodes in the first direction and are arranged along the second direction so as to be located between the first color electrodes and the second color electrodes in the second direction, and wherein the second display area is divided into a plurality of basic patterns each including one of the first color electrodes, one of the second color electrodes, and one of the third color electrodes, the plurality of basic patterns includes any two or more of a first basic pattern including two of the apertures, second basic patterns each including one of the apertures, and a third basic pattern not including the apertures, and in the second display area, the two or more basic patterns are regularly arranged along the first direction and the second direction.

2. The electronic device according to claim 1, wherein each of the unit regions is demarcated by a quadrangle that is obtained by connecting center points of four adjacent ones of the first electrodes.

3. The electronic device according to claim 1, wherein a proportion of the number of non-aperture regions to the number of unit regions is higher than or equal to 5% and lower than or equal to 95%.

4. The electronic device according to claim 3, wherein the proportion of the number of non-aperture regions to the number of unit regions is higher than or equal to 10% and lower than or equal to 80%.

5. The electronic device according to claim 1, wherein each of the unit regions is demarcated by a quadrangle that is obtained by connecting center points of four adjacent ones of the first electrodes, the four adjacent first electrodes consisting of one of the first color electrodes, one of the second color electrodes, and two of the third color electrodes.

6. The electronic device according to claim 1, wherein the plurality of basic patterns includes the first basic pattern and the second basic patterns, and in the second display area, the first basic pattern and the second basic patterns are regularly arranged along the first direction and the second direction.

7. The electronic device according to claim 1, wherein the plurality of basic patterns includes the first basic pattern, the second basic patterns, and the third basic pattern, and in the second display area, the first basic pattern, the second basic patterns, and the third basic pattern are regularly arranged along the first direction and the second direction.

8. The electronic device according to claim 1, wherein the organic layers include organic layer apertures overlapping the apertures in planar view.

9. The electronic device according to claim 1, further comprising an insulating layer located between the substrate and the organic layers in a direction normal to the substate, wherein the insulating layer includes insulating layer first apertures overlapping the first electrodes in planar view.

10. The electronic device according to claim 9, wherein the insulating layer includes insulating layer second apertures overlapping the apertures in planar view.

11. A manufacturing method for an electronic device including a first display area and a second display area located in a position different from that of the first display area in planar view, the manufacturing method comprising:

a preparing step of preparing a layered product including a substrate, a plurality of first electrodes located on the substrate, and a plurality of organic layers located on the first electrodes;

a second electrode forming step of forming a second electrode on the organic layers so that the second electrode overlaps the plurality of first electrodes in planar view; and an aperture forming step of forming a plurality of apertures in such positions in the second electrode located in the second display area that the plurality of apertures do not overlap the first electrodes in planar view, wherein the second electrode located in the second display area is divided into a plurality of unit regions on the basis of the plurality of first electrodes, and the plurality of unit regions includes aperture regions including the apertures and non-aperture regions not including the apertures, wherein the plurality of first electrodes includes a plurality of first color electrodes, a plurality of second color electrodes, and a plurality of third color electrodes, the plurality of organic layers includes a plurality of first color organic layers located on the first color electrodes, a plurality of second color organic layers located on the second color electrodes, and a plurality of third color organic layers located on the third color electrodes, the first color electrodes and the second color electrodes are alternately arranged along a first direction and alternately arranged along a second direction orthogonal to the first direction, and the third color electrodes are arranged along the first direction so as to be located between the first color electrodes and the second color electrodes in the first direction and are arranged along the second direction so as to be located between the first color electrodes and the second color electrodes in the second direction, and wherein the second display area is divided into a plurality of basic patterns each including one of the first color electrodes, one of the second color electrodes, and one of the third color electrodes, the plurality of basic patterns includes any two or more of a first basic pattern including two of the apertures, second basic patterns each including one of the apertures, and a third basic pattern not including the apertures, and in the second display area, the two or more basic patterns are regularly arranged along the first direction and the second direction.

12. The manufacturing method for the electronic device according to claim 11, wherein the aperture forming step includes a removing step of forming the apertures by removing part of the second electrode.

13. The manufacturing method for the electronic device according to claim 12, wherein the removing step includes an irradiating step of irradiating the second electrode with a laser and thereby forming the apertures.

14. The manufacturing method for the electronic device according to claim 11, further comprising an inhibiting layer forming step of, before the second electrode forming step, forming inhibiting layers that inhibit the second electrode from being formed in positions on the substrate in which the apertures are to be formed.

* * * * *